(12) United States Patent
Wakisaka

(10) Patent No.: US 11,328,998 B2
(45) Date of Patent: May 10, 2022

(54) SEMICONDUCTOR DEVICE AND MANUFACTURING METHOD OF SEMICONDUCTOR DEVICE

(71) Applicant: AOI Electronics Co., Ltd., Takamatsu (JP)

(72) Inventor: Shinji Wakisaka, Hanno (JP)

(73) Assignee: AOI Electronics Co., Ltd., Takamatsu (JP)

( * ) Notice: Subject to any disclaimer, the term of this patent is extended or adjusted under 35 U.S.C. 154(b) by 0 days.

(21) Appl. No.: 17/022,737

(22) Filed: Sep. 16, 2020

(65) Prior Publication Data

US 2021/0082820 A1 Mar. 18, 2021

(30) Foreign Application Priority Data

Sep. 17, 2019 (JP) .............................. JP2019-168637

(51) Int. Cl.
| | |
|---|---|
| *H01L 23/538* | (2006.01) |
| *H01L 21/56* | (2006.01) |
| *H01L 29/40* | (2006.01) |
| *H01L 29/06* | (2006.01) |
| *H01L 25/00* | (2006.01) |
| *H01L 23/00* | (2006.01) |
| *H01L 21/768* | (2006.01) |
| *H01L 25/16* | (2006.01) |

(52) U.S. Cl.
CPC .......... *H01L 23/5384* (2013.01); *H01L 21/56* (2013.01); *H01L 21/76802* (2013.01); *H01L 21/76877* (2013.01); *H01L 24/13* (2013.01); *H01L 24/81* (2013.01); *H01L 25/16* (2013.01); *H01L 25/50* (2013.01); *H01L 29/06* (2013.01); *H01L 29/401* (2013.01)

(58) Field of Classification Search
CPC ........................... H01L 23/5384; H01L 21/56; H01L 21/76802
See application file for complete search history.

(56) References Cited

U.S. PATENT DOCUMENTS

| | | | |
|---|---|---|---|
| 2002/0027276 A1 | 3/2002 | Sakamoto et al. | |
| 2004/0232543 A1 | 11/2004 | Goller et al. | |
| 2009/0230541 A1* | 9/2009 | Araki | H01L 24/73 257/693 |

FOREIGN PATENT DOCUMENTS

| | | |
|---|---|---|
| JP | 2002-76245 A | 3/2002 |
| JP | 2004-538641 A | 12/2004 |
| JP | 2017-114070 A | 6/2017 |

\* cited by examiner

*Primary Examiner* — Errol V Fernandes
(74) *Attorney, Agent, or Firm* — Crowell & Moring LLP

(57) ABSTRACT

A semiconductor device includes: a first semiconductor element having a first electrode on a main surface side thereof and a second electrode on a back surface side thereof; a base material provided with a connection conductor connected to the first electrode; a sealing resin provided on the base material to seal the first semiconductor element; and a first via provided in the sealing resin and electrically connected to the second electrode of the first semiconductor element.

13 Claims, 66 Drawing Sheets

SEMICONDUCTOR DEVICE AND MANUFACTURING METHOD OF SEMICONDUCTOR DEVICE

INCORPORATION BY REFERENCE

The disclosure of the following priority application is herein incorporated by reference: Japanese Patent Application No. 2019-168637 filed Sep. 17, 2019

TECHNICAL FIELD

The present invention relates to a semiconductor device and a manufacturing method of semiconductor device.

BACKGROUND ART

A semiconductor package in which a semiconductor element is sealed with a resin is widely used, for example, in a power converter as a semiconductor device suitable for thinning and downsizing. As a structure of a semiconductor package, a structure in which a semiconductor element is die-bonded on a substrate and each electrode of the semiconductor element and a connection conductor provided on the substrate are connected by a bonding wire is known. However, this structure requires an expensive substrate such as a glass epoxy resin that can withstand heating during wire bonding, and thus cannot reduce cost. Further, in this structure, the bonding wire bonded to the electrode of the semiconductor element projects above the semiconductor element, so that the thickness of the semiconductor device tends to become large.

Therefore, a semiconductor device in which electrodes are provided on the back surface opposite to the main surface side of the semiconductor element, the main surface side electrodes and the substrate are connected, and the substrate and the back surface side electrodes are connected by using a metal plate such as a lead plate, has been being studied. In this structure, between the metal plate and the electrodes on the back surface side of the semiconductor element and between the metal plate and the connection pad of the substrate are respectively bonded using metal joining material such as solder (see PTL 1).

CITATION LIST

Patent Literature

PTL 1: Japanese Laid-Open Patent Publication No. 2002-76245

SUMMARY OF INVENTION

Technical Problem

In the semiconductor device described in PTL 1, the electrode on the back surface side of the semiconductor element and the metal plate are joined together by a metal joining material such as solder, and the thickness of the joining portion is a sum of the thicknesses of the metal plate and the metal joining material. Therefore, it is impossible to sufficiently reduce the thickness. Further, since the metal plate cannot be formed as fine as the connection wiring, the extent of miniaturization is limited.

Solution to Problem

According to a 1st aspect of the present invention, a semiconductor device, comprises: a first semiconductor element having a first electrode on a main surface side thereof and a second electrode on a back surface side thereof; a base material provided with a connection conductor connected to the first electrode; a sealing resin provided on the base material to seal the first semiconductor element; and a first via provided in the sealing resin and electrically connected to the second electrode of the first semiconductor element.

According to a 2nd aspect of the present invention, the semiconductor device according to the 1st aspect may further comprise: a back surface conductor laminated on the second electrode of the first semiconductor element.

According to a 3rd aspect of the present invention, the semiconductor device according to the 1st aspect may further comprise: a second semiconductor element having a first electrode and a second electrode on a main surface side thereof, wherein: the connection conductor includes a first connection conductor that electrically connects together the first electrode of the second semiconductor element and the first electrode of the first semiconductor element.

According to a 4th aspect of the present invention, in the semiconductor device according to the 3rd aspect, it is preferable that the connection conductor includes a second connection conductor connected to the second electrode of the second semiconductor element; and a second via connected to the second connection conductor is further provided in the sealing resin.

According to a 5th aspect of the present invention, the semiconductor device according to the 1st aspect may further comprise: a third semiconductor element having a first electrode and a third electrode on a main surface side thereof and a second electrode on a back surface side thereof, wherein: the first semiconductor element further includes a third electrode on the main surface side thereof; the connection conductor includes a third connection conductor connected to the third electrode of the first semiconductor element; a third via connected to the third connection conductor and a fourth via connected to the second electrode of the third semiconductor element are provided in the sealing resin; and an intermediate connecting portion that connects together the third via and the fourth via is provided on the sealing resin.

According to a 6th aspect of the present invention, in the semiconductor device according to the 1st aspect may further comprise: a third semiconductor element having a first electrode and a third electrode on a main surface side thereof and a second electrode on a back surface side thereof, wherein: the first semiconductor element further includes a third electrode on the main surface side thereof; and the connection conductor includes a fourth connection conductor that connects together the third electrode of the first semiconductor element and the third electrode of the third semiconductor element.

According to a 7th aspect of the present invention, in the semiconductor device according to the 1st aspect, it is preferable that a fifth via connected to the connection conductor is further provided in the sealing resin.

According to a 8th aspect of the present invention, a semiconductor device comprises: a base material; a first semiconductor element provided on the base material, and having a first electrode and a third electrode on a main surface side thereof facing the base material, and having a second electrode on a back surface side thereof; a second semiconductor element provided on the base material and having a first electrode and a second electrode on a main surface side thereof facing the base material; a first connection conductor provided on the base material and connecting together the first electrode of the first semiconductor element and the first electrode of the second semiconductor element; a second connection conductor provided on the base material and connected to the second electrode of the second semiconductor element; a sealing resin provided on the base material to seal the first semiconductor element and the second semiconductor element; a first via provided in the sealing resin and electrically connected to the second electrode of the first semiconductor element; and a second via provided in the sealing resin and connected to the second connection conductor.

According to a 9th aspect of the present invention, the semiconductor device according to the 8th aspect may further comprise: the first semiconductor element further includes a back surface conductor laminated on the second electrode of the first semiconductor element.

According to a 10th aspect of the present invention, a manufacturing method of a semiconductor device comprises: preparing a first semiconductor element having a first electrode on a main surface side thereof and a second electrode on a back surface side thereof; connecting the first electrode of the first semiconductor element to a first connection conductor provided on a base material; sealing the first semiconductor element provided on the base material with a sealing resin; and providing a first via electrically connected to the second electrode of the first semiconductor element in the sealing resin.

According to a 11th aspect of the present invention, in the manufacturing method of a semiconductor device according to the 10th aspect, it is preferable that in the preparing of the first semiconductor element, a backside conductor is provided on the second electrode of the first semiconductor element.

According to a 12th aspect of the present invention, the manufacturing method of a semiconductor device according to the 11th aspect may further comprise: preparing a second semiconductor element having a first electrode and a second electrode on a main surface side thereof; connecting the first electrode of the second semiconductor element to the first connection conductor; and connecting the second electrode of the second semiconductor element to a second connection conductor provided on the base material, wherein: in the sealing of the first semiconductor element with the sealing resin, the second semiconductor element is sealed with the sealing resin; and the method further comprises: providing a second via connected to the second connection conductor in the sealing resin.

According to a 13th aspect of the present invention, in the manufacturing method of a semiconductor device according to the 12th aspect, it is preferable that in the providing of the first via and the second via in the sealing resin, the sealing resin is irradiated with laser light to form (i) a first via hole that reaches from a surface of the sealing resin to the back surface conductor provided on the second electrode of the first semiconductor element, and (ii) a second via hole that reaches from the surface of the sealing resin to the second connection conductor.

According to a 14th aspect of the present invention, in the manufacturing method of a semiconductor device according to the 13th aspect, it is preferable that the first via hole and the second via hole are formed in a same single process using a same laser apparatus.

Advantageous Effects of Invention

According to the present invention, it is possible to reduce the size and thickness of a semiconductor device in which a semiconductor element having an electrode on the back surface side is mounted.

DESCRIPTION OF EMBODIMENTS

Figure 1:
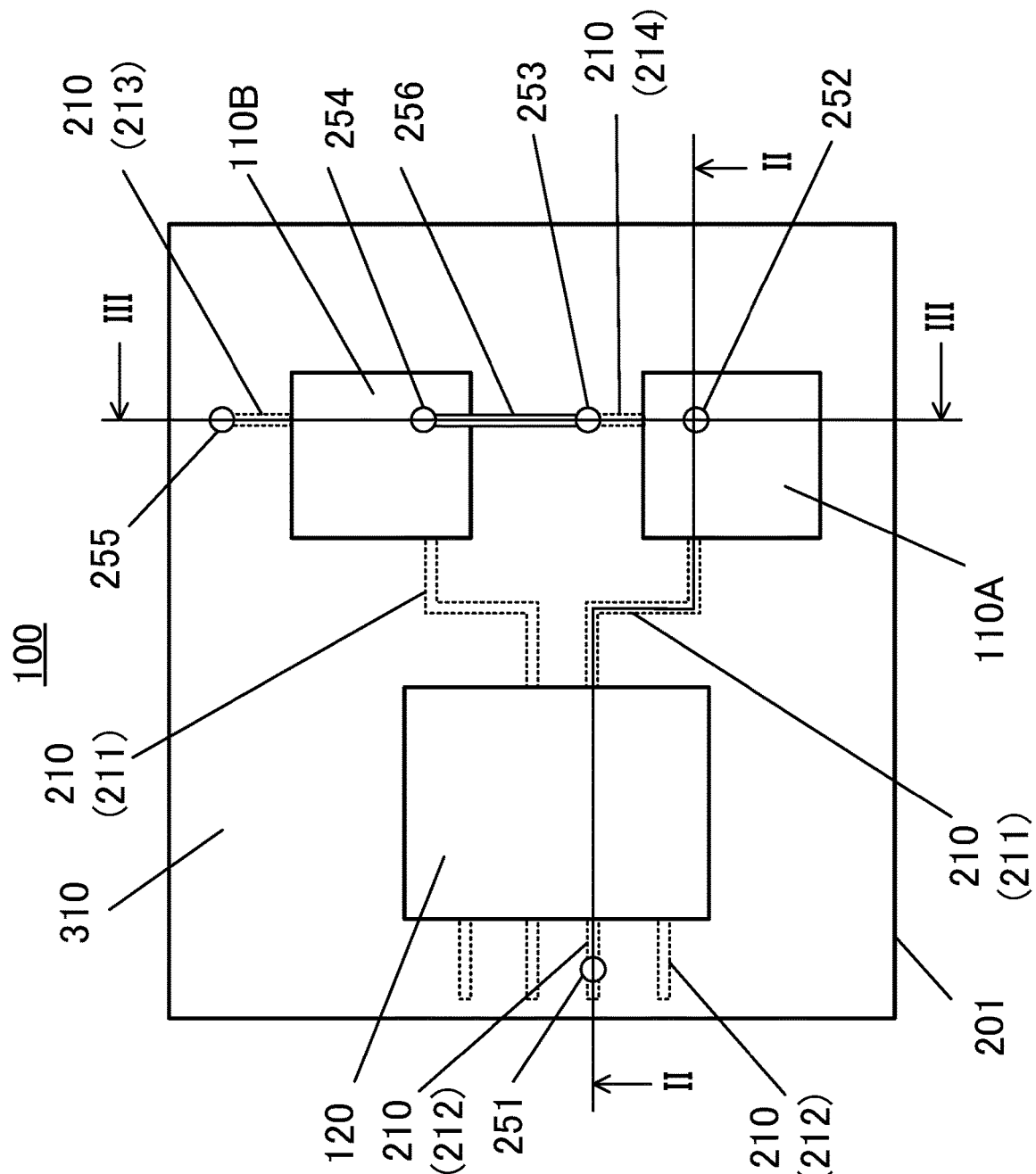
FIG. 1 shows a semiconductor device according to a first embodiment of the present invention, which is a layout diagram obtained by seeing through a sealing resin from above the semiconductor device.

Hereinafter, embodiments of the present invention will be described with reference to the drawings. In the drawings shown below, the shape of each member, the size such as length, width, and thickness, and the ratio of the length, width, and thickness are shown in different shapes, sizes and proportions from those of actual devices as necessary to clarify the configuration of the invention. Therefore, the shape, the size and the ratio of length, width, and thickness of each illustrated member should not be determined by comparing with those of the same element of the same member or the same element of other members.

First Embodiment

Hereinafter, the first embodiment of the present invention will be described with reference to FIGS. 1 to 25.

FIG. 1 shows a semiconductor device 100 according to the first embodiment of the present invention, and is a layout diagram obtained by seeing through a sealing resin from above the semiconductor device 100 (from a position in front of the paper surface in FIG. 1). The semiconductor device 100 has three semiconductor elements provided on a base material 201: a first semiconductor element 110A, a second semiconductor element 120, and a third semiconductor element 110B. The first and third semiconductor elements 110A and 110B are, for example, MOSFETs (Metal Oxide Semiconductor Field Effect Transistors). The second semiconductor element 120 is, for example, a control semiconductor element having a drive circuit that drives the first and third semiconductor elements 110A and 110B. The second semiconductor element 120 may include a control circuit that controls the drive circuit.

A connection conductor 210 shown by dotted lines in FIG. 1 is provided on an upper surface 201a (see FIG. 2) of the base material 201. The connection conductor 210 includes: connection conductors 211 that connect the first and third semiconductor elements 110A and 110B with the second semiconductor element 120, respectively; a plurality of connection conductors 212 that connect the second semiconductor element 120 to an external control device; a connection conductor 213 connected to the third semiconductor element 110B; and a connection conductor 214 that is a part of a conductor connecting the first semiconductor element 110A with the third semiconductor element 110B.

The connection conductors 211 to 214 formed on the base material 201 are extended to the outside of the first to third semiconductor elements 110A, 120, 110B in a plan view seen from above the semiconductor device 100 (from a position in front of the paper surface in FIG. 1). That is, the semiconductor device 100 is of a fan-out panel level packaging type.

The first and third semiconductor elements 110A and 110B and the second semiconductor element 120 are sealed with sealing resin 310 provided so as to cover the entire upper surface 201a of the base material 201. The sealing resin 310 is provided with five vias 251 to 255. The via 251 is connected to the connecting conductor 212, the via 253 is connected to the connecting conductor 214, and the via 255 is connected to the connecting conductor 213. The via 252 is connected to the first semiconductor element 110A, and the via 254 is connected to the third semiconductor element 110B. The vias 251, 253, 255 are formed to penetrate almost the entire thickness of the sealing resin 310, and are connected to the connection conductor 210. The vias 252 and 254 are formed up to about the middle of the thickness of the sealing resin 310, and are connected to back surface conductors 114 (see FIG. 3) provided on the back surface side of the first and third semiconductor elements 110A and 110B, respectively. The size of the semiconductor device 100 is, for example, approximately 1.5 to 2.0 mm in length, 1.0 to 1.6 mm in width, and 0.2 to 0.3 mm in thickness.

Details of the structure of the semiconductor device 100 will be described with reference to FIG. 2 and FIG. 3.

Figure 2:
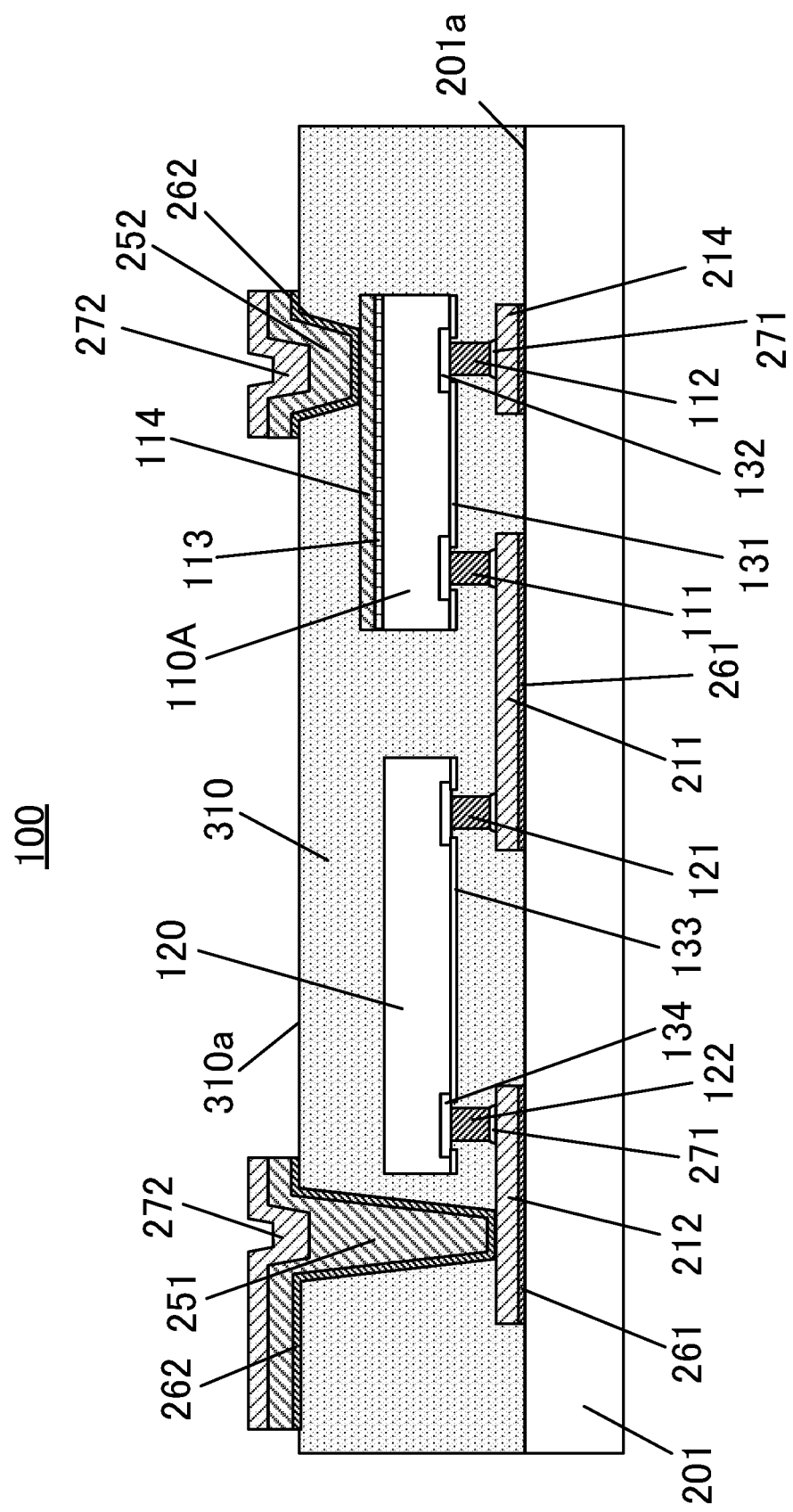
FIG. 2 is a sectional view taken along a line II-II of the semiconductor device shown in FIG. 1.
Figure 3:
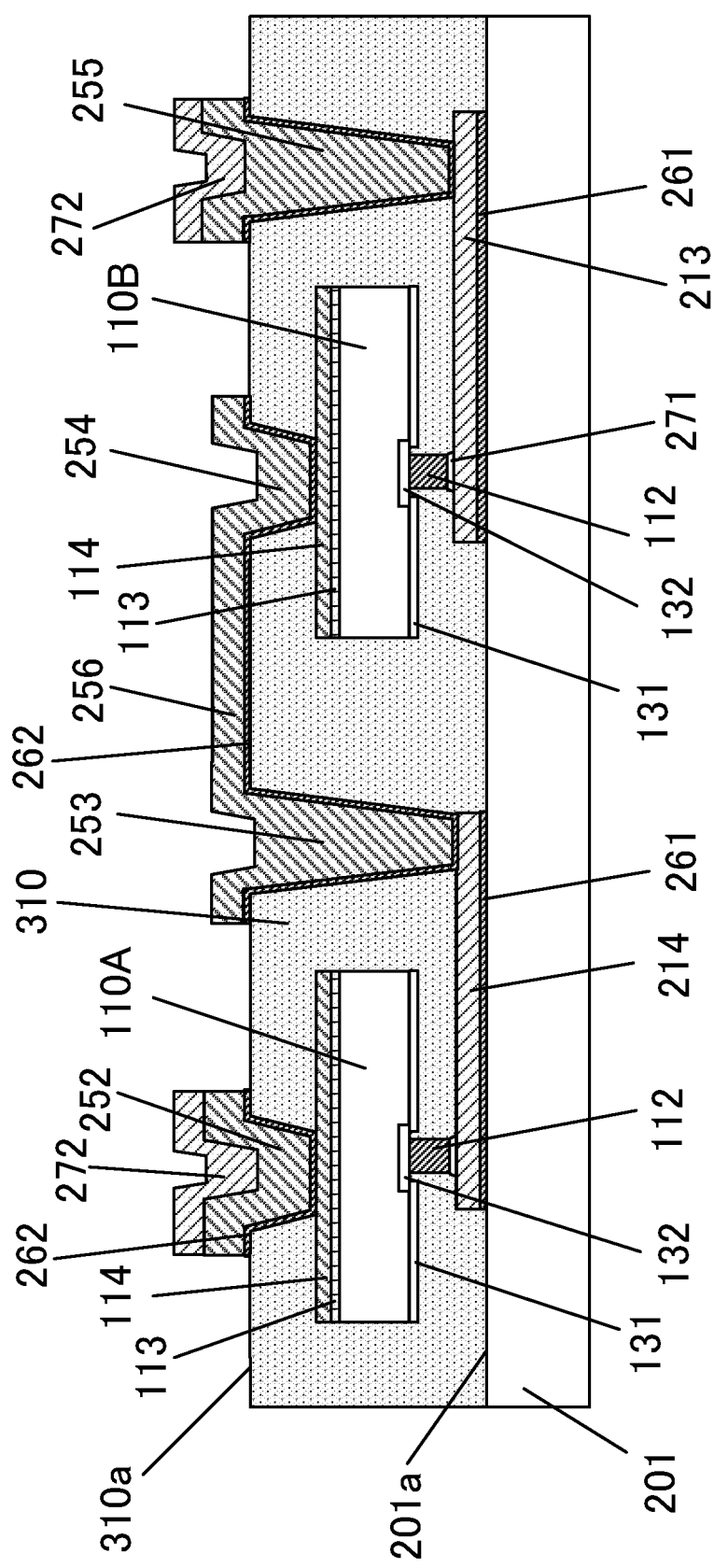
FIG. 3 is a sectional view taken along a line of the semiconductor device shown in FIG. 1.

FIG. 2 is a sectional view taken along the line II-II of the semiconductor device 100 shown in FIG. 1, and FIG. 3 is a sectional view taken along the line of the semiconductor device 100 shown in FIG. 1.

The first semiconductor element 110A and the third semiconductor element 110B have the same structures as shown in FIG. 3. As shown in FIG. 2 and FIG. 3, each of the first semiconductor element 110A and the third semiconductor element 110B has a connection pad 132 on the main surface side, in other words, on the side facing the base material 201 such that the connection pad 132 is exposed from an insulating film 131 through an opening provided at the insulating film 131. The insulating film 131 is made from inorganic material such as silicon oxide or silicon nitride, and the connection pad 132 is made from aluminum or the like. Pillar-shaped electrodes 111 and 112 are provided on the connection pads 132 of each of the first and third semiconductor elements 110A and 110B. The electrodes 111 and 112 are made from, for example, copper-based metal, and have a height of several tens of μm. Further, each of the first and third semiconductor elements 110A and 110B have an electrode 113 on the back surface side, which is the opposite side to the main surface side. In a case where the first and third semiconductor elements 110A and 110B are MOSFETs, the electrode 111 is a gate electrode, the electrode 112 is a source electrode, and the electrode 113 is a drain electrode. A back surface conductor 114 is stacked on the electrode 113. The electrode 113 is an electrode manufactured by a semiconductor device manufacturer, and is usually formed of aluminum or the like in a thickness of 1 μm or less. The back surface conductor 114 is formed by sputtering or plating of nickel, nickel/copper, or copper so as to have a thickness of about several μm.

The base material 201 is, for example, an insulating sheet having a thickness of about several tens of μm and mainly made of an epoxy material. The connection conductors 211, 212, 214 (see FIG. 2) and the connection conductor 213 (see FIG. 3) are provided on the upper surface 201a of the base material 201. The connection conductors 211 to 214 are made from, for example, copper-based metal. The base material 201 is a single-sided wiring board having the connection conductors 211 to 214 only on the upper surface 201a side. Thereby, it is possible to make the device thinner in lower cost than a double-sided wiring board.

A base metal 261 serving as a current path for forming the connection conductors 211, 212, and 214 by electrolytic plating is provided between the base material 201 and the connection conductors 211 to 214. The electrodes 111 of the first and third semiconductor elements 110A and 110B are connected to the connection conductor 211. The electrode 112 of the first semiconductor element 110A is connected to the connection conductor 214, and the electrode 112 of the third semiconductor element 110B is connected to the connection conductor 213. The electrodes 111 of the first and third semiconductor elements 110A and 110B and the connection conductors 211, the electrode 112 of the first semiconductor element 110A and the connection conductor 214, and the electrode 112 of the third semiconductor element 110B and connection conductor 213 are joined together by joining material 271 such as solder, or metal paste for sintering which is heated to become sintered metal.

As shown in FIG. 2 and FIG. 3, the second semiconductor element 120 is provided with an insulating film 133 and a connection pad 134 which is exposed through the opening formed at the insulating film 133, on the main surface side, in other words, on the side facing the base material 201. The insulating film 133 is made from inorganic material such as silicon oxide or silicon nitride, and the connection pad 134 is made from aluminum or the like. Pillar-shaped electrodes 121 and 122 are provided on the connection pad 134 of the second semiconductor element 120. The electrodes 121 and 122 are made of, for example, copper-based metal, and have a height of several tens of μm. The electrode 121 and the connecting conductor 211, and the electrode 122 and the connecting conductor 212 are joined together by the joining material 271 such as solder or, metal paste for sintering which is heated to become sintered metal. Unlike the first and third semiconductor elements 110A and 110B, the second semiconductor element 120 does not have an electrode on the back surface side.

It is to be noted that, although the electrodes 111 and 112 of the first and third semiconductor elements 110A and 110B and the electrodes 121 and 122 of the second semiconductor element 120 are illustrated as pillar shaped, for example, a structure other than a pillar shape such as a dome shape may also be used as long as such protruding electrodes are applicable to flip chip.

The sealing resin 310 is provided so as to cover the upper surface 201a of the base material 201 on which the first to third semiconductor elements 110A, 120, 110B are mounted, and the entire surfaces of the first to third semiconductor elements 110A, 120, 110B. The sealing resin 310 is formed of, for example, epoxy resin.

As described above, the sealing resin 310 is provided with five vias 251 to 255. That is, the vias 251, 253, 255 are connected to the connection conductors 212, 214, 213, respectively. The via 252 is connected to the back surface conductor 114 laminated on the electrode 113 of the first semiconductor element 110A. The via 254 is connected to the back surface conductor 114 laminated on the electrode 113 of the third semiconductor element 110B.

As shown in FIG. 3, the via 253 and the via 254 are connected together by an intermediate connecting portion 256 formed on an upper surface 310a of the sealing resin 310. Thereby, the electrode 112 of the first semiconductor element 110A is electrically connected to the back surface conductor 114 laminated on the back surface side electrode 113 of the third semiconductor element 110B via the connection conductor 214, the via 253, the intermediate connecting portion 256, and the via 254.

A base metal 262 is formed between the sealing resin 310 and each of the vias 251 to 255 to serve as a current path for forming the vias 251 to 255 by electrolytic plating. The vias 251 to 255 and the base metal 262 are formed using, for example, a copper-based metal plating solution.

Joining material 272 such as solder or sintered alloy is provided on the upper surfaces of the vias 251 to 255 which are exposed from the upper surface 310a of the sealing resin 310.

Although not shown, the via 251 is connected to an external control device. The via 252 is connected to a DC positive power source, and the via 255 is connected to a DC negative power source. The first and third semiconductor elements 110A and 110B each perform a switching operation according to a control signal from the second semiconductor element 120. The first semiconductor element 110A operates as an upper arm circuit section, and the third semiconductor element 110B operates as a lower arm circuit section. The first semiconductor element 110A and the third semiconductor element 110B form an upper and lower arm series circuit to convert direct current (DC) power into alternating current (AC) power. That is, AC power is output from the intermediate connecting portion 256 that connects the via 253 with the via 254. Therefore, the semiconductor device 100 can be used as a drive source for an AC drive device such as a motor, or the like.

Next, a manufacturing method of the semiconductor device 100 shown in FIGS. 1 to 3 will be described.

FIGS. 4 to 24 are cross-sectional views showing the steps in manufacturing the semiconductor device 100 in the order of steps.

The semiconductor device 100 is usually manufactured by forming a plurality of semiconductor devices 100 simultaneously on one supporting base material, and then the plurality of semiconductor devices 100 having been formed are cut at boundary portions to be separated into individual semiconductor devices 100. However, in the following description, the manufacturing method will be described for manufacturing one semiconductor device 100 by referring to cross-sectional views.

Figure 4:
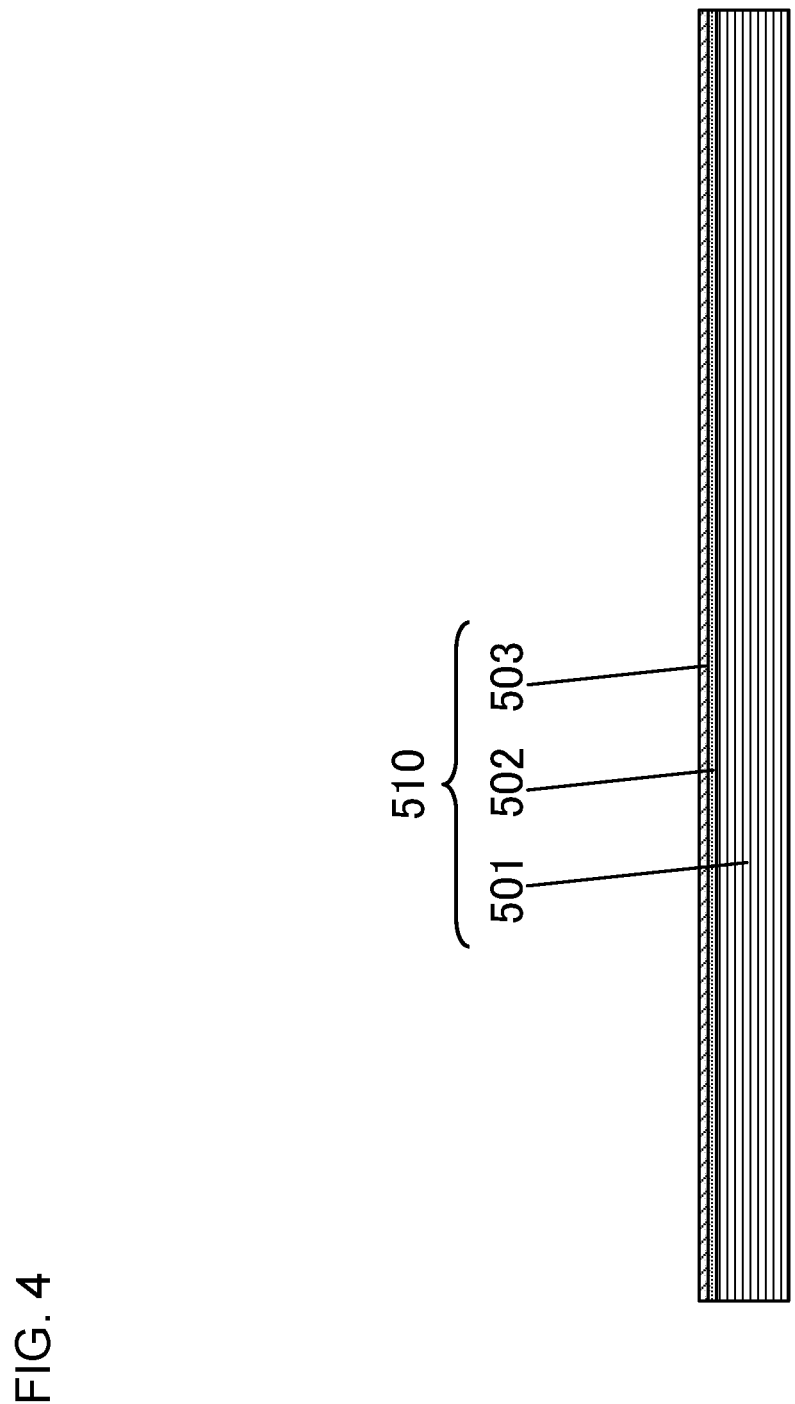
FIG. 4 is a diagram for explaining a manufacturing method of the semiconductor device shown in FIG. 2, showing a first step in a cross-sectional view.

First, a support base material 510 is prepared. As shown in FIG. 4, the support base material 510 includes a base layer 501 made of a flat plate member such as glass, a release layer 502 formed on the base layer 501, and a conductive thin film 503 made of copper-based material or the like formed on the release layer 502. The conductive thin film 503 has a thickness of, for example, about 1 to 12 μm.

As the release layer 502, for example, a two-layer structure of nickel alloy layer and carbon layer can be used. The nickel alloy has excellent etching selectivity with respect to copper, and also has good releasability from the carbon layer. Even if the carbon layer is subjected to high-temperature pressing through the copper layer formed on the carbon layer, the carbon layer prevents a metal bond formation with the copper layer and sustains the state in which the base layer 501 is easily released and removed. However, the release layer 502 is not limited to the structure formed of the nickel alloy layer and the carbon layer.

Figure 5:
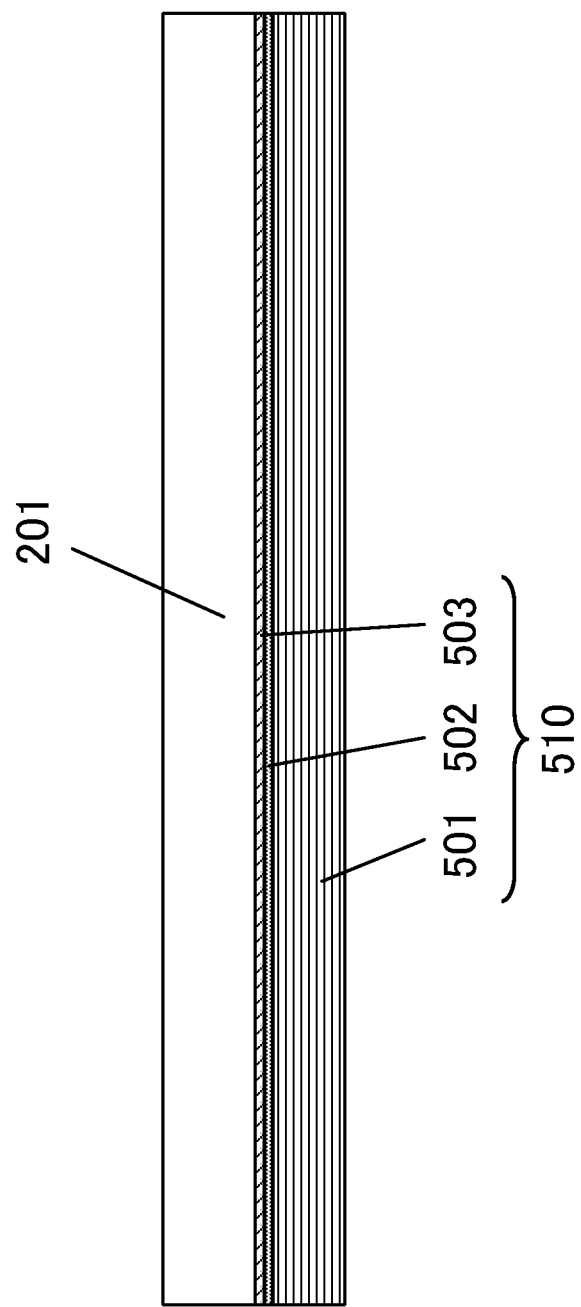
FIG. 5 is a cross-sectional view showing a step that follows the step shown in FIG. 4.

Next, as shown in FIG. 5, the base material 201 is formed on the conductive thin film 503 of the support base material 510 with insulating material. The base material 201 is formed, for example, by laminating an insulating film made from a build-up substrate material mainly composed of epoxy based material with a laminator.

Figure 6:
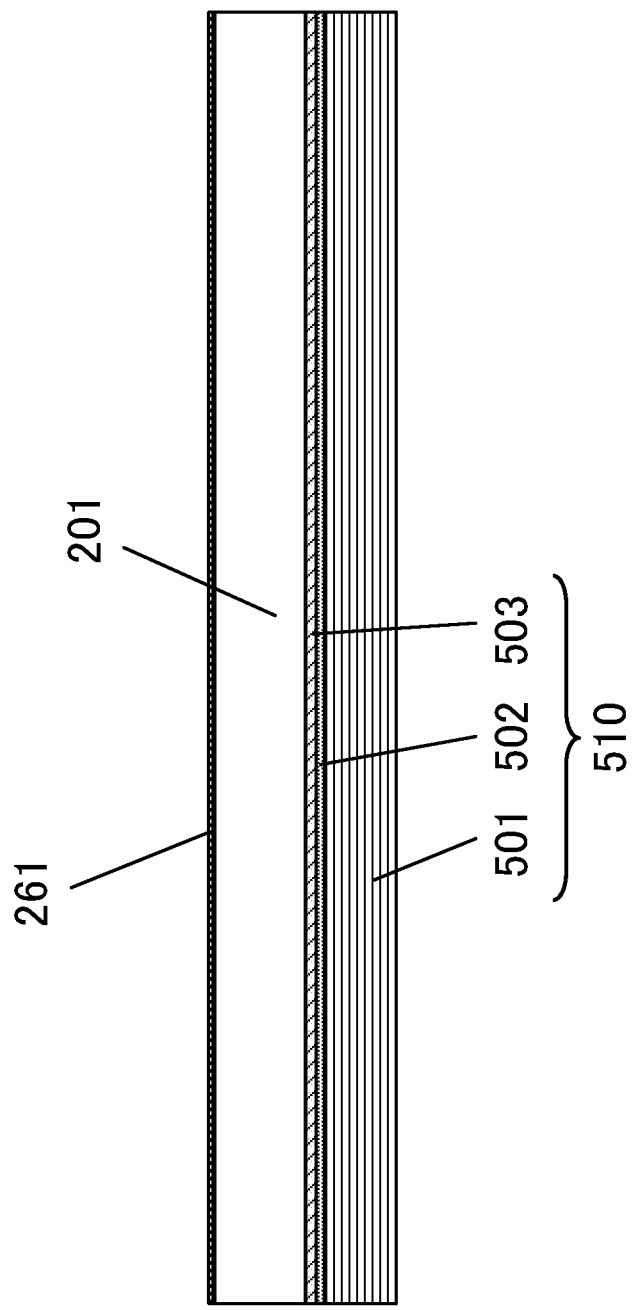
FIG. 6 is a cross-sectional view showing a step that follows the step shown in FIG. 5.

Next, as shown in FIG. 6, the base metal 261 is formed on the entire surface of the base material 201. The base metal 261 is obtained, for example, by performing electroless plating with copper-based metal so as to achieve a thickness of 0.1 to 1.0 mm.

Figure 7:
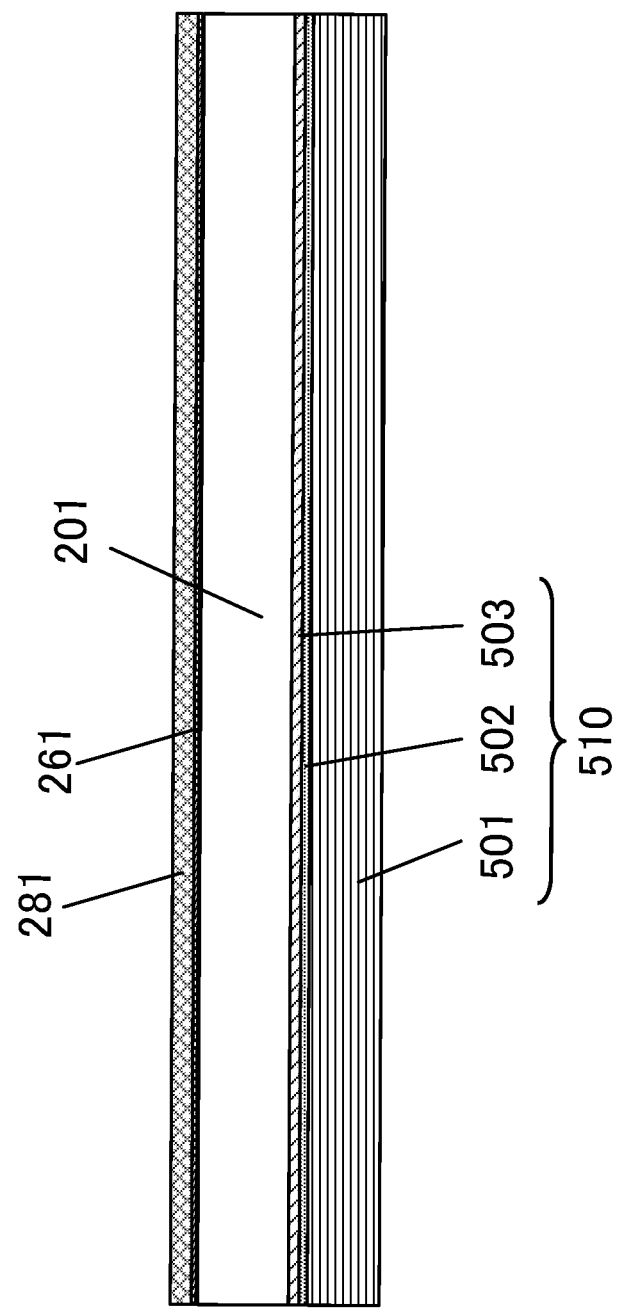
FIG. 7 is a cross-sectional view showing a step that follows the step shown in FIG. 6.

Next, as shown in FIG. 7, a photoresist 281 is formed on the entire surface of the base metal 261. The photoresist 281 is obtained by laminating dry film type photosensitive resist films with the laminator. The photoresist 281 may be a positive type or a negative type. In the present embodiment, the photoresist of a positive type will be exemplified.

Figure 8:
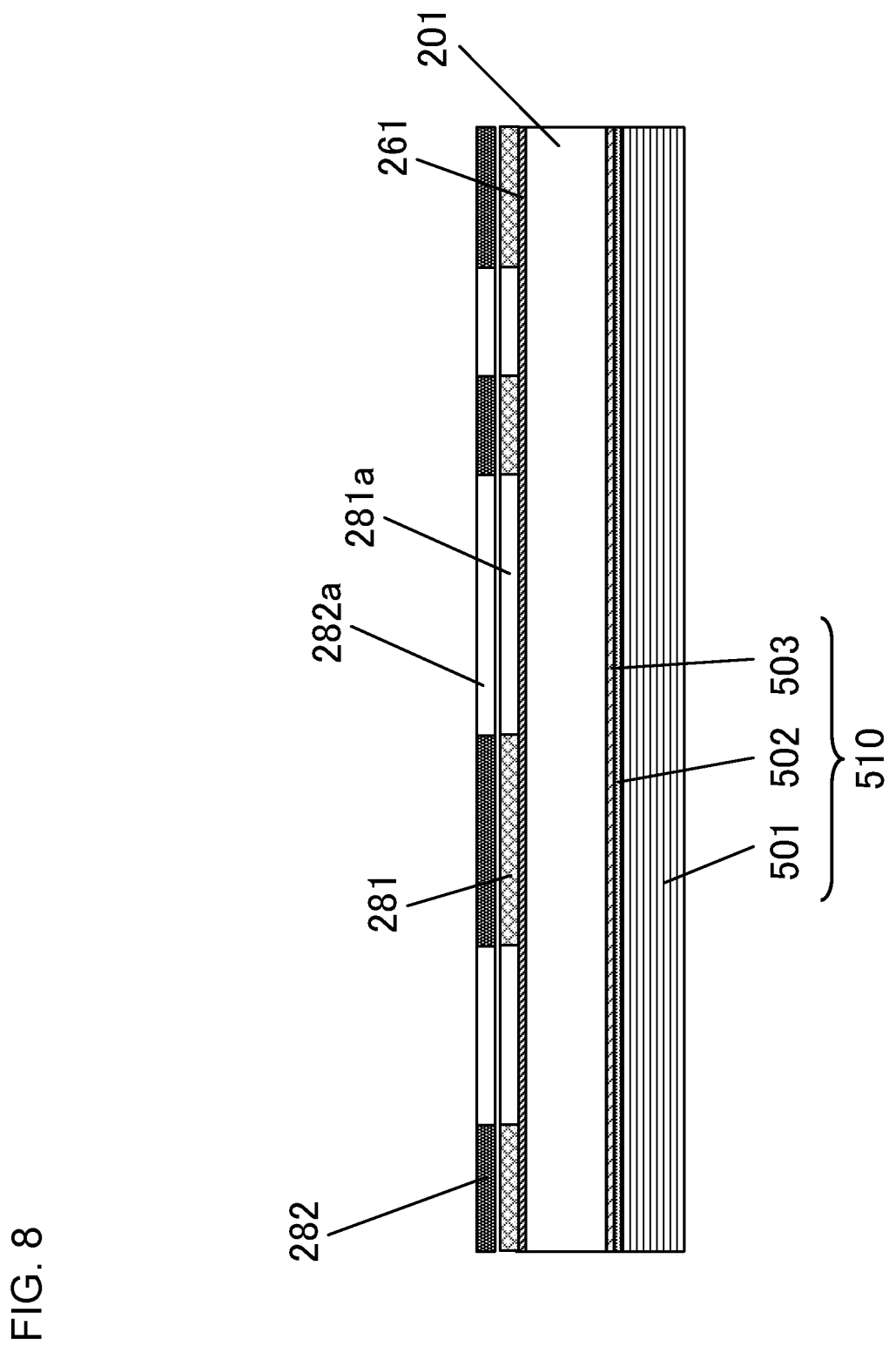
FIG. 8 is a cross-sectional view showing a step that follows the step shown in FIG. 7.

Then, as shown in FIG. 8, a photomask 282 is arranged on the photoresist 281, and exposure is performed by an exposure apparatus. The photomask 282 has pattern-shaped transparent portions 282a corresponding to shapes of the connection conductors 211 to 214, and by exposure, the positive type photoresist 281 is exposed at portions 281a corresponding to the transparent portions 282a of the photomask 282. Then, the photomask 282 is removed.

Then, developing operation is performed on the photoresist 281 to open the exposed portions 281a of the photoresist 281.

Figure 9:
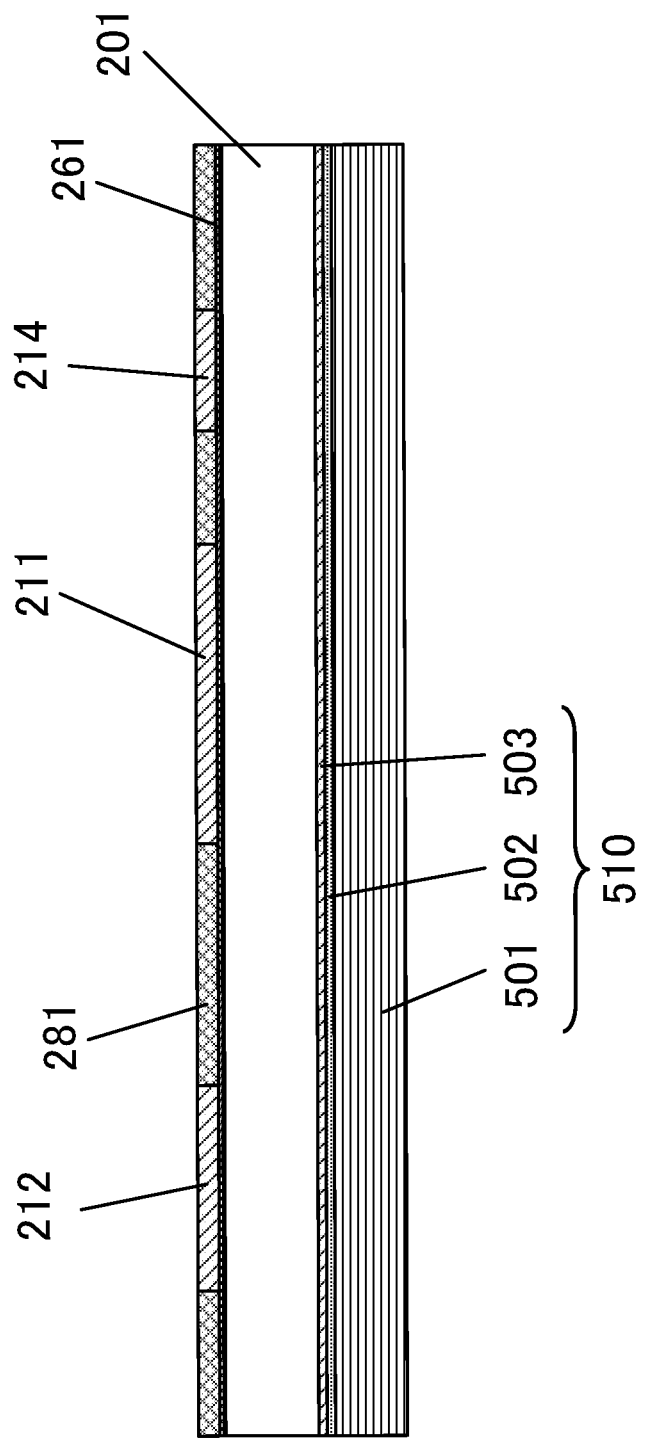
FIG. 9 is a cross-sectional view showing a step that follows the step shown in FIG. 8.
Figure 10:
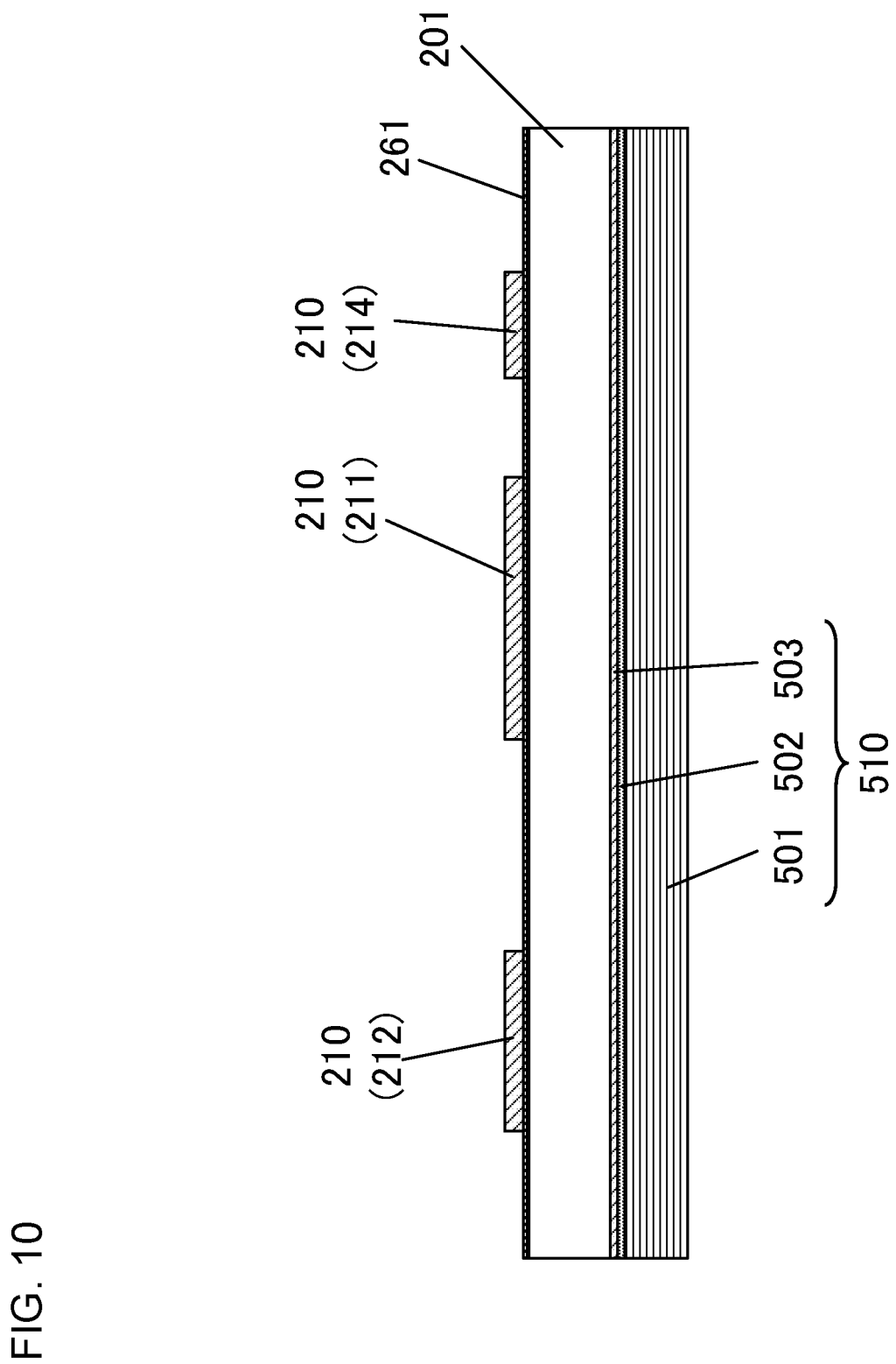
FIG. 10 is a cross-sectional view showing a step that follows the step shown in FIG. 9.
Figure 11:
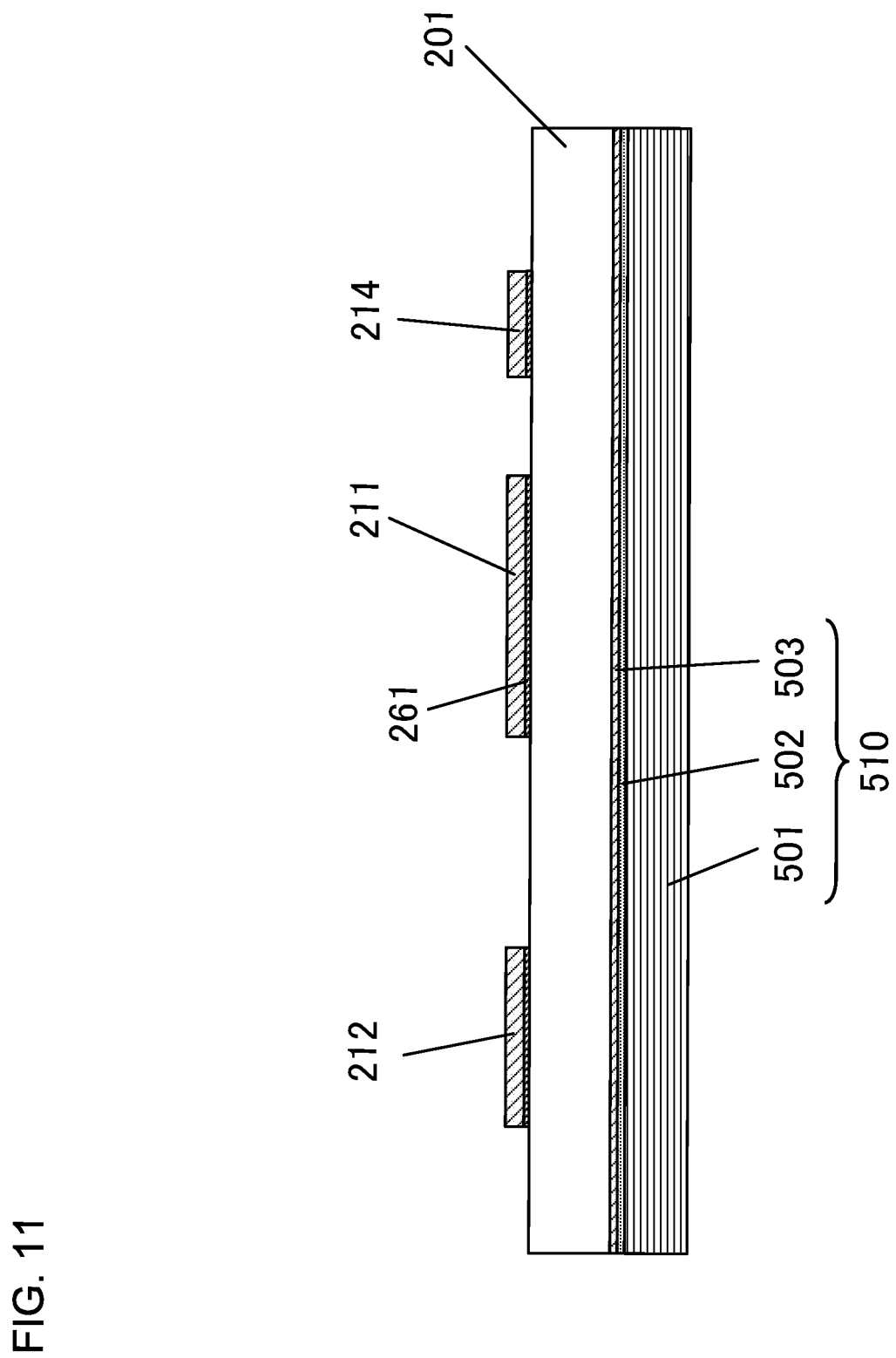
FIG. 11 is a cross-sectional view showing a step that follows the step shown in FIG. 10.

Next, as shown in FIG. 9, electrolytic plating is performed using the base metal 261 as a current path so as to form the connection conductors 211 to 214 (the connection conductor 213 is not shown in FIG. 9) on the base metal 261. The electrolytic plating is performed using, for example, copper-based metal plating solution. Then, the photoresist 281 is removed (see FIG. 10), and subsequently, the base metal 261 exposed from the connection conductors 211 to 214 (hereinafter, also referred to collectively as the connection conductor 210) is removed by etching. Thereby, an intermediate body shown in FIG. 11 is obtained.

Figure 12:
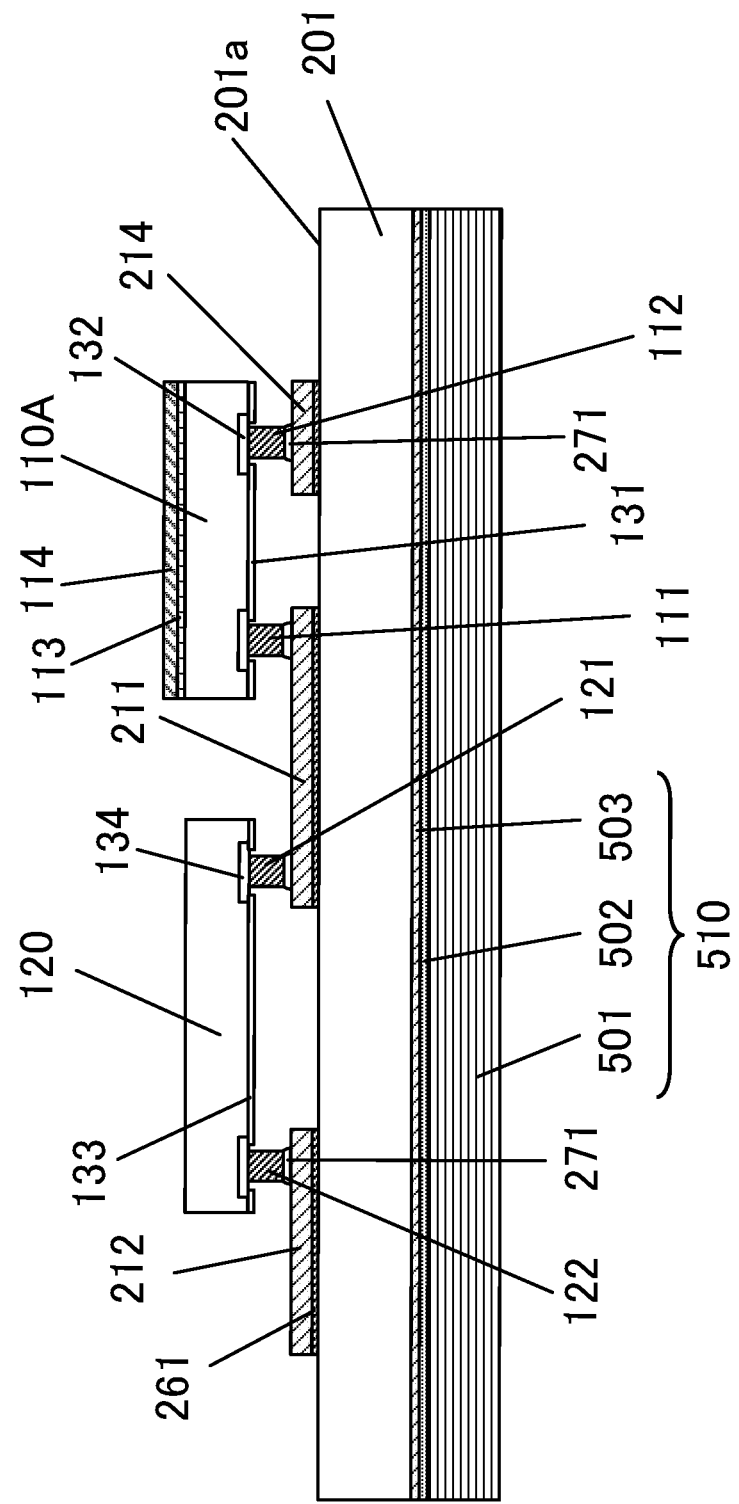
FIG. 12 is a cross-sectional view showing a step that follows the step shown in FIG. 11.

Next, as shown in FIG. 12, the electrodes 111, 112, 121, 122 of the first to third semiconductor elements 110A, 120, 110B (the third semiconductor element 110B is not shown in FIG. 12) are bonded to the connection conductor 210. The back surface conductors 114 are formed in advance on the electrodes 113 on the back surface side of the first and third semiconductor elements 110A, 110B.

Before bonding, the joining material 271 such as solder is applied to the lower end surfaces of the electrodes 111, 112, 121, 122, and flux is applied to joining portions to which the electrodes 111, 112, 121, 122 of the connection conductor 210 are to be joined respectively. Next, the first to third semiconductor elements 110A, 120, 110B are picked up one by one by a flip chip bonder to mount the electrodes 111, 112, 121, 122 of the first to third semiconductor elements 110A, 120, 110B at predetermined positions on the connection conductor 210. Then, the intermediate body of the semiconductor device 100 shown in FIG. 12 is carried into the reflow apparatus. By being heated in the reflow apparatus, the joining material 271 is melted, and the electrodes 111, 112, 121, 122 of the first to third semiconductor elements 110A, 120, 110B are joined to the corresponding joining portions of the connection conductors 210.

Figure 13:
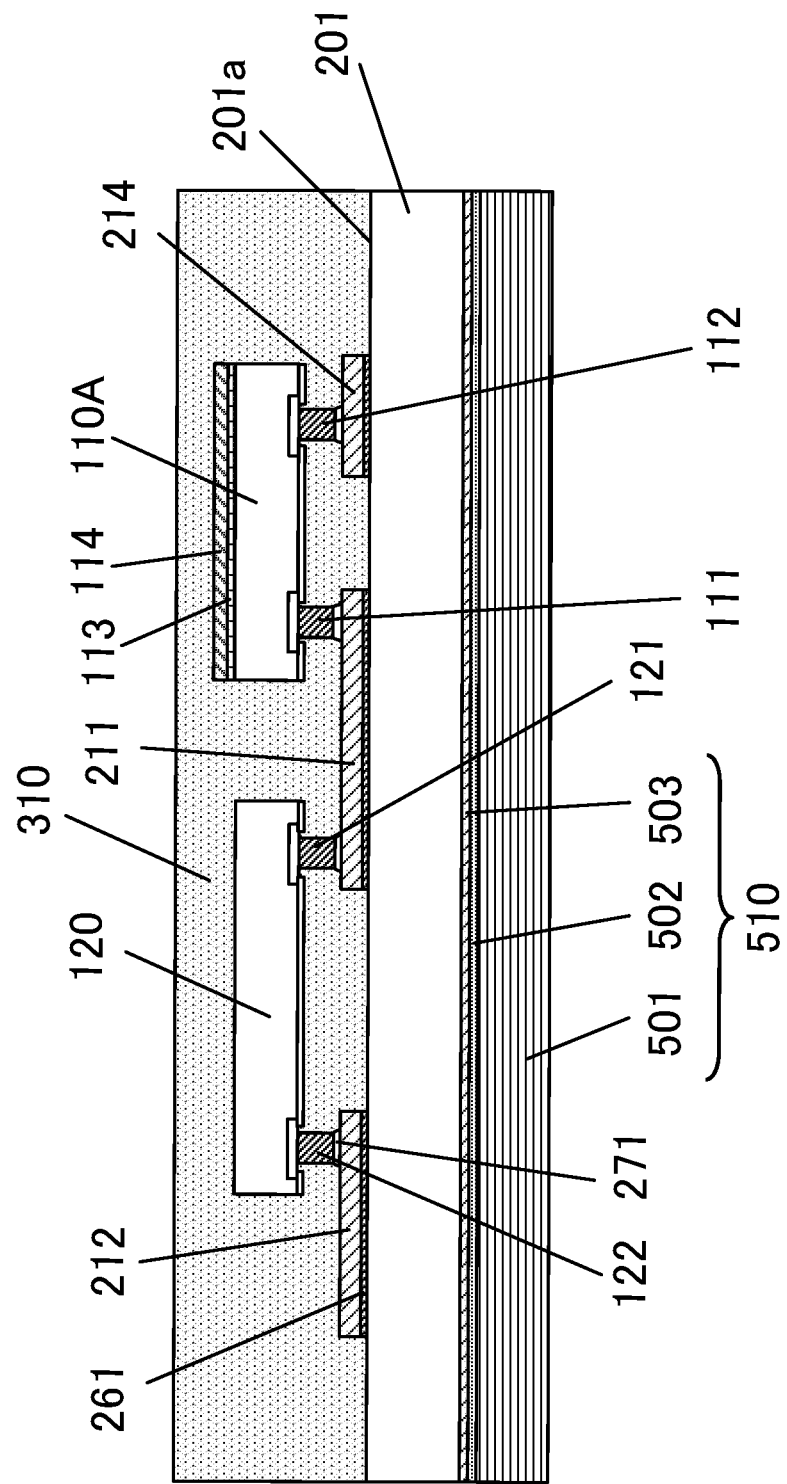
FIG. 13 is a cross-sectional view showing a step that follows the step shown in FIG. 12.

Next, as shown in FIG. 13, the entire upper surface 201a of the base material 201 of the intermediate body shown in FIG. 12 is sealed with the sealing resin 310. The sealing with the sealing resin 310 is performed by a compression molding method using, for example, epoxy resin. The sealing is performed so as to cover the entire upper surface 201a of the base material 201 and the entire surface of each of the first to third semiconductor elements 110A, 120, 110B.

Next, the vias 251 to 255 are formed in the sealing resin 310. A method of forming the vias 251 to 255 will be described with reference to FIGS. 14 to 20. However, in FIGS. 14 to 24, only the vias 251 and 252 are shown.

Figure 14:
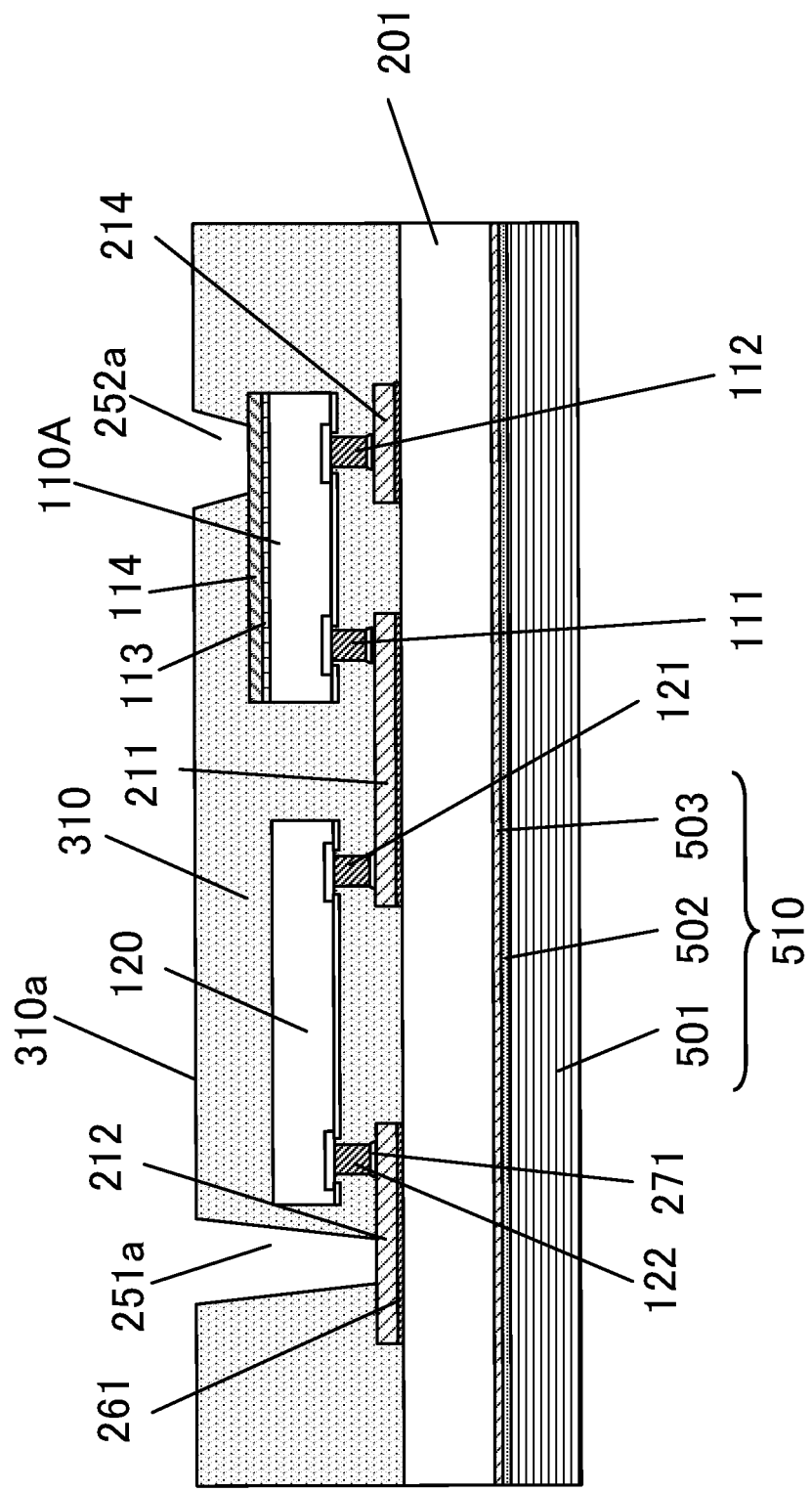
FIG. 14 is a cross-sectional view showing a step that follows the step shown in FIG. 13.

First, as shown in FIG. 14, via holes 251a and 252a for forming the vias 251 and 252 are formed in the sealing resin 310. The via holes 251a and 252a are preferably formed by irradiating the sealing resin 310 with laser light. For irradiation of laser light, the use of a laser drill apparatus is more preferable because the via holes 251a and 252a can be efficiently formed with high density and high precision. The via hole 251a reaches the connection conductor 212 from the upper surface 310a of the sealing resin 310. The via hole 252a reaches the back surface conductor 114 laminated on the electrode 113 of the first semiconductor element 110A from the upper surface 310a of the sealing resin 310. The electrode 113 formed on the back surface side of the first semiconductor element 110A is a thin layer having a thickness of 1.0 µm or less manufactured by a semiconductor element manufacturer. Therefore, in a case where the via hole 252a is formed by using the laser drill apparatus, the electrode 113 may be damaged. In the present embodiment, the back surface conductor 114 having a thickness of several µm is formed on the electrode 113 of the first semiconductor element 110A. This makes it possible to use the laser drill apparatus with high accuracy and efficiently for forming the via hole 252a.

Deep via holes 253a and 255a (not shown) for forming the vias 253 and 255 are formed similarly to the deep via hole 251a. A shallow via hole 254a (not shown) for forming the via 254 is formed similarly to the shallow via hole 252a.

After forming the via holes 251a and 252a, a desmear treatment is performed to remove the residual film of the sealing resin 310. As the desmear treatment, plasma desmear treatment is preferable.

Each of the via holes 251a to 255a can be formed in the same single step or process using the same laser drill apparatus. The via holes 251a to 255a may be formed, for example, in the order of arrangement positions of the via holes 251a to 255a regardless of the depth of the via holes. Alternatively, the deep via holes 251a, 253a, 255a and the shallow via holes 252a, 254a may be formed separately. That is, after forming of the deep via holes 251a, 253a, 255a, the shallow via holes 252a, 254a may be formed, or conversely, after forming of the shallow via holes 252a, 254a, the deep via holes 251a, 253a, 255a may be formed. The output of the laser drilling apparatus when forming the deep via holes 251a, 253a, 255a and the shallow via holes 252a, 254a may be the same as or different from one another. The processing is considered as the same single step as long as the via holes 251a to 255a are continuously formed and no other steps are performed during the formation of the via holes 251a to 255a. In other words, in a case where some of the via holes 251a to 255a are formed and a step other than the via hole forming step is performed before the remaining via holes 251a to 255a are formed, such processing is not considered as the same single step.

Figure 15:
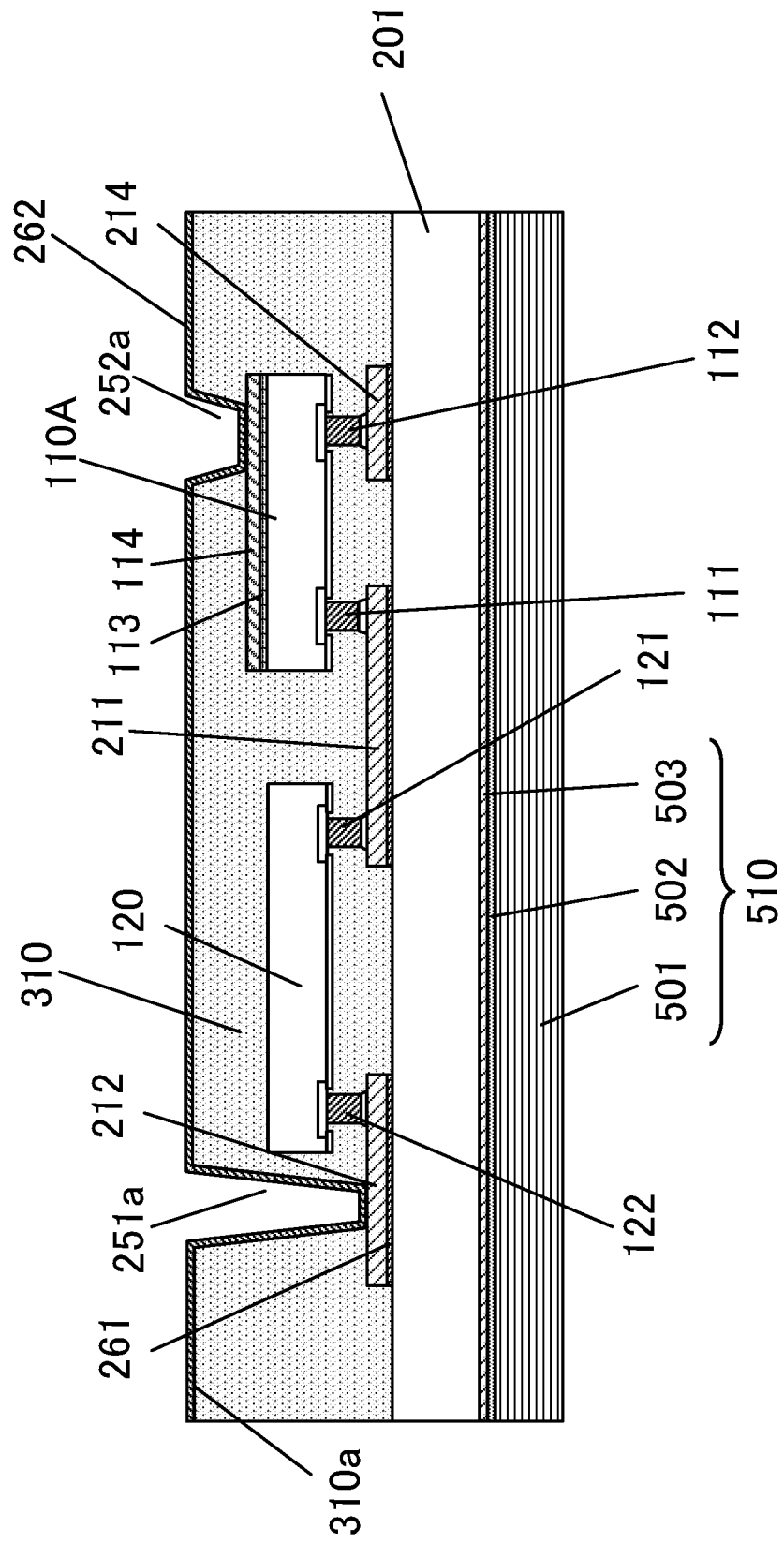
FIG. 15 is a cross-sectional view showing a step that follows the step shown in FIG. 14.

Next, as shown in FIG. 15, a base metal 262 is formed on the entire upper surface 310a of the sealing resin 310 and the entire inner surfaces of the via holes 251a to 255a. The base metal 262 is obtained, for example, by electroless plating with copper-based metal so as to have a thickness of 0.1 to 1.0 The base metal 262 may be formed by sputtering instead of electroless plating.

Figure 16:
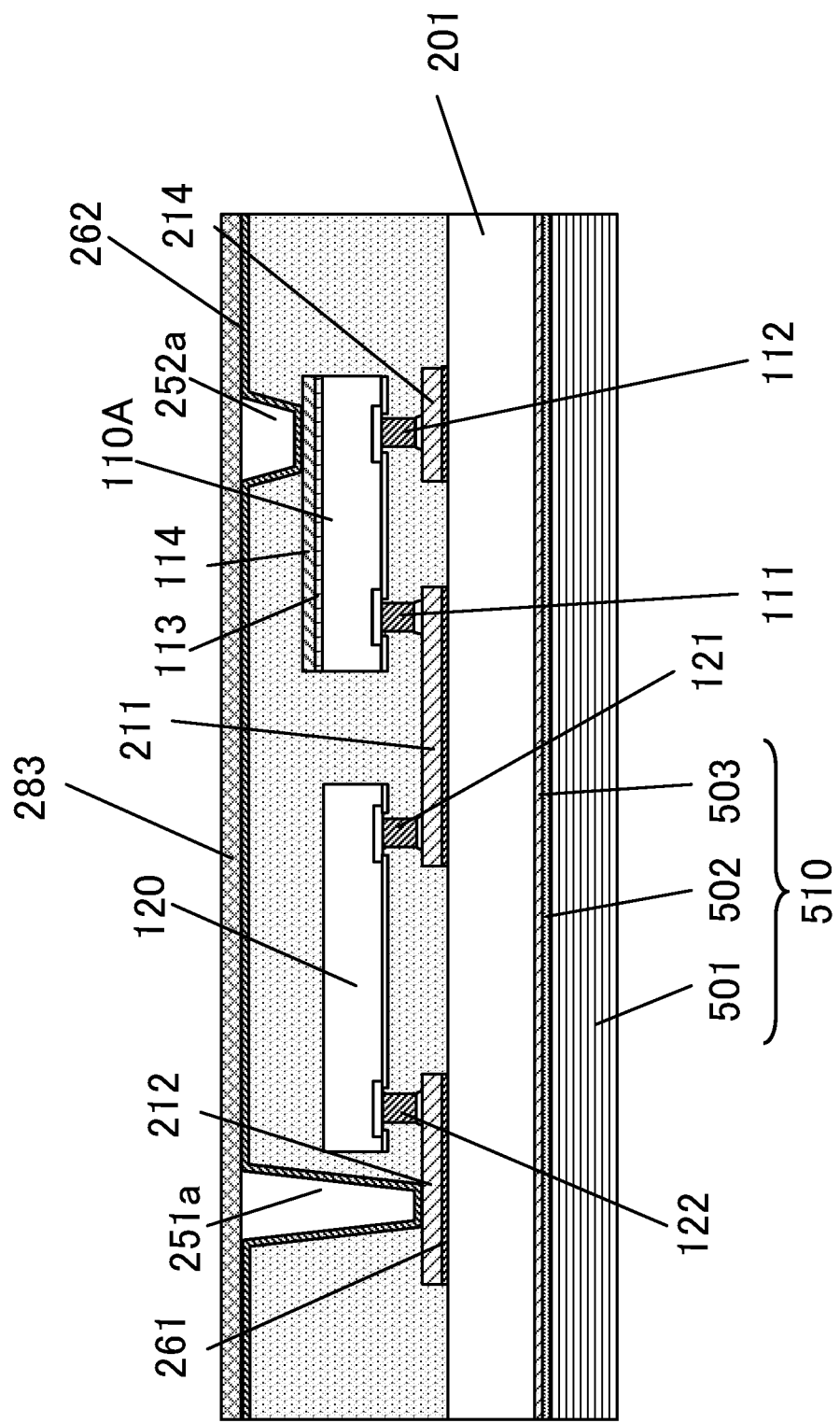
FIG. 16 is a cross-sectional view showing a step that follows the step shown in FIG. 15.

Next, as shown in FIG. 16, a photoresist 283 is formed on the entire surface of the base metal 262. The photoresist 283 is formed by laminating dry film type photosensitive resist films with the laminator. The photoresist 283 may be a positive type or a negative type. In the present embodiment, the photoresist of a positive type will be exemplified.

Figure 17:
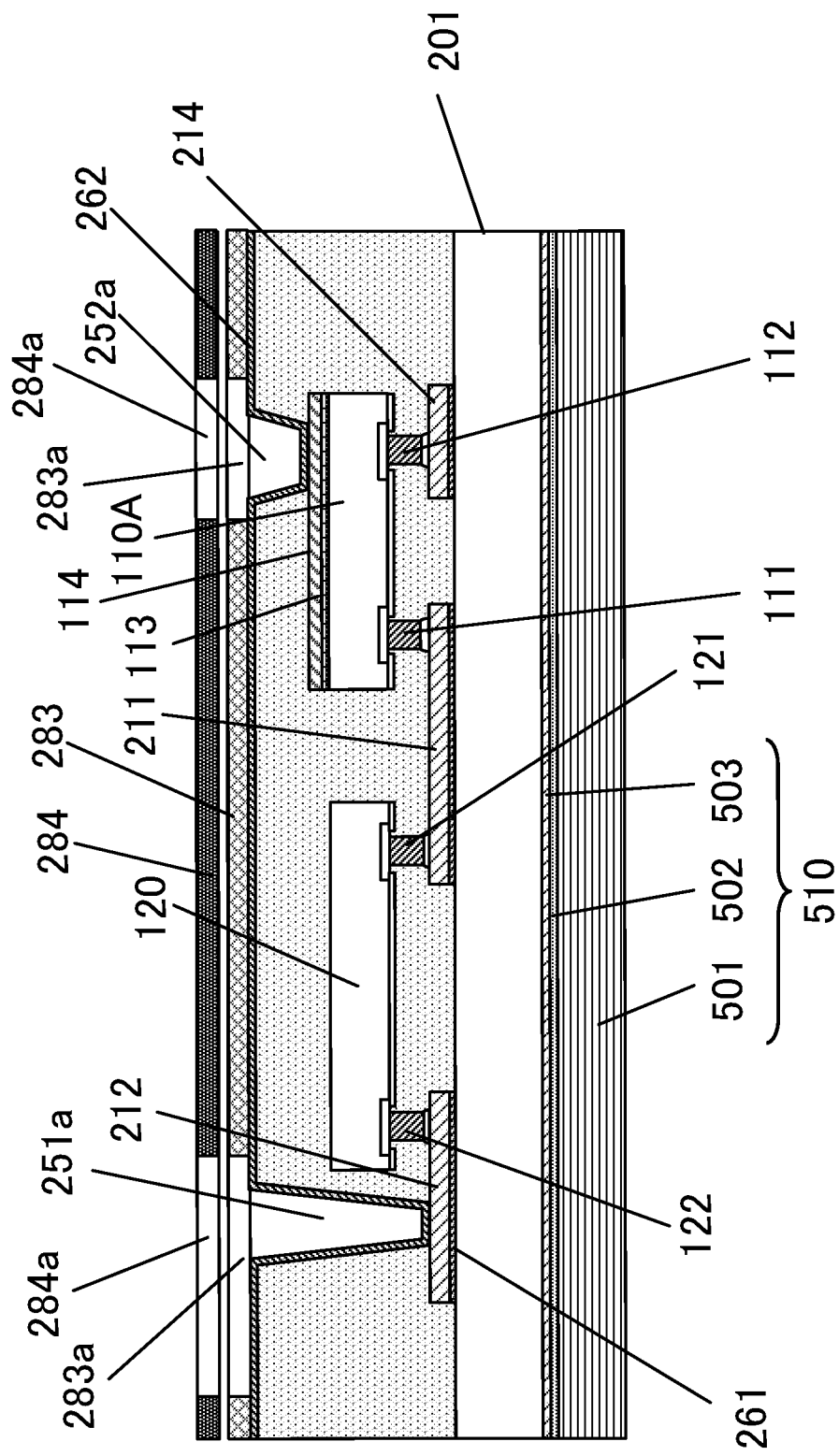
FIG. 17 is a cross-sectional view showing a step that follows the step shown in FIG. 16.

Then, as shown in FIG. 17, a photomask 284 is arranged on the photoresist 283 so as to perform exposure with the exposure apparatus. The photomask 284 has transparent portions 284a corresponding to the via holes 251a, 252a and the peripheral portions thereof, and the positive photoresist 283 is exposed at portions 283a corresponding to the transparent portions 284a of the photomask 284. Then, the photomask 284 is removed. The photoresist 283 is then developed to open the exposed portions 283a of the photoresist 283.

Figure 18:
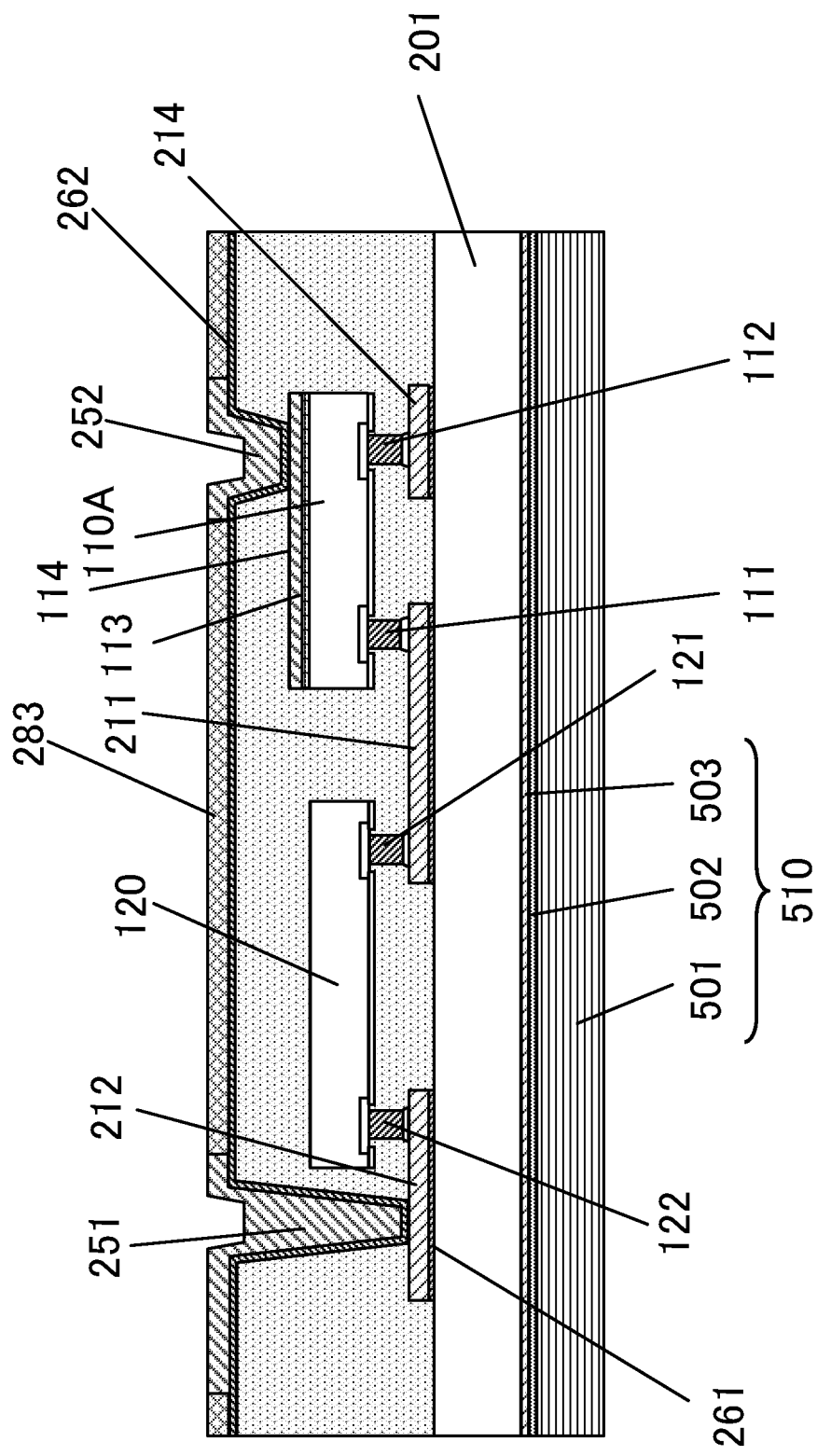
FIG. 18 is a cross-sectional view showing a step that follows the step shown in FIG. 17.
Figure 19:
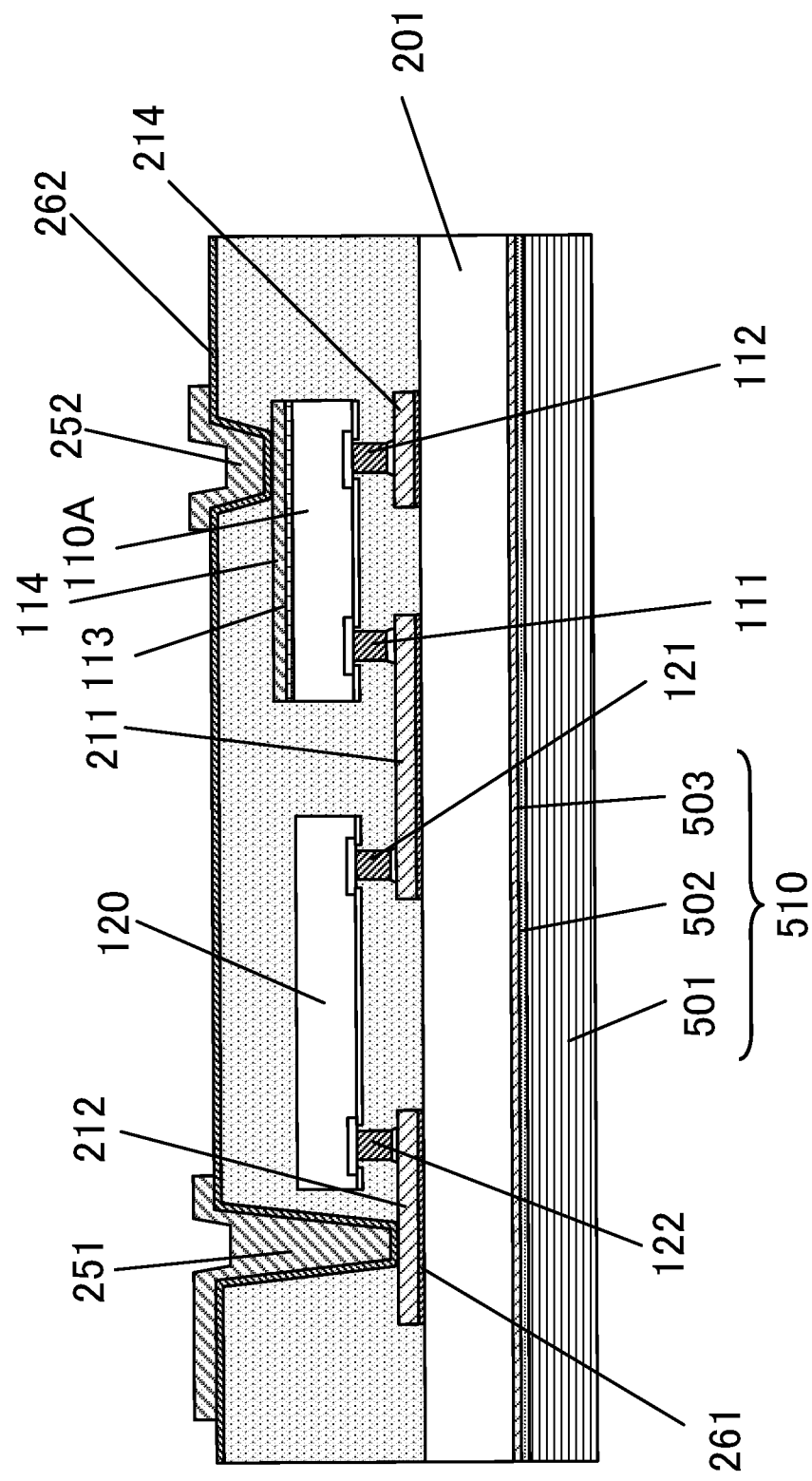
FIG. 19 is a cross-sectional view showing a step that follows the step shown in FIG. 18.

Next, as shown in FIG. 18, electrolytic plating is performed using the base metal 262 as a current path to fill the via holes 251a and 252a with conductive metal so as to form the vias 251 and 252. Electrolytic plating is performed using, for example, copper-based metal plating solution.

Although not shown, the vias 253, 254, 255 and the intermediate connecting portion 256 connecting the vias 253 and 254 shown in FIG. 3 are also formed in the same step as the via holes 251a, 252a.

Figure 20:
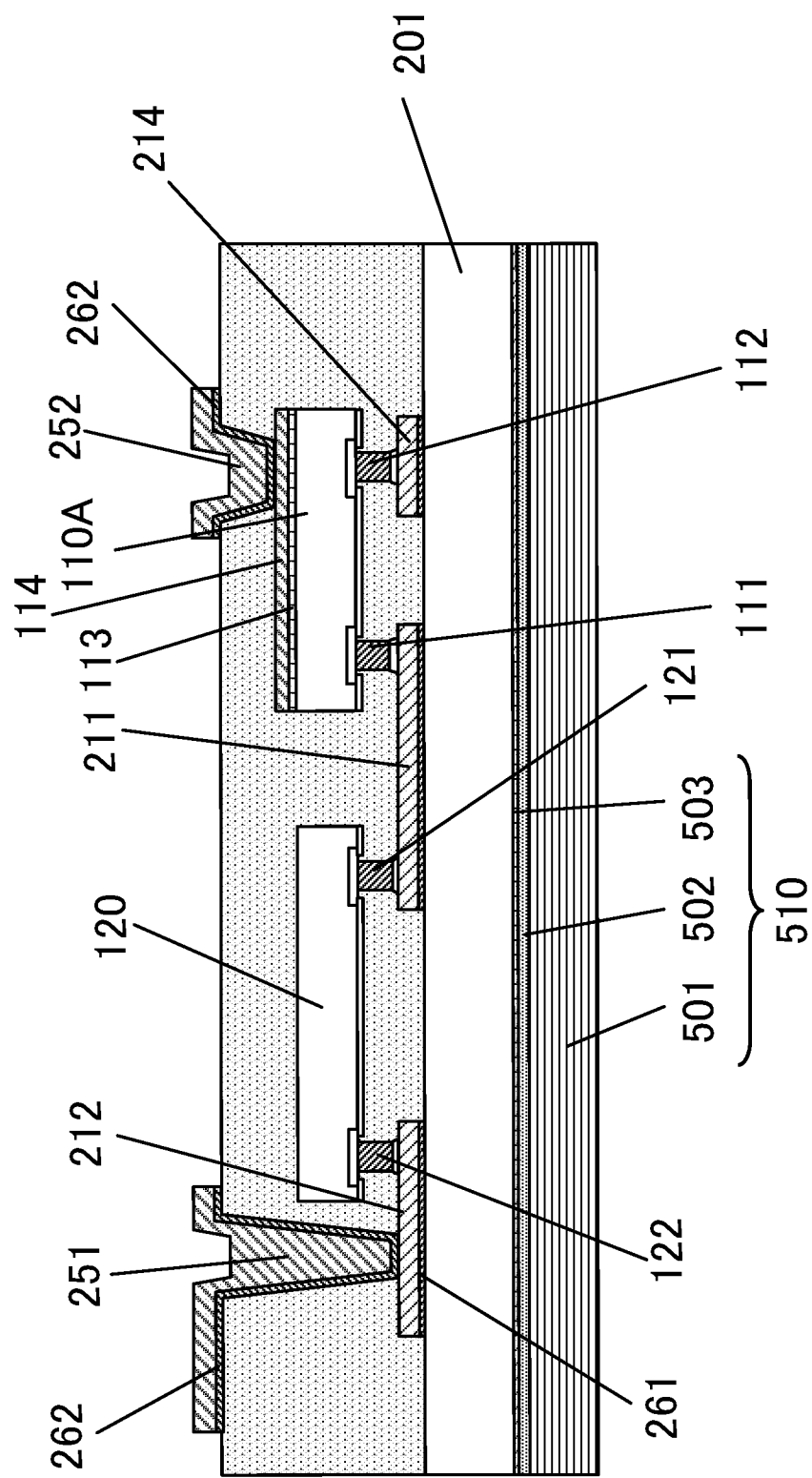
FIG. 20 is a cross-sectional view showing a step that follows the step shown in FIG. 19.

Then, the photoresist 283 is removed (see FIG. 19), and subsequently, the base metal 262 exposed from the vias 251 and 252 is removed by etching. Thereby, an intermediate body shown in FIG. 20 is obtained.

As described with reference to FIGS. 14 to 20, the shallow vias 252 and 254 connected to the back surface conductors 114 of the first and third semiconductor elements 110A and 110B, and the deep vias 251, 253 and 255 connected to the connection conductor 210 are formed in the same single step. Thereby, the productivity of the semiconductor device 100 can be improved.

Figure 21:
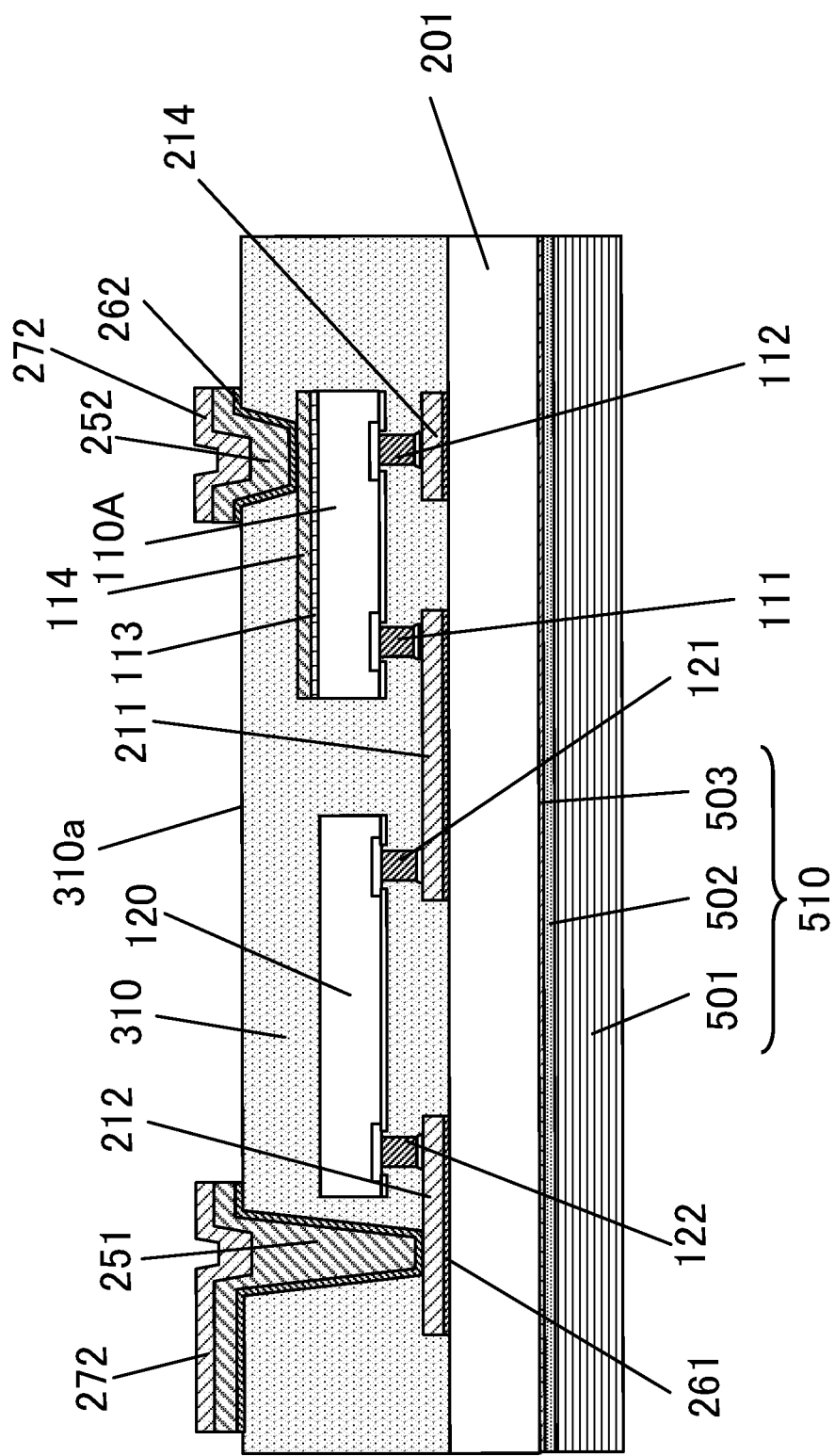
FIG. 21 is a cross-sectional view showing a step that follows the step shown in FIG. 20.

Next, as shown in FIG. 21, the joining material 272 is formed on the upper surfaces of the vias 251 to 255 (253 to 255 are not shown) exposed from the upper surface 310a of the sealing resin 310. To form the joining material 272, for example, solder cream, metal paste for sintering, or the like is formed on each of the vias 251 to 255 by printing, and in this state, a reflow process is performed to melt the joining material 272, and the joining material 272 is cooled to solidify.

Figure 22:
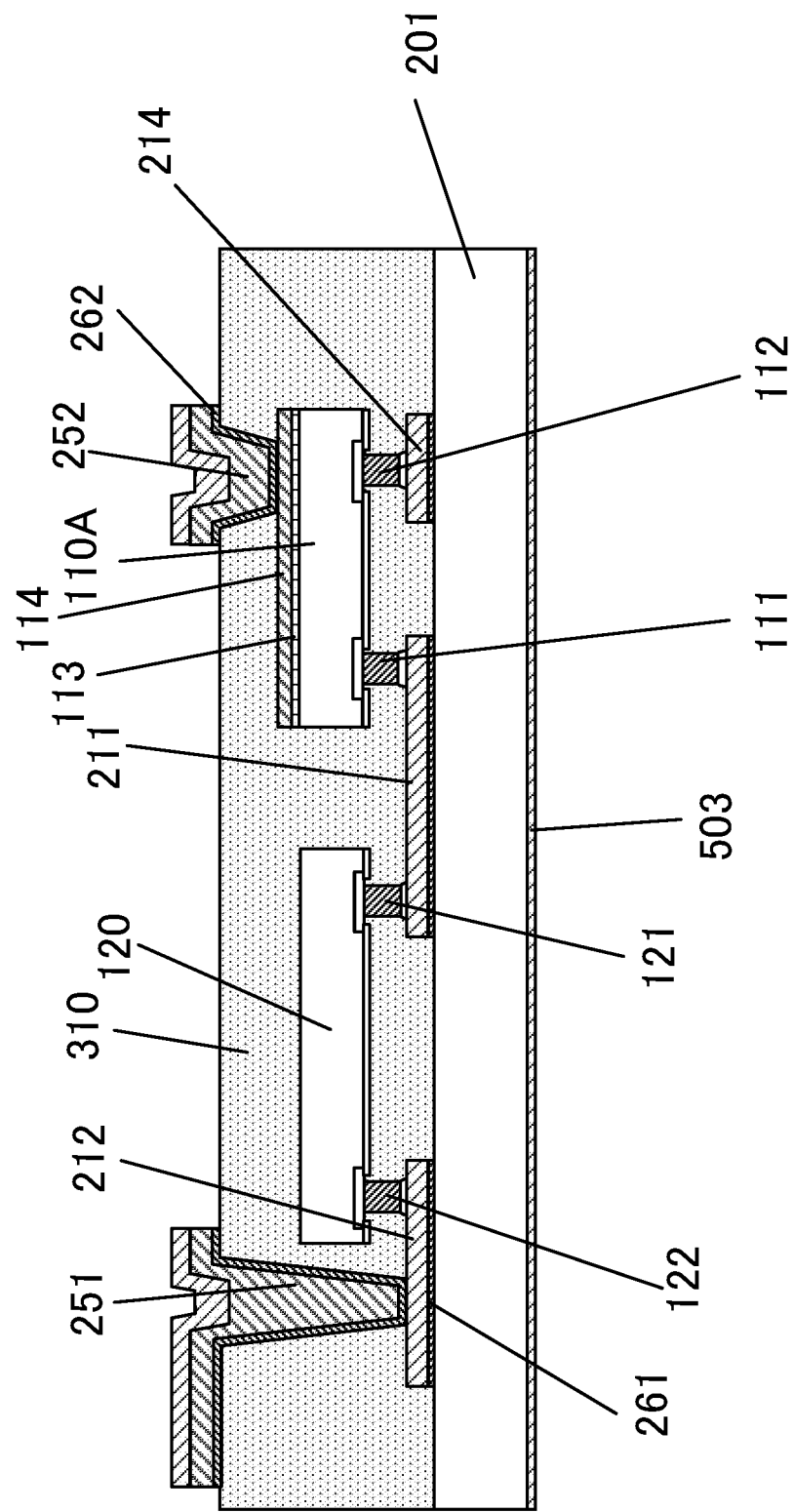
FIG. 22 is a cross-sectional view showing a step that follows the step shown in FIG. 21.

Next, as shown in FIG. 22, the base layer 501 of the support base material 510 is released off from the conductive thin film 503. A physical external force is applied to the release layer 502 to form a crack in the release layer 502, and the base layer 501 is released off by breaking the release layer 502 while propagating the crack.

Figure 23:
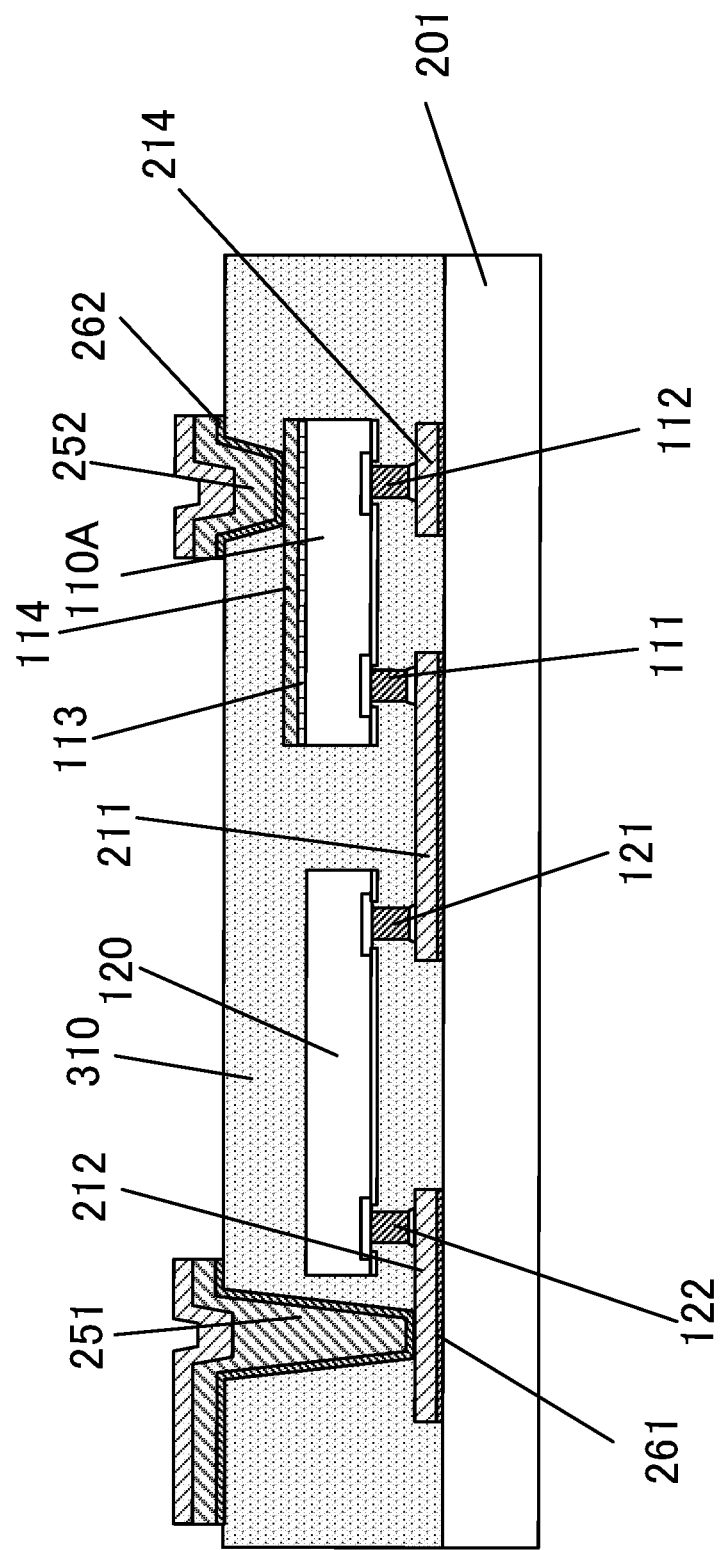
FIG. 23 is a cross-sectional view showing a step that follows the step shown in FIG. 22.

Next, as shown in FIG. 23, the conductive thin film 503 is removed by etching process.

Figure 24:
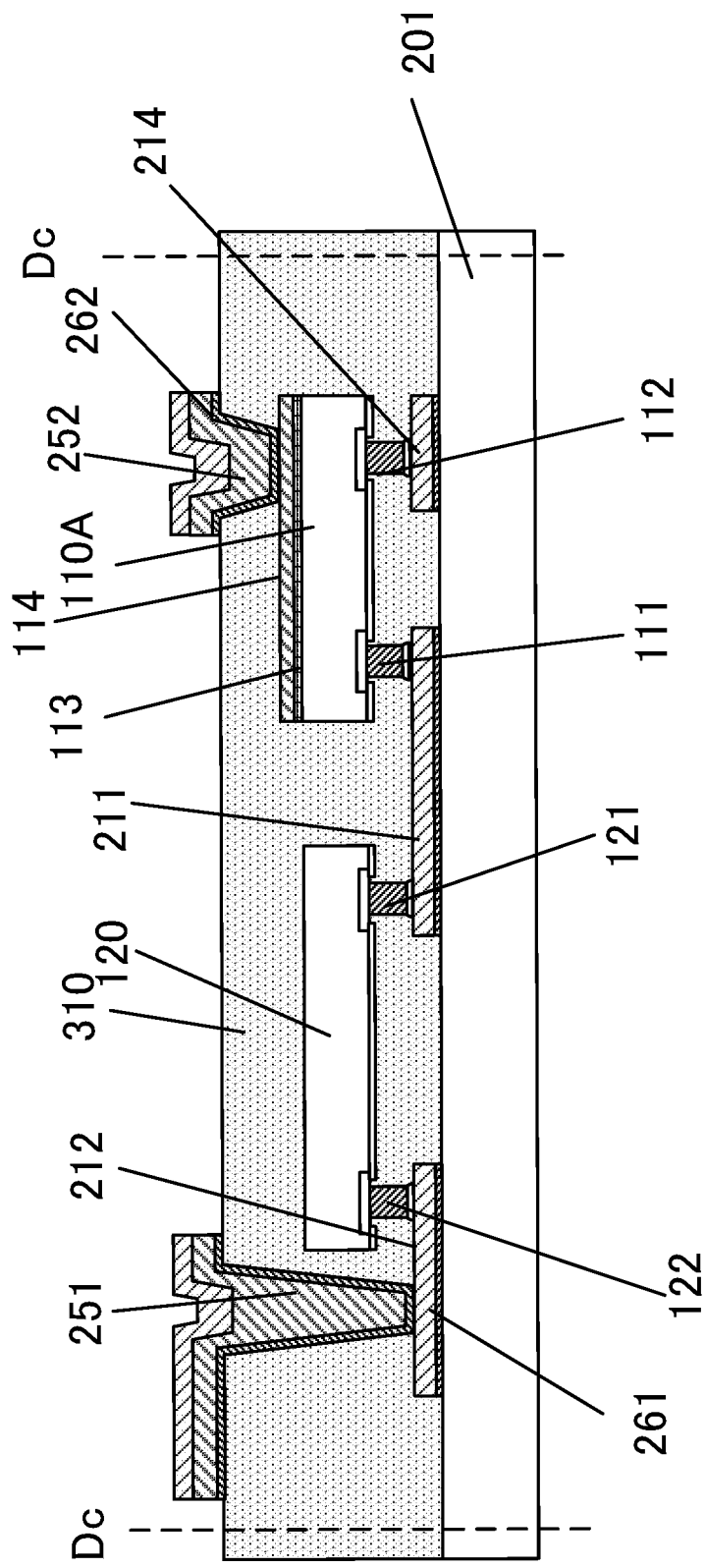
FIG. 24 is a cross-sectional view showing a step that follows the step shown in FIG. 23.

Then, as shown by dotted lines in FIG. 24, the sealing resin 310 and the base material 201 are diced at predetermined positions Dc. As a result, the semiconductor device 100 shown in FIGS. 1 and 2 is obtained.

Variation

Figure 25:
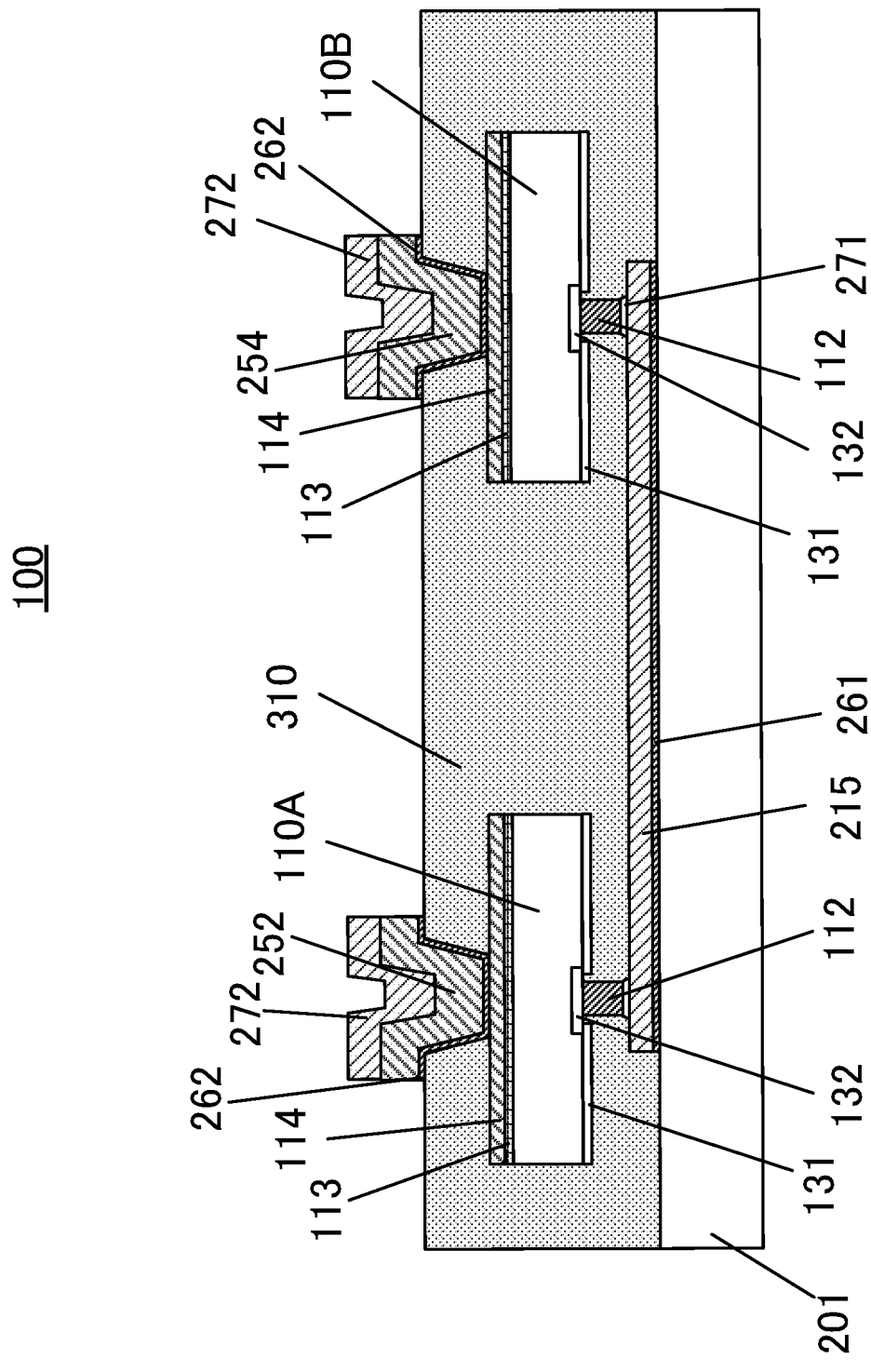
FIG. 25 is a sectional view showing a variation of FIG. 3.

FIG. 25 is a sectional view showing a variation of FIG. 3. The semiconductor device 100 illustrated in FIG. 3 has the structure in which the electrode 112 of the first semiconductor element 110A is electrically connected, via the connection conductor 214, the via 253, the intermediate connecting portion 256, and the via 254, to the back surface conductor 114 laminated on the electrode 113 of the back surface side of the third semiconductor element 110B.

On the other hand, the semiconductor device 100 illustrated in FIG. 25 has the structure in which the electrode 112 of the first semiconductor element 110A and the electrode 112 of the third semiconductor element 110B are connected by a connection conductor 215 formed on the base material 201. That is, the present variation does not include the vias 253, 254, and the intermediate connecting portion 256 connecting the via 253 and the via 254, such as illustrated in FIG. 3 of the first embodiment.

According to the first embodiment of the present invention, the following advantageous effects are achieved.

(1) The semiconductor device 100 comprises: the first semiconductor element 110A having the electrode 111 on the main surface side and the electrode 113 on the back surface side; the base material 201 provided with a connection conductor 210 connected to the electrode 111; the sealing resin 310 provided on the base material 201 and seal the first semiconductor element 110A; and the via 252 provided in the sealing resin 310 and electrically connected to the electrode 113 of the first semiconductor element 110A.

Moreover, the manufacturing method of the semiconductor device 100 comprises: preparing the first semiconductor element 110A having the electrode 111 on the main surface side and the electrode 113 on the back surface side; connecting the electrode 111 of the first semiconductor element 110A to the first connection conductor 211 provided on the base material 201; sealing the first semiconductor element 110A provided on the base material 201 with the sealing resin 310; and providing the via 252 electrically connected to the electrode 113 of the first semiconductor element 110A in the sealing resin 310.

In the semiconductor device 100 and the manufacturing method of the semiconductor device 100 according to the first embodiment, the via 252 formed in the sealing resin 310 is connected to the electrode 113 on the back surface side of the first semiconductor element 110A. In the conventional structure in which the metal plate is joined to the electrode 113 on the back surface side of the first semiconductor element 110A with joining material such as solder, the thickness of the joining portion is a sum of the thicknesses of the metal plate and the joining material. Therefore, it is not possible to achieve sufficient thinning. In addition, since the metal plate cannot be as fine as the connection wiring, it cannot be sufficiently miniaturized. On the other hand, the connection by the via 252 does not require a joining material, and the length (depth) of the via 252 is made much shorter than the thicknesses of the metal plate and the joining material. Further, the via 252 formed in the sealing resin 310 can be formed with high precision similarly to through holes formed in the circuit board. Therefore, the semiconductor device 100 can be made thinner and smaller. Moreover, since the length of the via 252 is shortened, the connection resistance can be reduced.

(2) The semiconductor device 100 further includes the back surface conductor 114 laminated on the electrode 113 of the first semiconductor element 110A. Since the back surface conductor 114 is not damaged even when irradiated with laser light, the via hole 252a formed in the sealing resin 310 can be formed by irradiating the sealing resin 310 with laser light. Thereby, the via hole 252a can be formed efficiently and highly accurately.

(3) The semiconductor device 100 further includes the second semiconductor element 120 having the electrode 121 and the electrode 122, and the connection conductor 210 includes the first connection conductor 211 that electrically connects the electrode 121 of the second semiconductor element 120 with the electrode 111 of the first semiconductor element 110A.

In the conventional structure in which one end of the metal plate is connected to the electrode 113 on the back surface side of the first semiconductor element 110A, the other end of the metal plate needs to be connected to the connection wiring. However, since the metal plate is not a high-definition member like the connection wiring formed on the circuit board, the area of the base material 201 increases. On the other hand, in the present embodiment, the electrode 121 of the second semiconductor element 120 and the electrode 111 of the first semiconductor element 110A can be connected together at high density via the first connection conductor 211. Thereby, it is possible to reduce the size of the semiconductor device 100.

(4) In the above (3), the connection conductor 210 includes the connection conductor 212 connected to the electrode 122 of the second semiconductor element 120, and the sealing resin 310 is further provided with the via 251 connected to the connection conductor 212. As described above, the connection conductor 212 and the via 251 connected to the connection conductor 212 can be further provided, and such a construction can be applied to a semiconductor device that requires more complicated wiring to achieve thinning and miniaturization.

(5) Furthermore, the semiconductor device 100 is further provided with the second semiconductor element 120 having the electrode 121 and the electrode 122 on the main surface side, the connection conductor 210 includes the connection conductor 212 connected to the electrode 122 of the second semiconductor element 120 and the sealing resin 310 is further provided with the via 251 connected to the connection conductor 212. Since the connection conductor 212 provided on the base material 201 is routed on the upper surface 310a side of the sealing resin 310 via the via 251 provided in the sealing resin 310, the routing of the connection conductor 210 formed on the base material 201 is simplified. Therefore, by using, for example, the base material 201 of a single-sided wiring board, the base material 201 can be manufactured in a simple structure at a lower cost.

Second Embodiment

Figure 26:
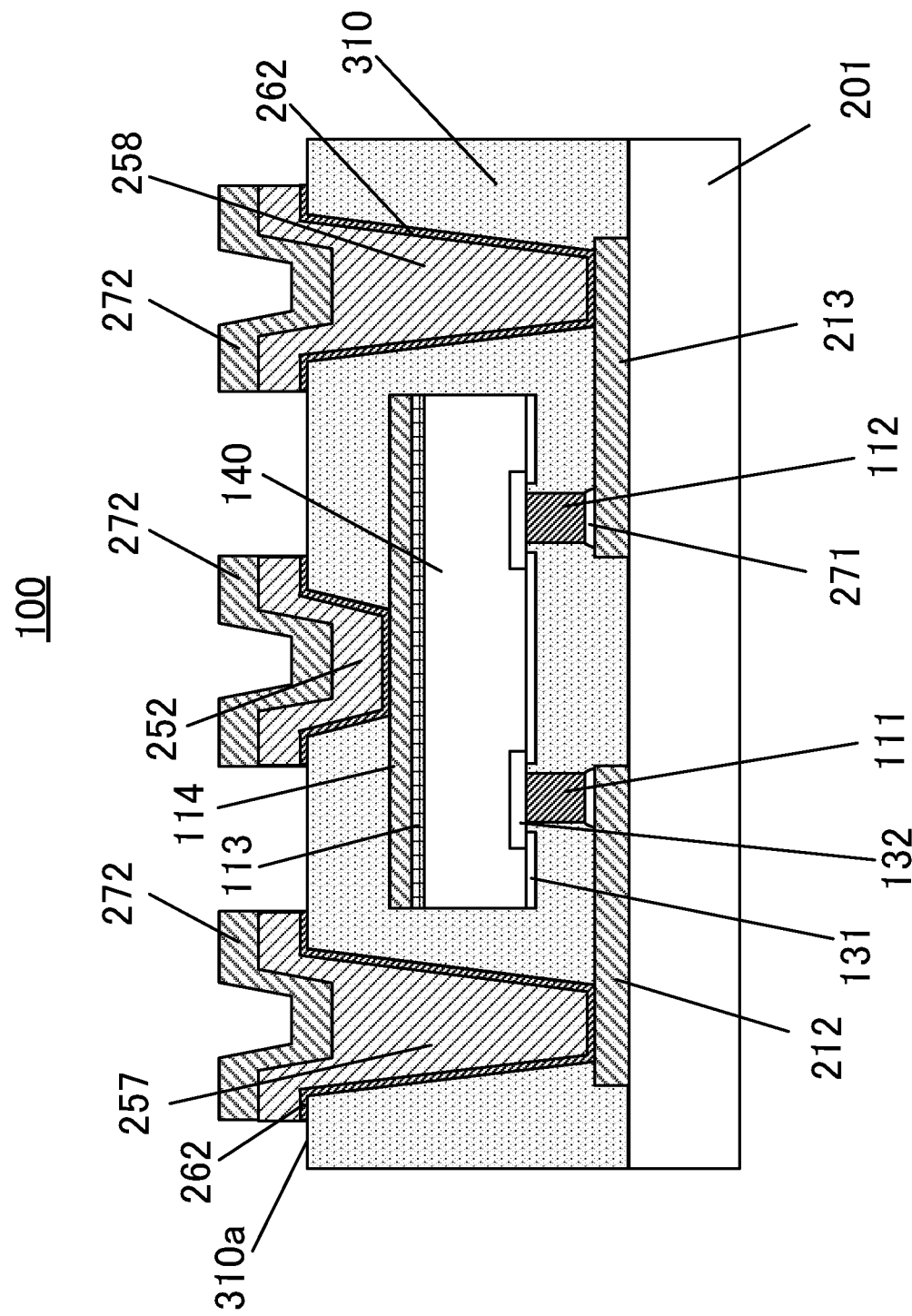
FIG. 26 is a sectional view of the semiconductor device according to a second embodiment of the present invention.

FIG. 26 is a sectional view of a semiconductor device according to the second embodiment of the present invention.

A semiconductor device 100 of the second embodiment includes one semiconductor element 140.

A structure of the semiconductor element 140 has the same structure as the semiconductor elements 110A and 110B shown in FIG. 3. That is, the semiconductor element 140 has an insulating film 131, a connection pad 132, pillar-shaped electrodes 111 and 112, a back surface side electrode 113, and a back surface conductor 114.

Connection conductors 212 and 213 are provided on a base material 201. The base metal 261 illustrated in FIG. 3 is not provided between the base material 201 and the connection conductors 212 and 213. The electrodes 111 and 112 of the semiconductor element 140 are joined to the connection conductors 212 and 213, respectively. The electrodes 111 and 112 are joined by a joining material 271 such as solder or metal paste for sintering to the connection conductors 212 and 213.

The semiconductor element 140 is sealed with sealing resin 310 that covers an upper surface 201a of the base material 201. The sealing resin 310 is provided with vias 252, 257, and 258. The via 252 is connected to the back surface conductor 114 laminated on the electrode 113 on the back surface side of the semiconductor element 140. The vias 257 and 258 are connected to the connection conductors 212 and 213, respectively. That is, the via 257 is connected to the electrode 111 of the semiconductor element 140 via the connection conductor 212, and the via 258 is connected to the electrode 112 of the semiconductor element 140 via the connection conductor 213. Between the vias 252, 257, and 258 and respective via holes 252a, 257a, and 258a of the sealing resin 310 (see FIG. 30), base metal 262, serving as a current path when the vias 252, 257, 258 are formed by electrolytic plating, is provided.

A joining material 272 such as solder or sintered metal is provided on an upper surface of each of the vias 252, 257, and 258 exposed from an upper surface 310a of the sealing resin 310.

Next, a manufacturing method of the semiconductor device 100 shown in FIG. 26 will be described.

FIGS. 27 to 38 are cross-sectional views showing the steps in manufacturing the semiconductor device 100 in the order of steps.

In the following description, manufacturing method of the semiconductor device 100 will be exemplified as a method of simultaneously manufacturing two semiconductor devices 100 each having the semiconductor element 140. The manufacturing method of the second embodiment includes a manufacturing method similar to that of the first embodiment, therefore, description of the manufacturing method similar to that of the first embodiment will be omitted as appropriate.

Figure 27:
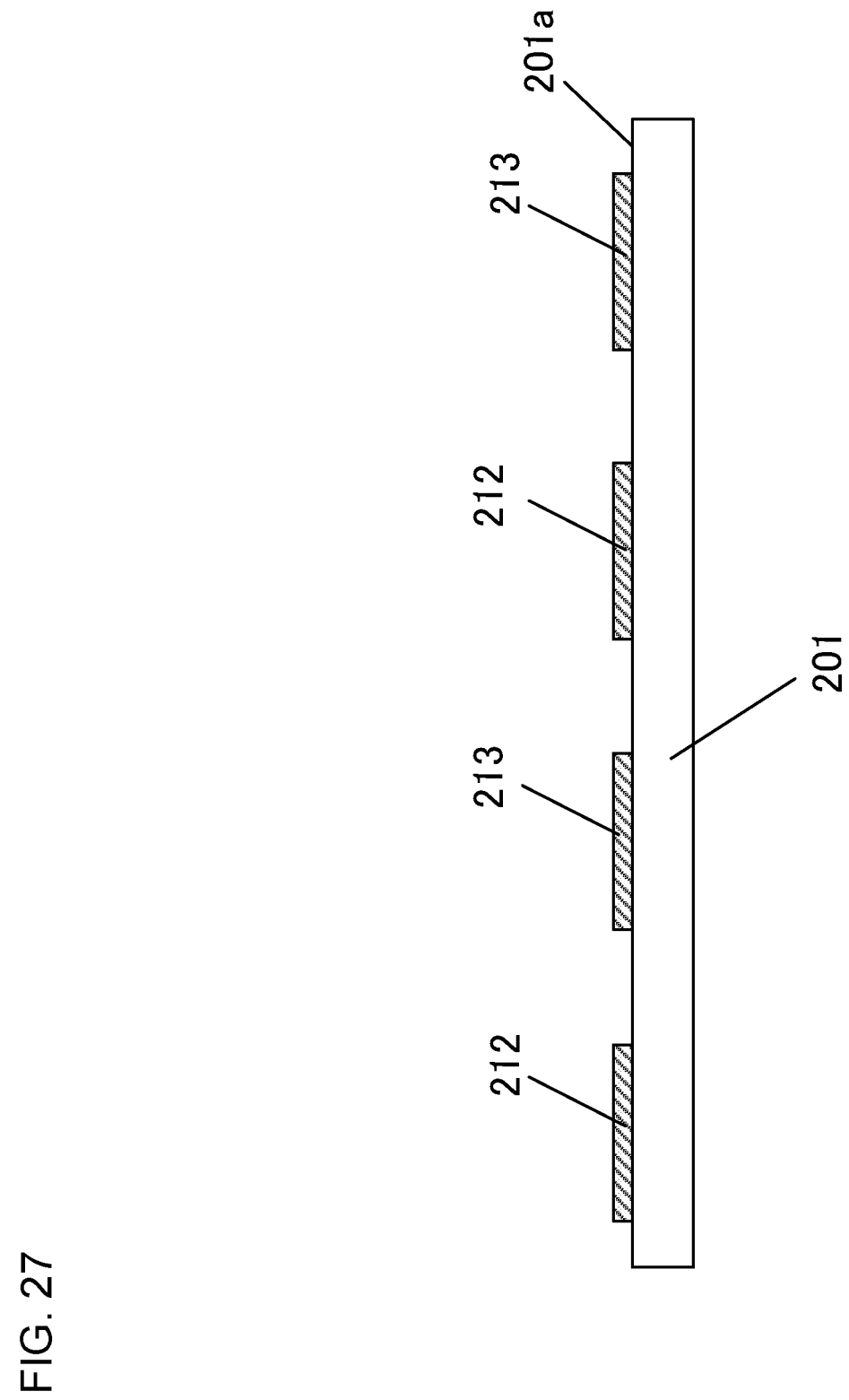
FIG. 27 is a diagram for explaining a manufacturing method of the semiconductor device shown in FIG. 26, showing a first step in a cross-sectional view.

First, the base material 201 having an area sufficient to manufacture two semiconductor devices 100 each having the semiconductor element 140 is prepared. As a material of the base material 201, a resin such as an epoxy resin or a glass epoxy resin, a ceramic, or the like can be used. As shown in FIG. 27, two pairs of connection conductors 212 and 213 are formed on the upper surface 201a of the base material 201 by using a normal technique for forming a single-sided wiring board.

It is noted that, the steps of manufacturing the two semiconductor devices 100 are performed simultaneously and in parallel, and in order to make the description easy to understand, a method of manufacturing one semiconductor device 100 will be described below.

Figure 28:
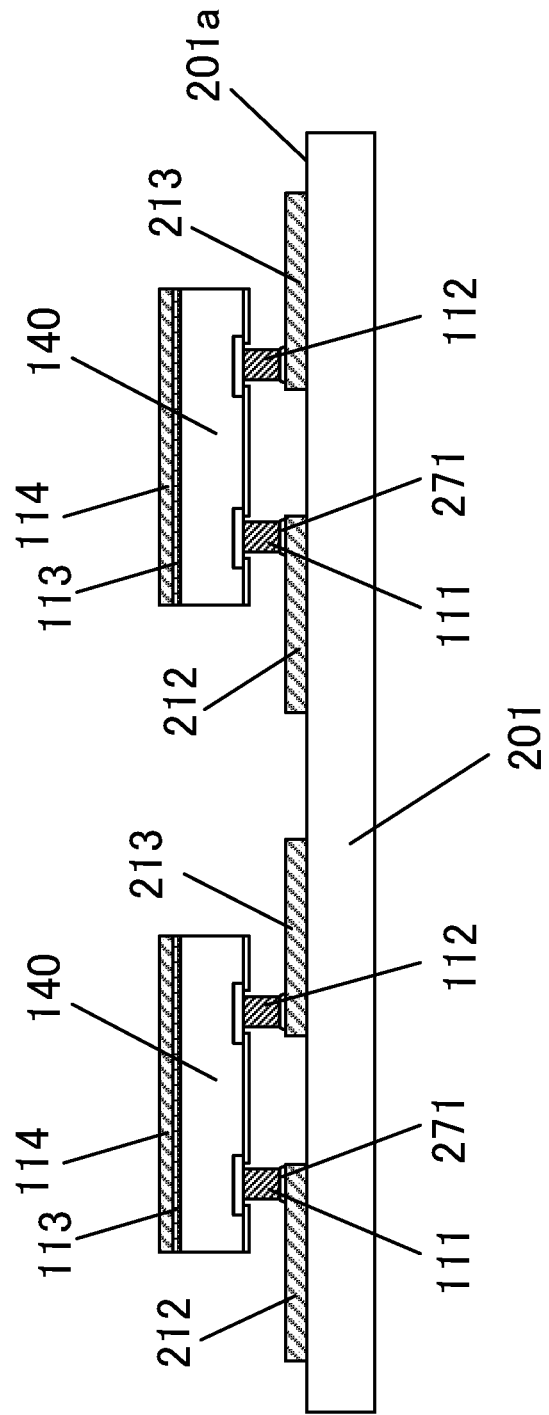
FIG. 28 is a cross-sectional view showing a step that follows the step shown in FIG. 27.

Next, as shown in FIG. 28, the electrodes 111 and 112 of the semiconductor element 140 are joined to the connection conductors 212 and 213, respectively. The back surface conductor 114 is formed in advance on the electrode 113 on the back surface side of the semiconductor element 140.

Before bonding, the joining material 271 such as solder is applied to the lower end surfaces of the electrodes 111 and 112, and flux is applied to the joining portions of the connection conductors 212 and 213 at which the electrodes 111 and 112 are to be joined. Then, the semiconductor elements 140 are picked up one by one by the flip chip bonder to mount the electrodes 111 and 112 of the semiconductor element 140 at predetermined positions of the connection conductors 212 and 213. In this state, an intermediate body of the semiconductor device 100 shown in FIG. 28 is carried into the reflow apparatus. By being heated in the reflow device, the joining material 271 is melted, and the electrodes 111 and 112 of the semiconductor element 140 are joined to the predetermined joining portions of the corresponding connection conductors 212 and 213, respectively.

Figure 29:
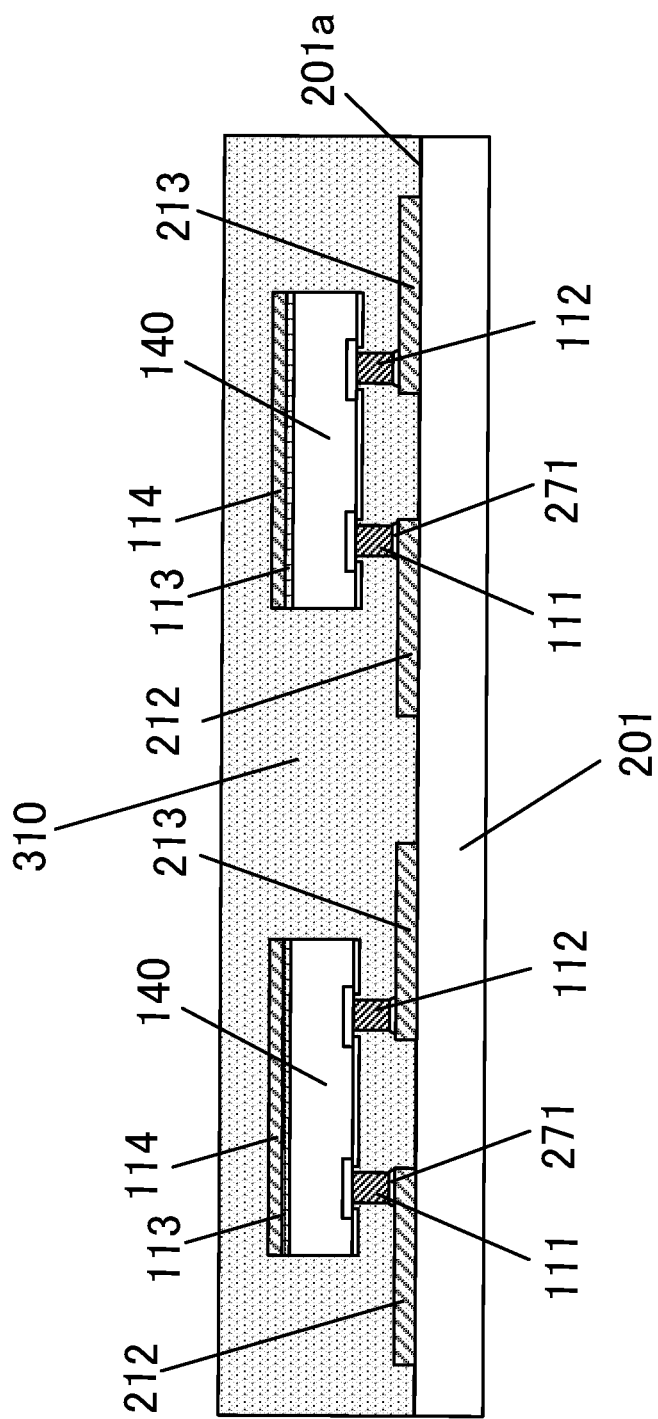
FIG. 29 is a cross-sectional view showing a step that follows the step shown in FIG. 28.

Next, as shown in FIG. 29, the entire upper surface 201a of the base material 201 of the intermediate body shown in FIG. 28 is sealed with the sealing resin 310. For sealing with the sealing resin 310, a compression molding method is used, for example, with epoxy resin. Sealing is performed so as to cover the entire upper surface 201a of the base material 201 and the entire surface of the semiconductor element 140.

Next, the vias 252, 257, and 258 are formed in the sealing resin 310. A method of forming the vias 252, 257, 258 will be described with reference to FIGS. 30 to 36.

Figure 30:
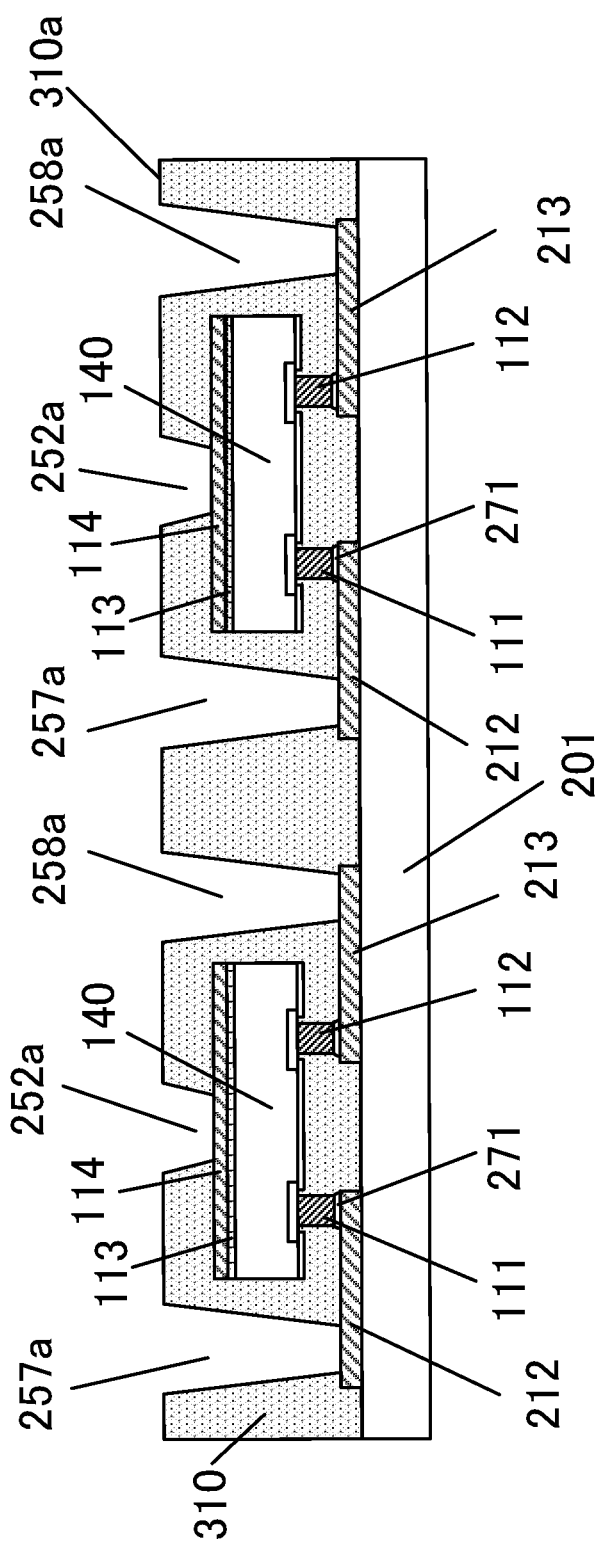
FIG. 30 is a cross-sectional view showing a step that follows the step shown in FIG. 29.

First, as shown in FIG. 30, the via holes 252a, 257a, 258a for respectively forming the vias 252, 257, 258 are formed. The via holes 252a, 257a, 258a are preferably formed by using the laser drill apparatus. The via holes 257a and 258a reach the connection conductors 212 and 213 respectively from the upper surface 310a of the sealing resin 310. The via hole 252a reaches from the upper surface 310a of the sealing resin 310 to the back surface conductor 114 laminated on the electrode 113 of the semiconductor element 140.

Both the via holes 257a and 258a are deeper than the via hole 252a. However, the via holes 252a, 257a, and 258a can be formed in the same single step using the same laser drill apparatus. The via holes 252a, 257a and 258a may be formed in the order of arrangement positions of the via holes 252a, 257a and 258a regardless of the depth of the via holes. Alternatively, the deep via holes 257a and 258a and the shallow via holes 252a may be formed separately.

After forming the via holes 252a, 257a and 258a, the desmear treatment is performed to remove the residual film of the sealing resin 310. As the desmear treatment, plasma desmear treatment is preferred.

Figure 31:
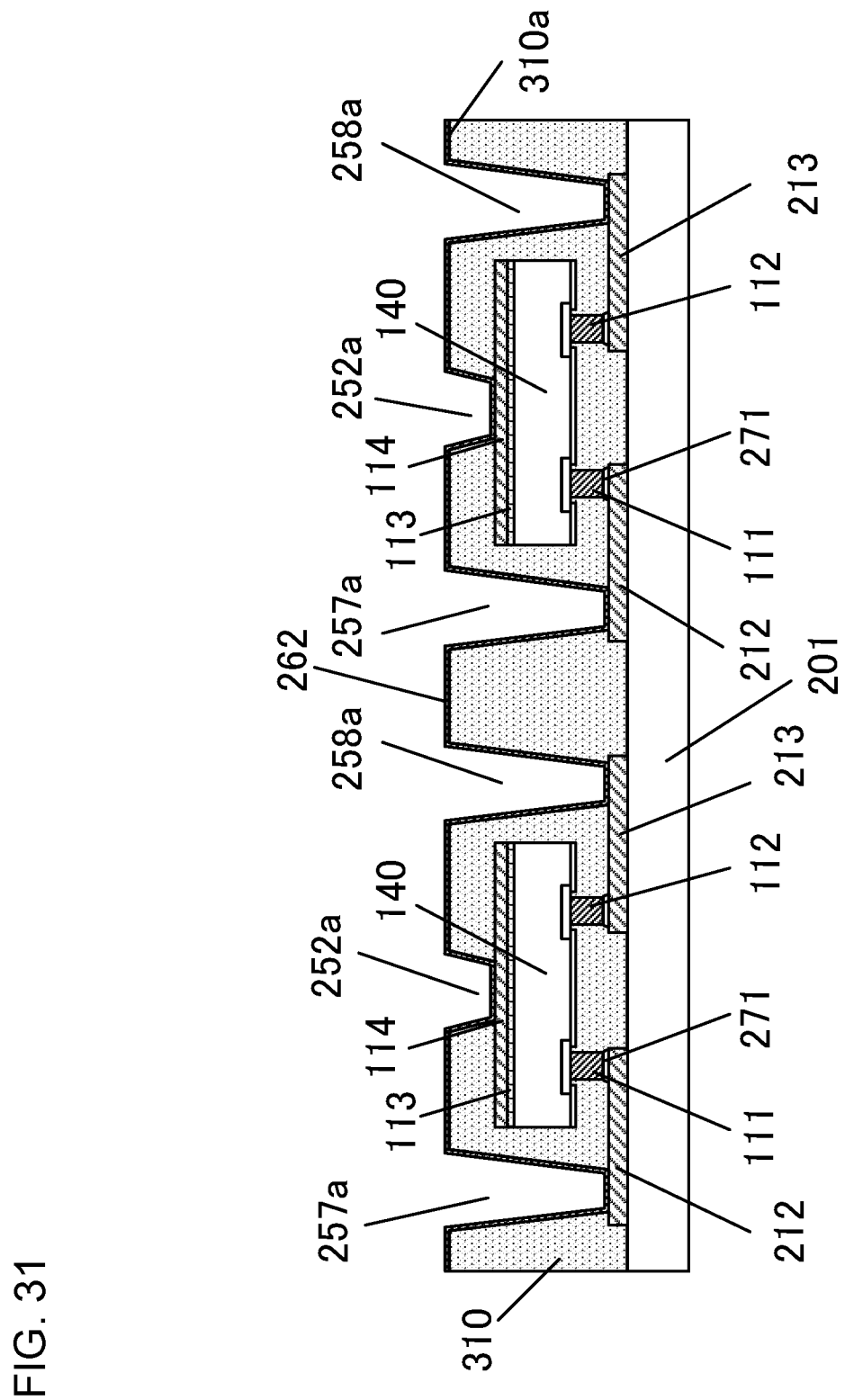
FIG. 31 is a cross-sectional view showing a step that follows the step shown in FIG. 30.

Next, as shown in FIG. 31, the base metal 262 is formed on the entire upper surface 310a of the sealing resin 310 and the entire inner surfaces of the via holes 252a, 257a and 258a. The base metal 262 is obtained by performing electroless plating with copper-based metal so as to have a thickness of 0.1 to 1.0 μm, for example.

Figure 32:
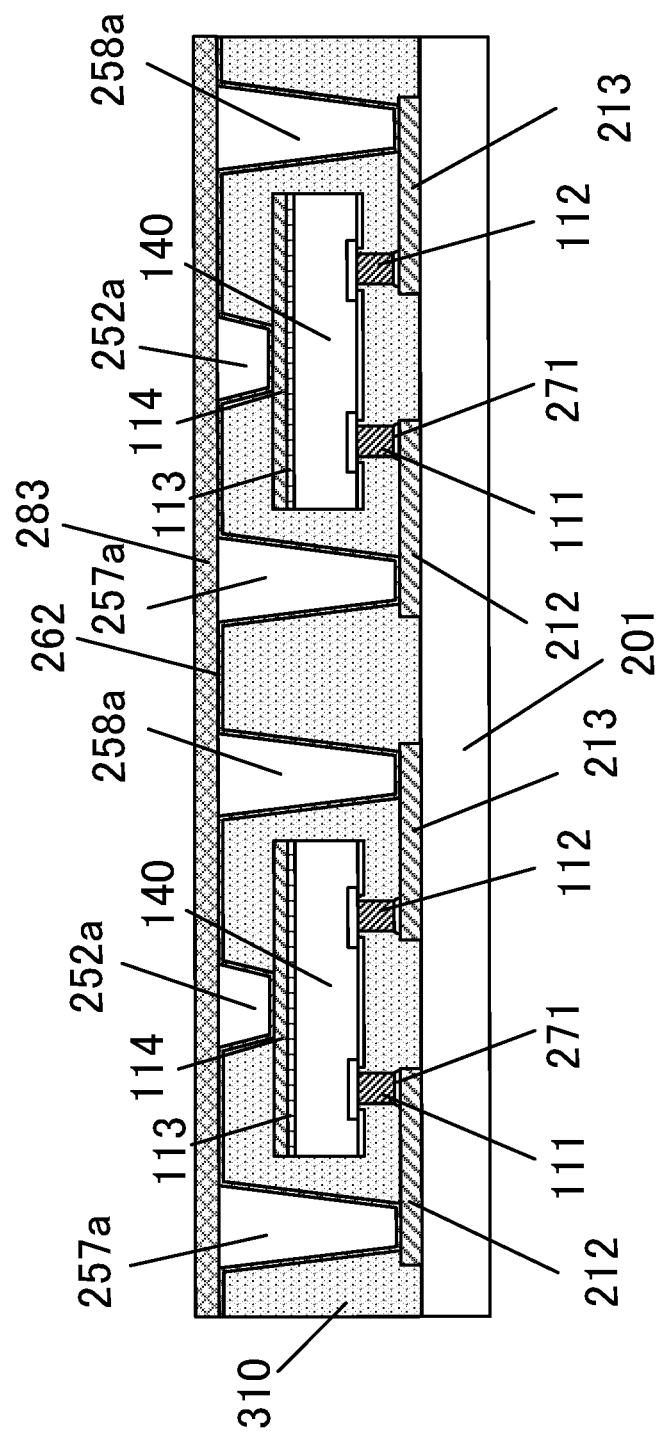
FIG. 32 is a cross-sectional view showing a step that follows the step shown in FIG. 31.

Next, as shown in FIG. 32, a photoresist 283 is formed on the entire surface of the base metal 262. The photoresist 283 is formed by laminating a dry film type photosensitive resist film with a laminator. The photoresist 283 may be a positive type or a negative type. In the present embodiment, the photoresist of a positive type will be exemplified.

Figure 33:
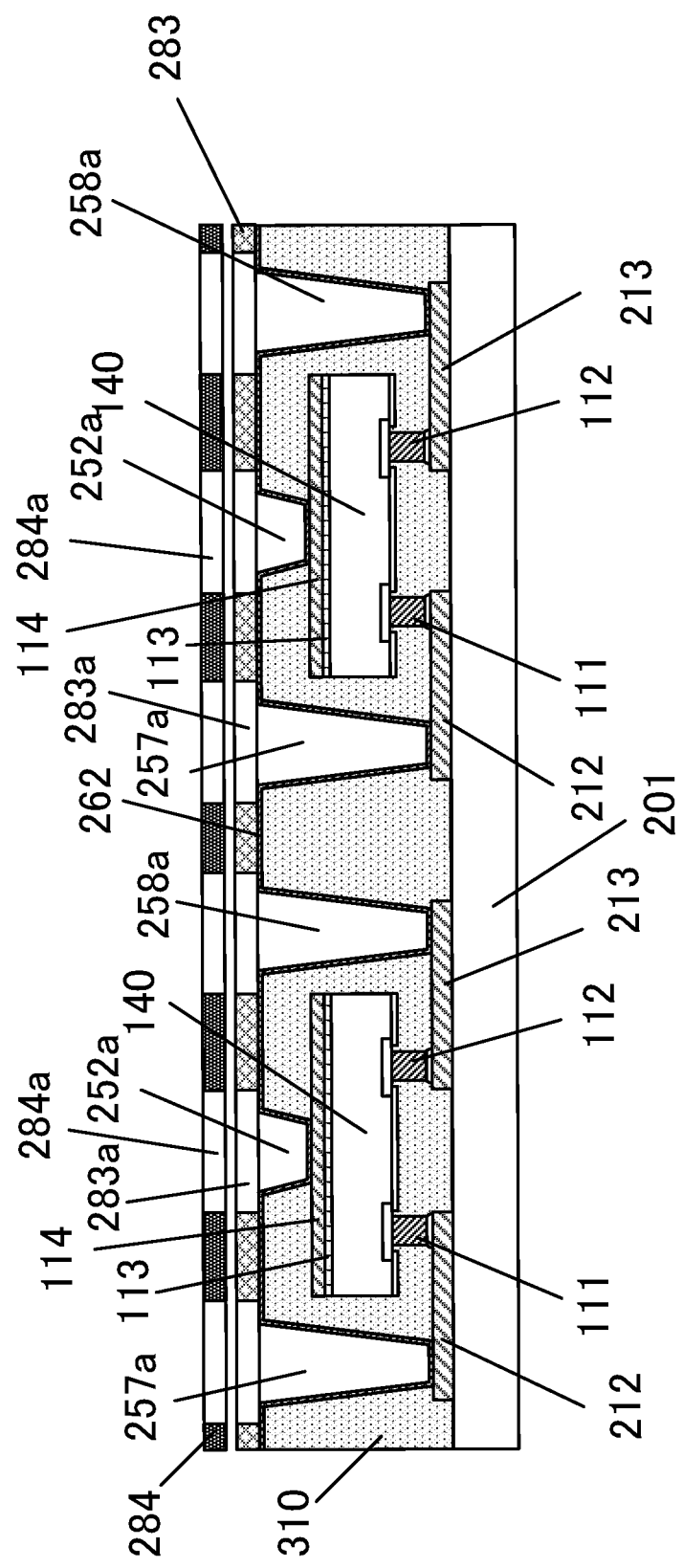
FIG. 33 is a cross-sectional view showing a step that follows the step shown in FIG. 32.

Then, as shown in FIG. 33, a photomask 284 is arranged on the photoresist 283, and exposure is performed by the exposure apparatus. The photomask 284 has transparent portions 284a corresponding to the via holes 252a, 257a, 258a and the peripheral edge thereof so that portions 283a of the positive photoresist 283 corresponding to the transparent portions 284a of the photomask 284 are exposed. Then, the photomask 284 is removed. Then, the photoresist 283 is developed to open the exposed portions 283a of the photoresist 283.

Figure 34:
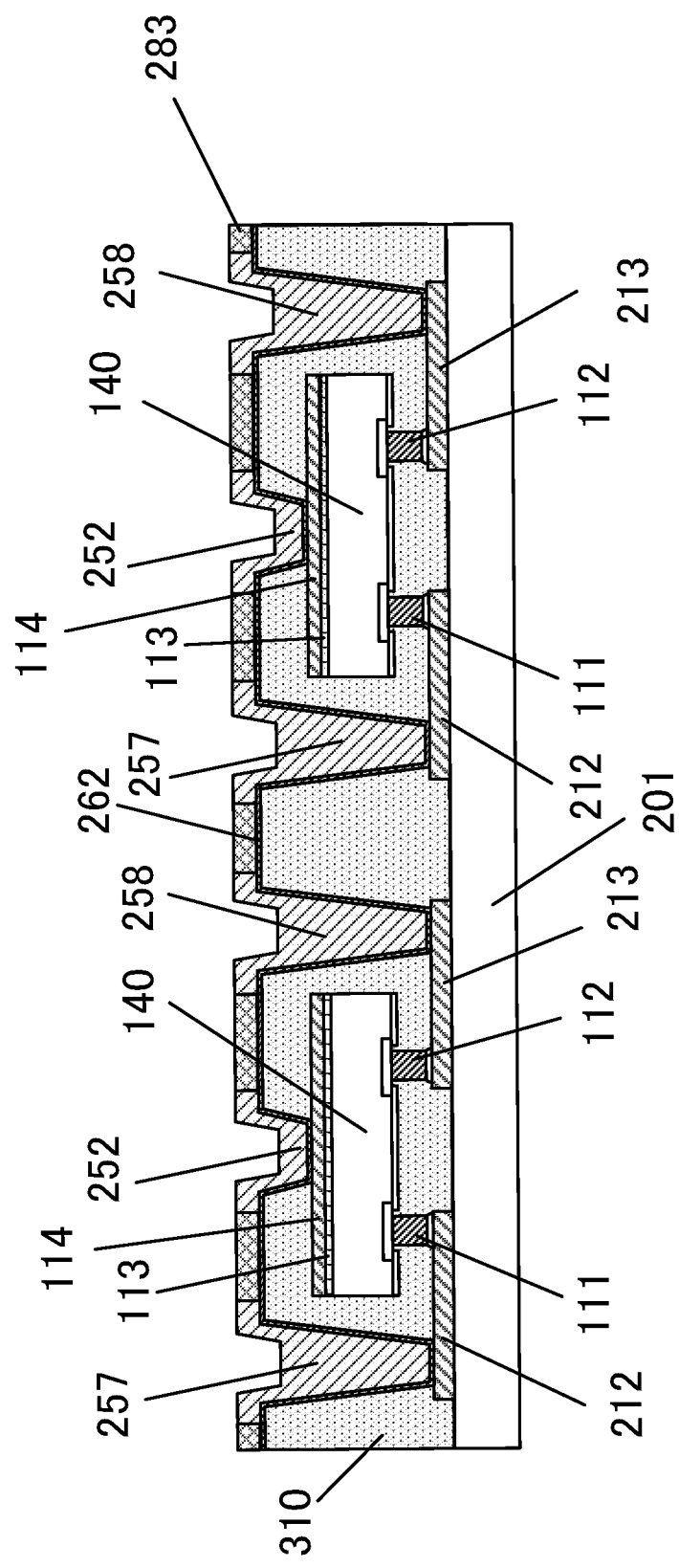
FIG. 34 is a cross-sectional view showing a step that follows the step shown in FIG. 33.
Figure 35:
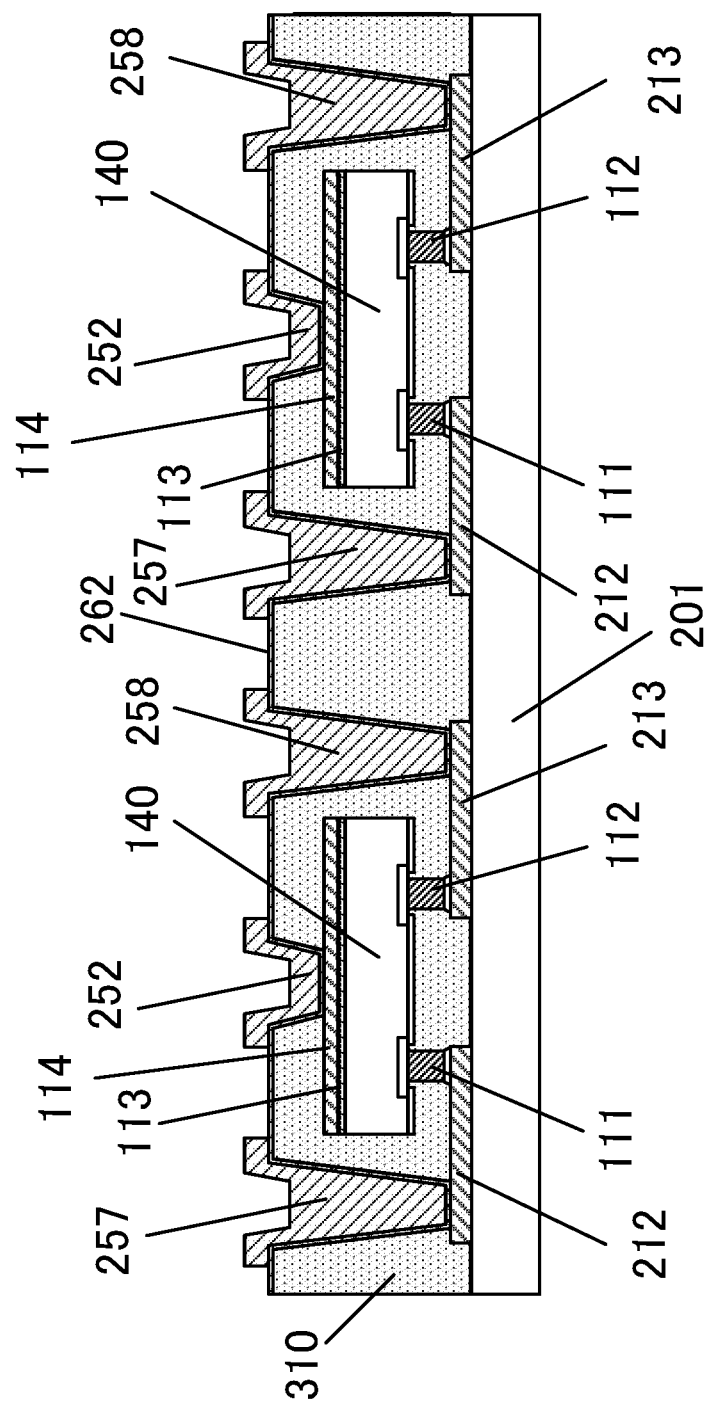
FIG. 35 is a cross-sectional view showing a step that follows the step shown in FIG. 34.

Next, as shown in FIG. 34, electrolytic plating is performed using the base metal 262 as a current path, and the via holes 252a, 257a and 258a are filled with conductive metal to form the vias 252, 257 and 258. The electrolytic plating is performed using, for example, copper-based metal plating solution.

Figure 36:
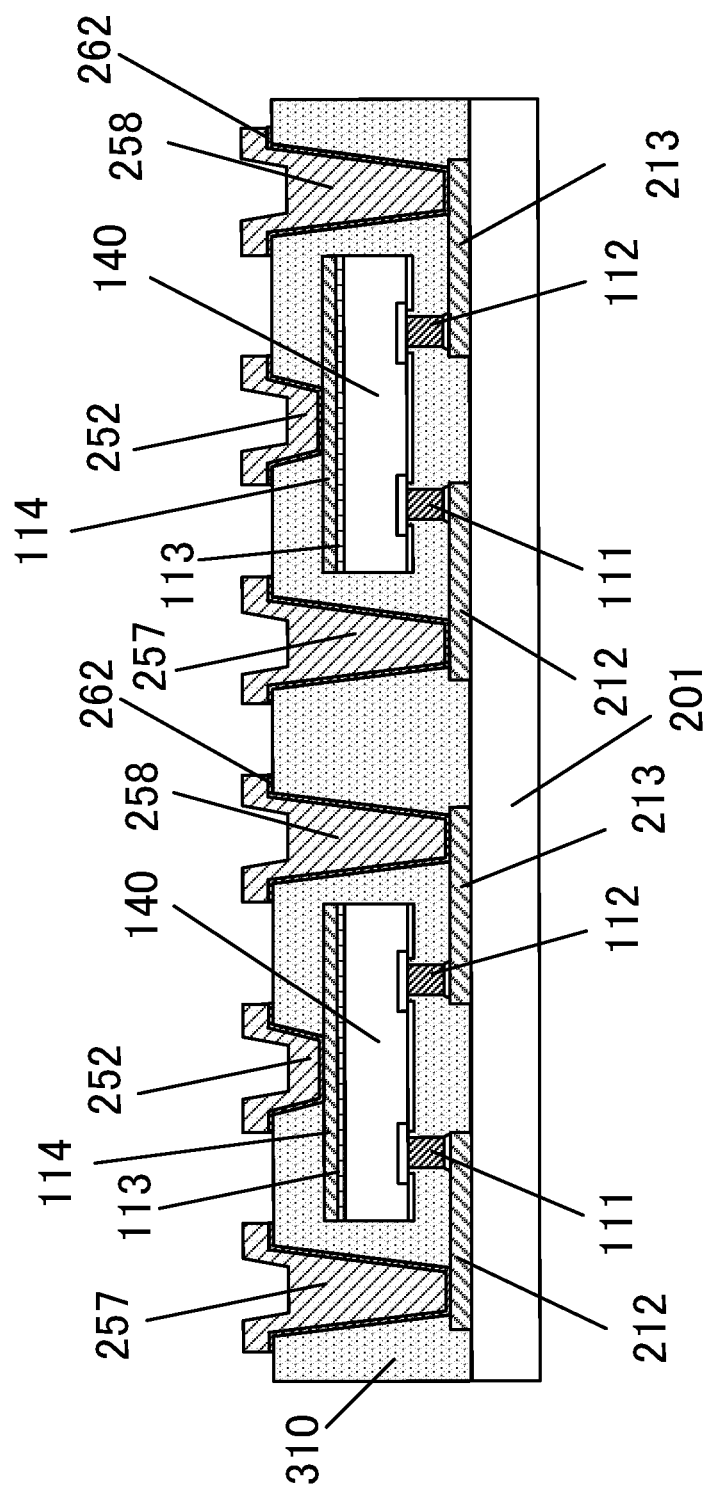
FIG. 36 is a cross-sectional view showing a step that follows the step shown in FIG. 35.

Then, the photoresist 283 is removed (see FIG. 35), and subsequently, the base metal 262 exposed from the vias 252, 257, 258 is removed by etching. Thereby, an intermediate body shown in FIG. 36 is obtained.

Figure 37:
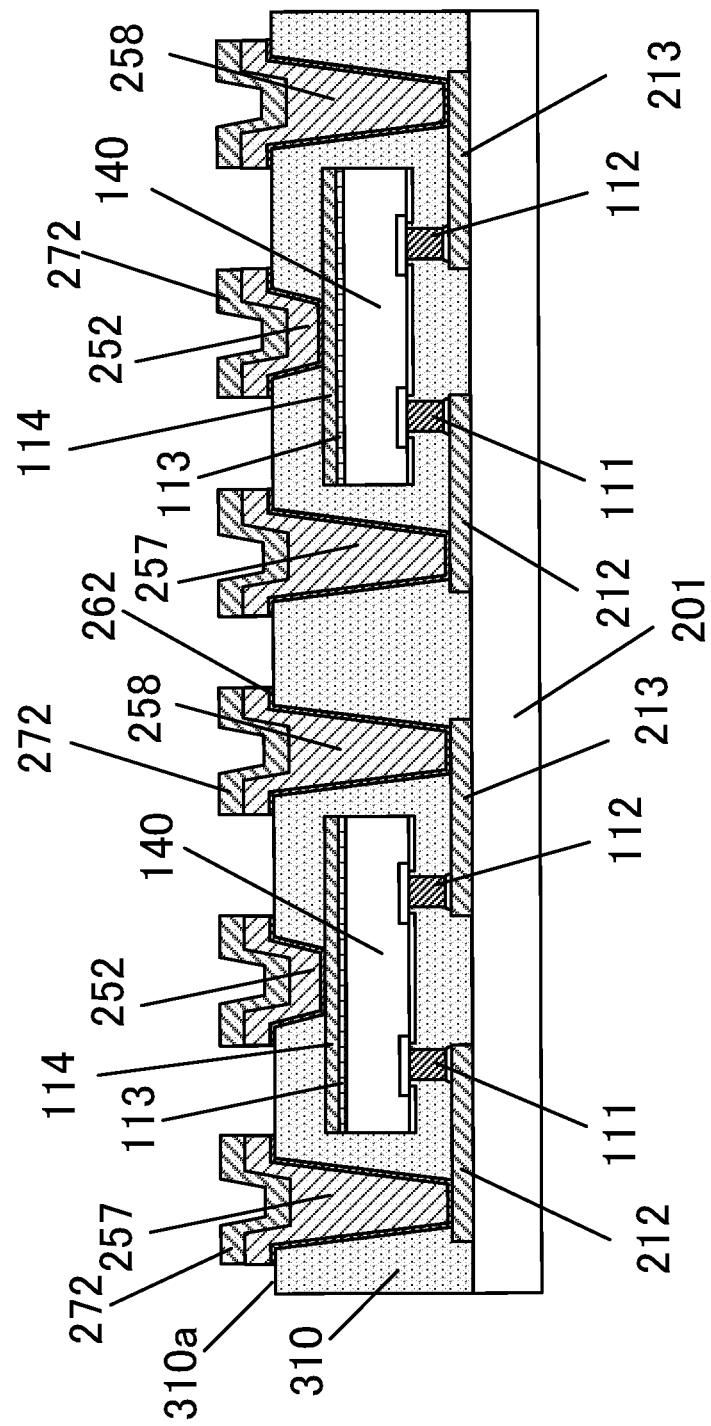
FIG. 37 is a cross-sectional view showing a step that follows the step shown in FIG. 36.

Next, as illustrated in FIG. 37, the joining material 272 is formed on the upper surfaces of the vias 252, 257, 258 exposed from the upper surface 310a of the sealing resin 310. To form the joining material 272, for example, solder cream, metal paste for sintering, or the like is formed on each of the vias 252, 257, and 258 by printing, and in this state, the reflow processing is performed to melt the joining material 272, and then cool the joining material 272 to solidify. Thereby, the two semiconductor devices 100 are formed adjacent to each other on the base material 201.

Figure 38:
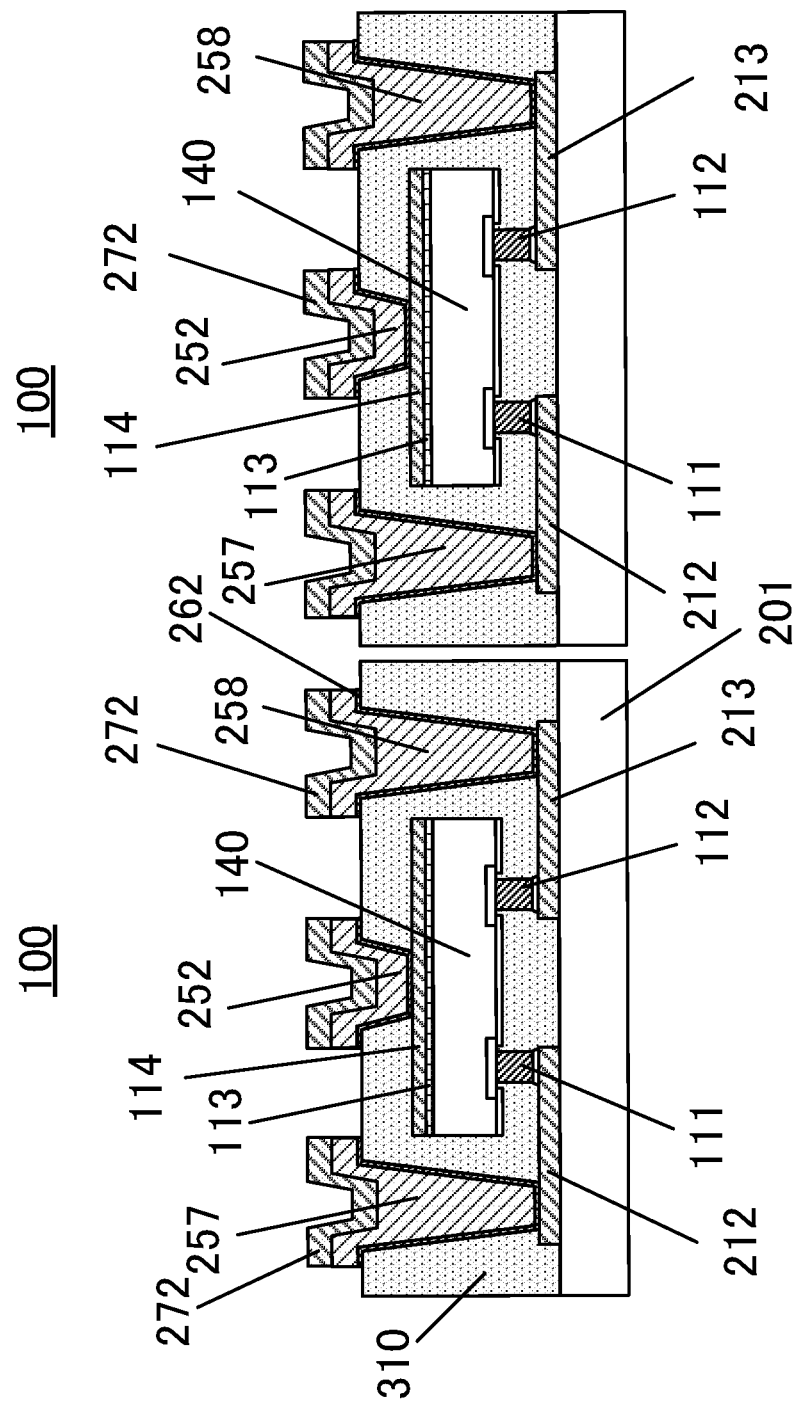
FIG. 38 is a cross-sectional view showing a step that follows the step shown in FIG. 37.

Then, as shown in FIG. 38, the sealing resin 310 and the base material 201 of the two semiconductor devices 100 arranged adjacent to each other are diced at the boundary portion of these devices. As a result, the semiconductor device 100 shown in FIG. 26 is obtained.

Also in the second embodiment, the semiconductor device 100 comprises: the semiconductor element 140 having the electrode 111 on the main surface side and the electrode 113 on the back surface side; the base material 201 provided with the connection conductor 212 connected to the electrode 111; the sealing resin 310 provided on the base material 201 to seal the semiconductor element 140; and the via 252 provided in the sealing resin 310 and electrically connected to the electrode 113 of the semiconductor element 140.

Further, also in the second embodiment, the semiconductor device 100 includes the back surface conductor 114 laminated on the electrode 113 of the semiconductor element 140. Therefore, also in the second embodiment, the same advantageous effect as the advantageous effect (2) of the first embodiment is obtained.

In the second embodiment, the sealing resin 310 is further provided with the via 257 connected to the connection conductor 210. Since the connection conductor 210 provided on the base material 201 is routed to the upper surface 310a side of the sealing resin 310 via the via 257 provided in the sealing resin 310, the routing of the connection conductor 210 formed on the substrate 201 is simplified. Therefore, also in the second embodiment, the same advantageous effects as the advantageous effects (3) and (4) of the first embodiment are obtained.

Third Embodiment

Figure 39:
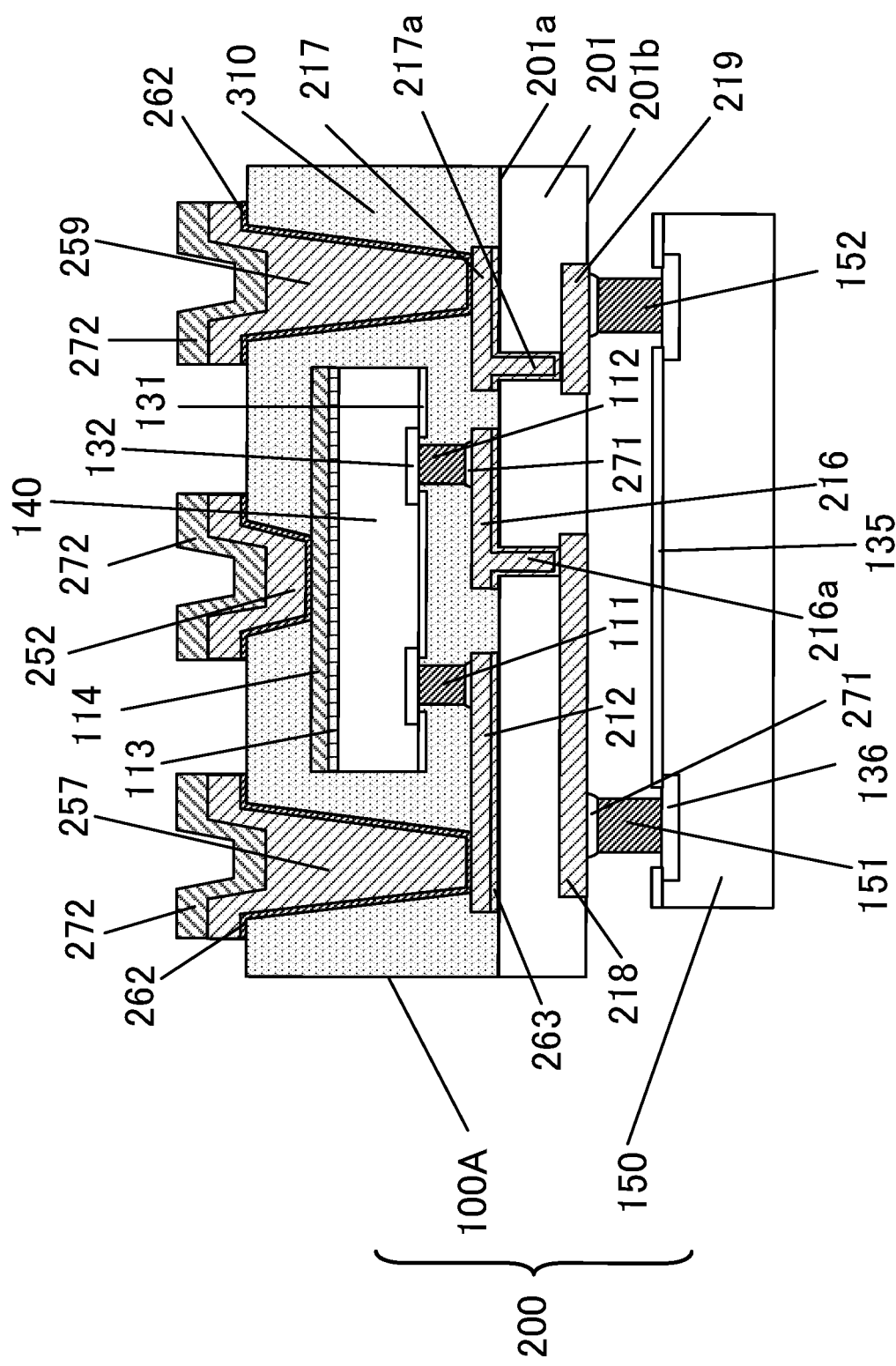
FIG. 39 is a sectional view of a semiconductor device according to a third embodiment of the present invention.

FIG. 39 is a sectional view of a semiconductor device according to the third embodiment of the present invention.

A semiconductor device 200 of the third embodiment includes a semiconductor device 100A and a semiconductor element 150.

The semiconductor device 100A includes a semiconductor element 140, vias 252, 257, 259, a base material 201 on which front surface side connection conductors 212, 216, 217 and back surface side connection conductors 218, 219 are formed, a sealing resin 310, and a joining material 272.

The base material 201 in the semiconductor device 100A is a double-sided wiring board on which the front surface side connection conductors 212, 216, 217 and the back surface side connection conductors 218, 219 are formed. The electrode 112 of the semiconductor element 140 in the semiconductor device 100A is connected to the connection conductor 216, and the via 259 formed in the sealing resin is connected to the connection conductor 217. Except for the above matters, the semiconductor device 100A is almost the same as the semiconductor device 100 of the second embodiment.

The semiconductor element 150 is connected to the back surface side connection conductors 218 and 219 formed on the base material 201.

Hereinafter, the configuration of the semiconductor device 200 will be described in more detail.

The structure of the semiconductor element 140 has an insulating film 131, connection pads 132, pillar-shaped electrodes 111 and 112, a back surface side electrode 113, and a back surface conductor 114, similarly to the structure shown in FIG. 26.

On the base material 201, the connection conductors 212, 216, 217 are formed on an upper surface 201a side, and the back surface side connection conductors 218, 219 are formed on a lower surface 201b side. The connection conductor 216 is connected to the back surface side connection conductor 218 via a via 216a. The connection conductor 217 is connected to the back surface side connection conductor 219 via a via 217a.

The semiconductor element 150 has an insulating film 135 on the side facing the base material 201 and connection pads 136 exposed from openings provided in the insulating film 135. Pillar-shaped electrodes 151 and 152 joined to the connection pads 136 are provided on the main surface side of the semiconductor element 150. The electrode 151 is connected to the back surface side connection conductor 218 by a joining material 271. The electrode 152 is connected to the back surface side connection conductor 219 by the joining material 271.

The electrode 111 of the semiconductor element 140 is joined to the connection conductor 212 with the joining material 271. The via 257 is connected to the connection conductor 212. Therefore, the via 257 is connected to the electrode 111 of the semiconductor element 140 via the connection conductor 212.

The electrode 112 of the semiconductor element 140 is joined to the connection conductor 216 by the joining material 271. The via 216a is joined to the back surface side connection conductor 218. Therefore, the electrode 112 of the semiconductor element 140 is connected to the electrode 151 of the semiconductor element 150 via the connection conductor 216, the via 216 a, and the back surface side connection conductor 218.

The via 259 is connected to the connection conductor 217. The via 217a is joined to the back surface side connection conductor 219. Therefore, the via 259 is connected to the electrode 152 of the semiconductor element 150 via the connection conductor 217, the via 217a, and the back surface side connection conductor 219.

It is to be noted that, the semiconductor device 100A includes: a base metal 262 that serves as a current path when the vias 252, 257, and 259 are formed by electrolytic plating; and a base metal 263 that serves as a current path when forming the connection conductors 212, 216, and 217 by electrolytic plating.

Next, a manufacturing method of the semiconductor device 200 shown in FIG. 39 will be described.

FIGS. 40 to 66 are cross-sectional views showing the steps in manufacturing the semiconductor device 100A in the order of steps.

In the following description, a method of simultaneously manufacturing two semiconductor devices 200 each having the semiconductor device 100A and the semiconductor element 150 will be exemplified. Because the manufacturing method of the third embodiment also includes a manufacturing method similar to that of the first embodiment, description of the manufacturing method similar to that of the first embodiment will be omitted as appropriate.

Figure 40:
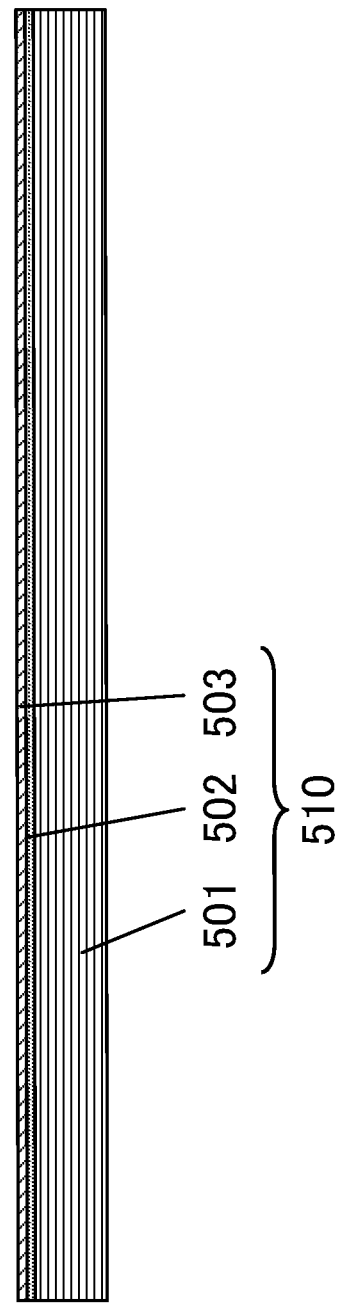
FIG. 40 is a diagram for explaining a manufacturing method of the semiconductor device shown in FIG. 39, showing a first step in a cross-sectional view.

First, a supporting base material 510 having an area sufficient to manufacture two semiconductor devices 100A each having the semiconductor element 140 is prepared. As shown in FIG. 40, the supporting base material 510 includes a base layer 501 made of a flat plate member such as glass, a release layer 502 formed on the base layer 501, and a conductive thin film 503 formed on the release layer 502 by a copper-based metal or the like. The conductive thin film 503 has a thickness of, for example, about 1 to 12 μm.

Figure 41:
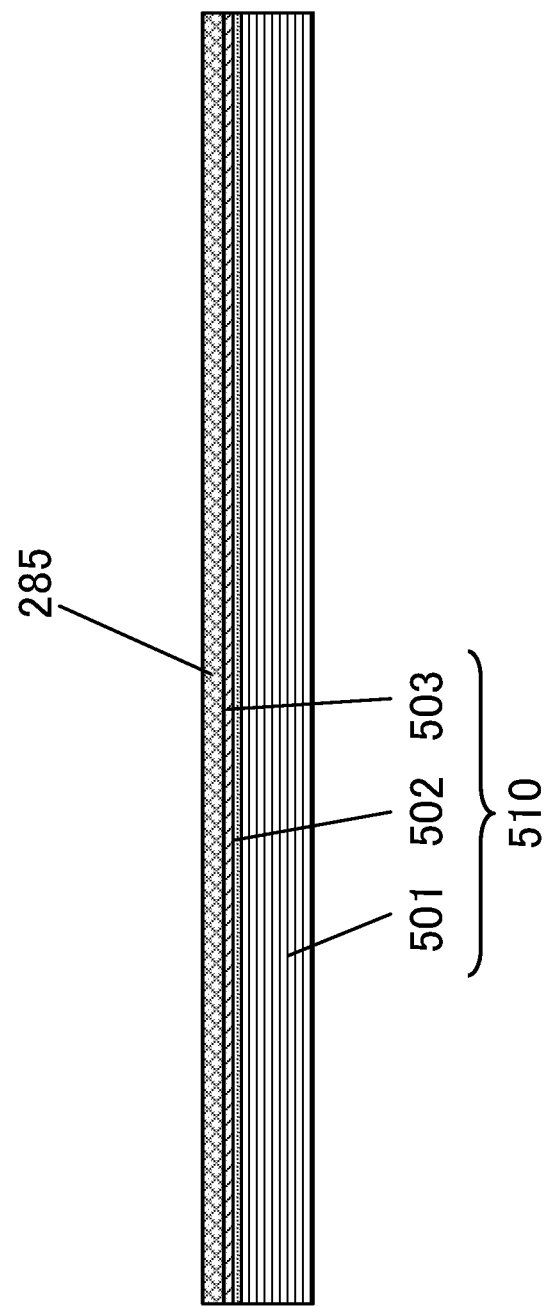
FIG. 41 is a cross-sectional view showing a step that follows the step shown in FIG. 40.

Next, as shown in FIG. 41, a photoresist 285 is formed on the conductive thin film 503 of the supporting base material 510. The photoresist 285 is formed by laminating a dry film type photosensitive resist film with a laminator. The photoresist 285 may be a positive type or a negative type. In the present embodiment, the photoresist of a positive type will be exemplified.

Figure 42:
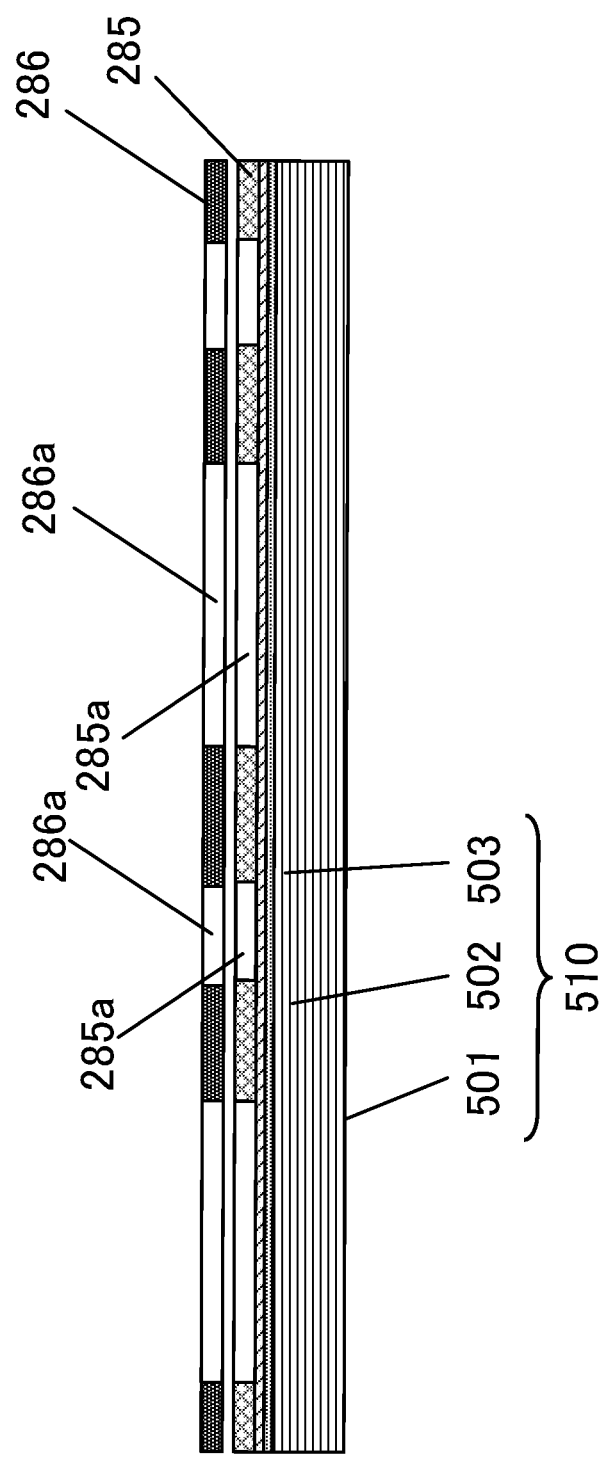
FIG. 42 is a cross-sectional view showing a step that follows the step shown in FIG. 41.

Then, as shown in FIG. 42, a photomask 286 is arranged on the photoresist 285, and exposure is performed by an exposure device. The photomask 286 has pattern-shaped transparent portions 286a corresponding to the connection conductors 218 and 219, and by exposure, the positive photoresist 285 is exposed at portions 285a corresponding to the transparent portions 286a of the photomask 286. Then, the photomask 286 is removed.

Then, the photoresist 285 is developed to open the exposed portions 285a of the photoresist 281.

Figure 43:
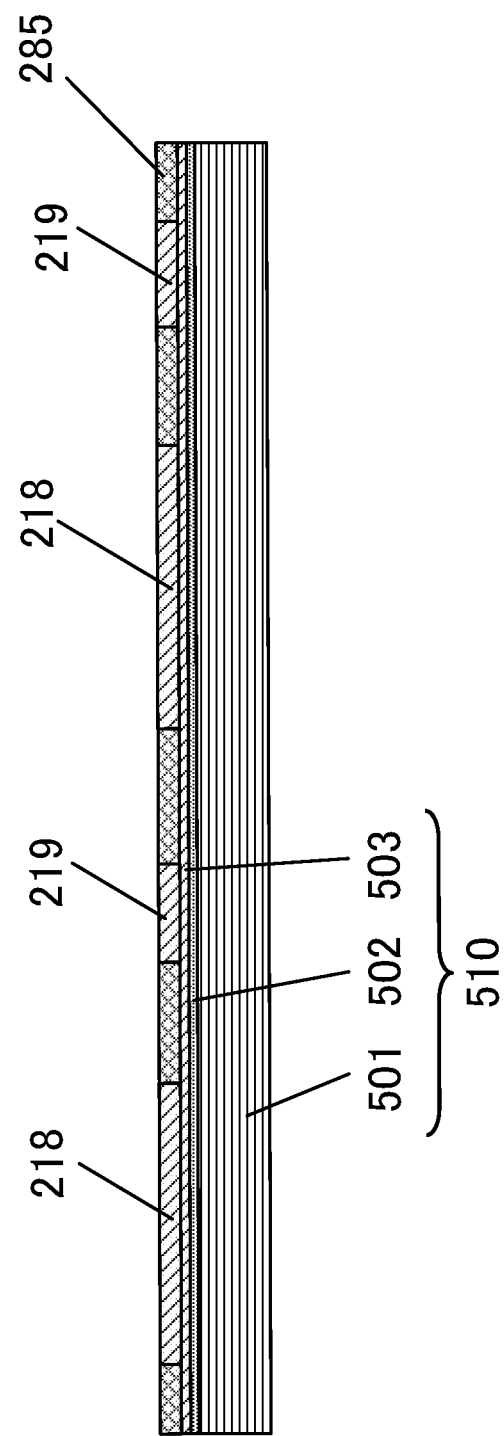
FIG. 43 is a cross-sectional view showing a step that follows the step shown in FIG. 42.

Next, as shown in FIG. 43, electrolytic plating is performed using the conductive thin film 503 of the supporting base material 510 as a current path to form the connection conductors 218 and 219 on the conductive thin film 503. The electrolytic plating is performed using, for example, copper-based metal plating solution.

Figure 44:
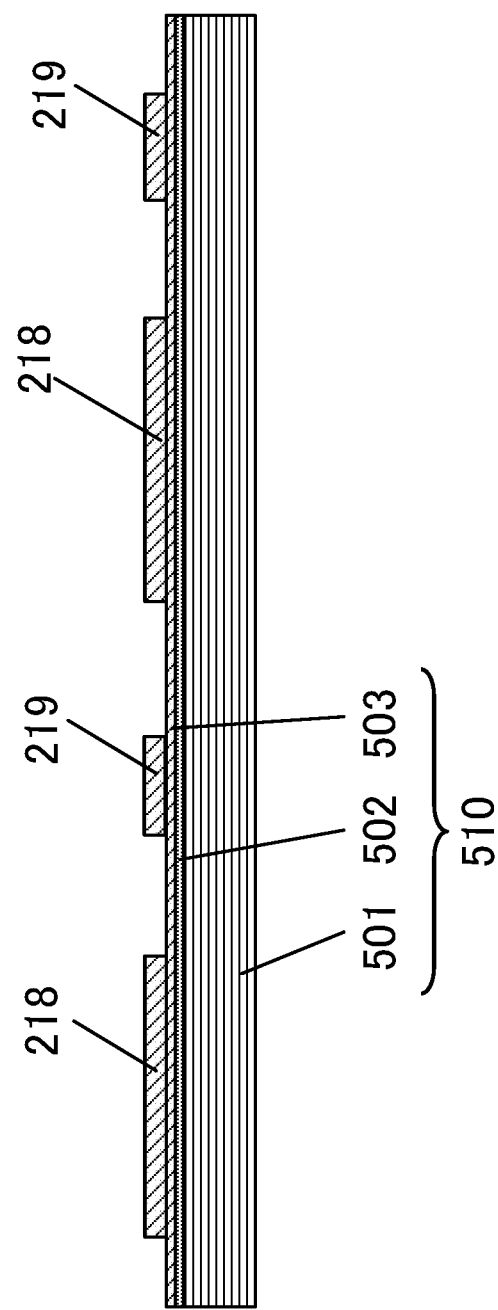
FIG. 44 is a cross-sectional view showing a step that follows the step shown in FIG. 43.

Then, as shown in FIG. 44, the photoresist 285 is removed.

Figure 45:
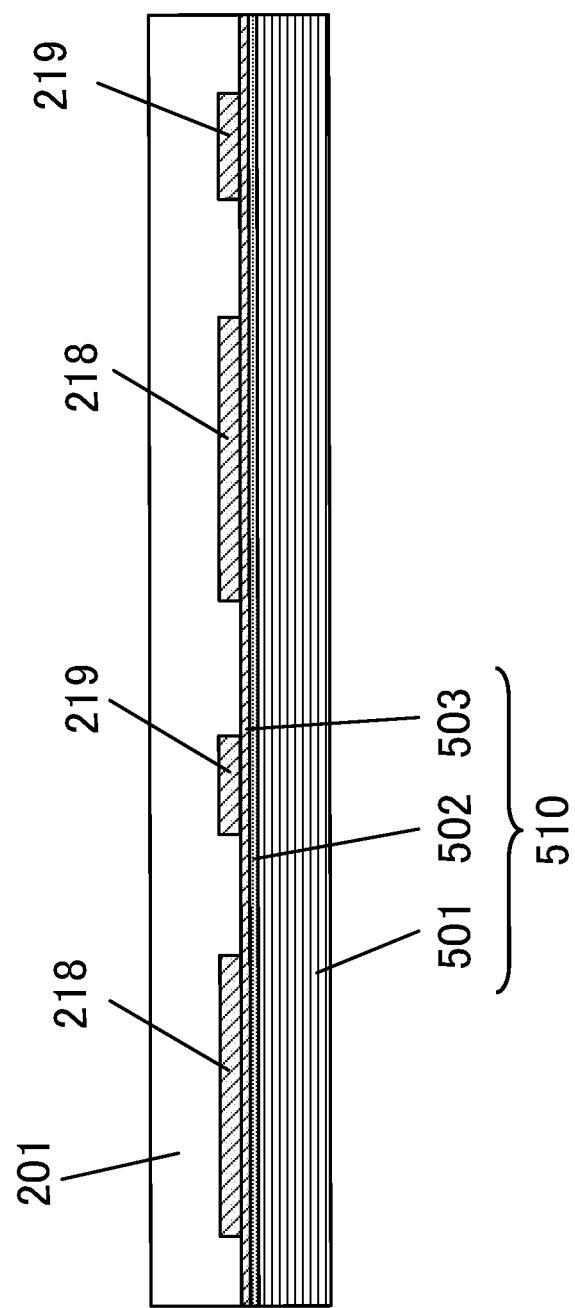
FIG. 45 is a cross-sectional view showing a step that follows the step shown in FIG. 44.

Next, as shown in FIG. 45, the base material 201 made of insulating material is formed on the conductive thin film 503 and the connection conductors 218 and 219. The base material 201 is formed, for example, by laminating an insulating film made of build-up substrate material containing epoxy material as a main component with a laminator.

Figure 46:
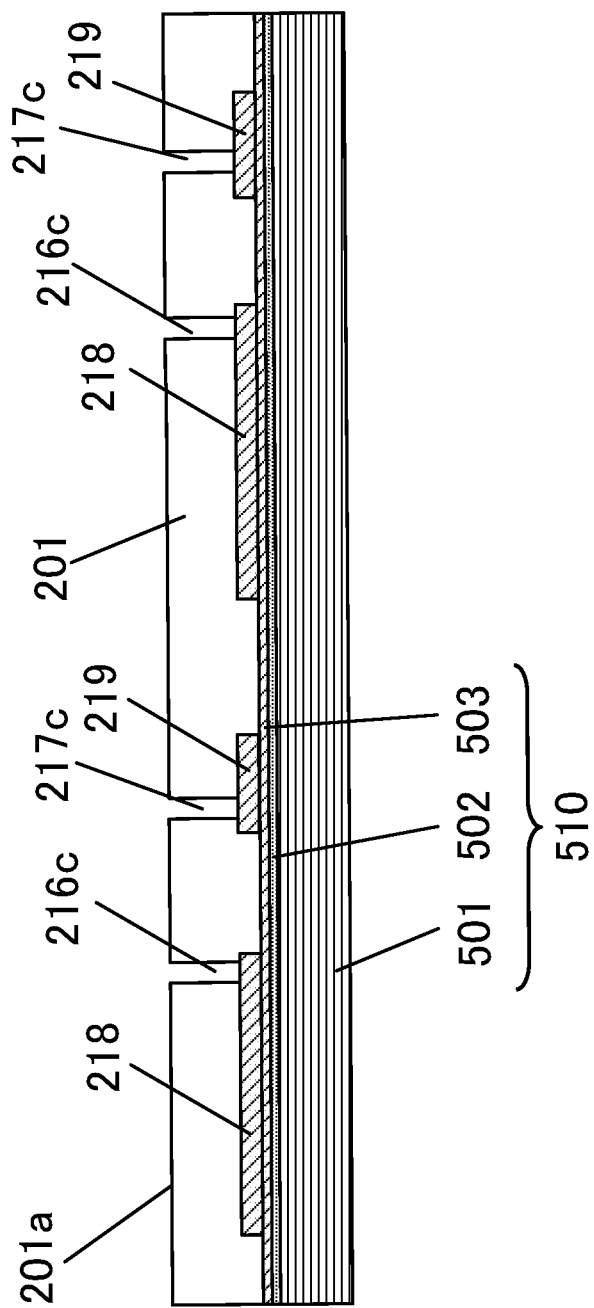
FIG. 46 is a cross-sectional view showing a step that follows the step shown in FIG. 45.

Next, as shown in FIG. 46, the via holes 216c and 217c penetrating the base material 201 are formed in the base material 201. The via holes 216c and 217c are preferably formed by using a laser drill device. After forming the via holes 216c and 217c, a desmear treatment is performed to remove the residual film of the via holes 216c and 217c. As the desmear treatment, plasma desmear treatment is preferred.

Figure 47:
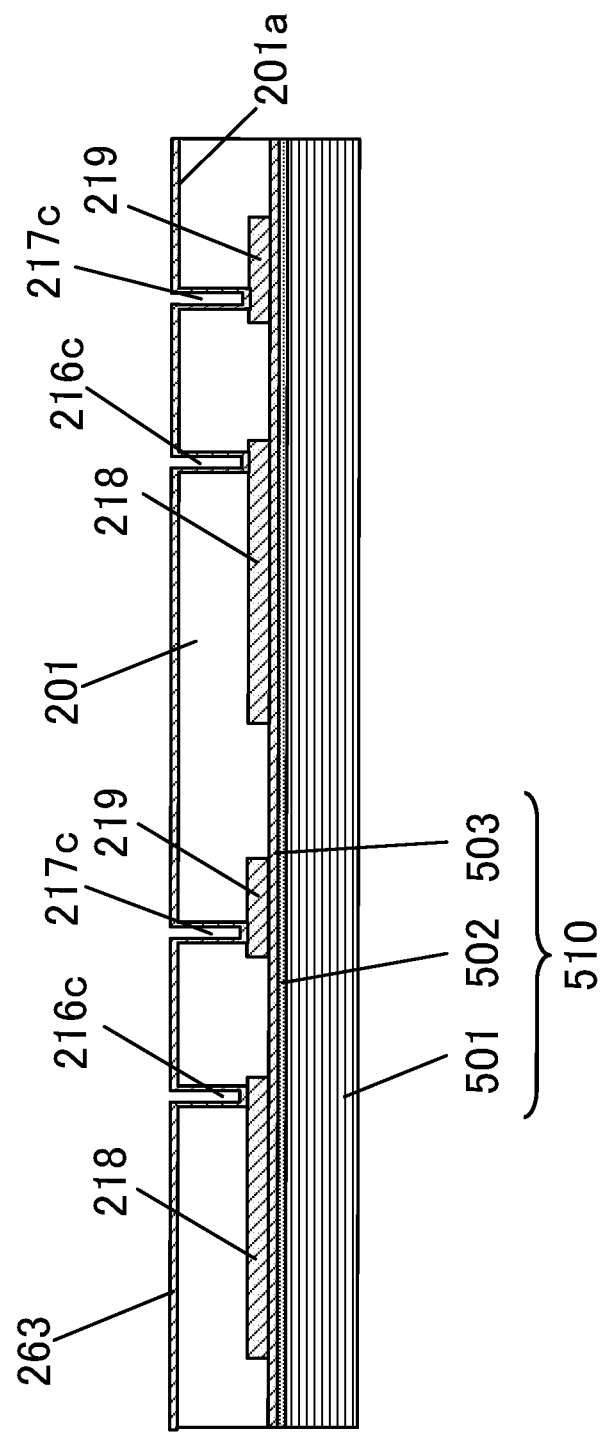
FIG. 47 is a cross-sectional view showing a step that follows the step shown in FIG. 46.

Next, as shown in FIG. 47, the base metal 263 is formed on the entire upper surface 201a of the base 201 and the entire inner surfaces of the via holes 216c and 217c. The base metal 263 is obtained by performing electroless plating with copper-based metal so as to have a thickness of 0.1 to 1.0 for example.

Figure 48:
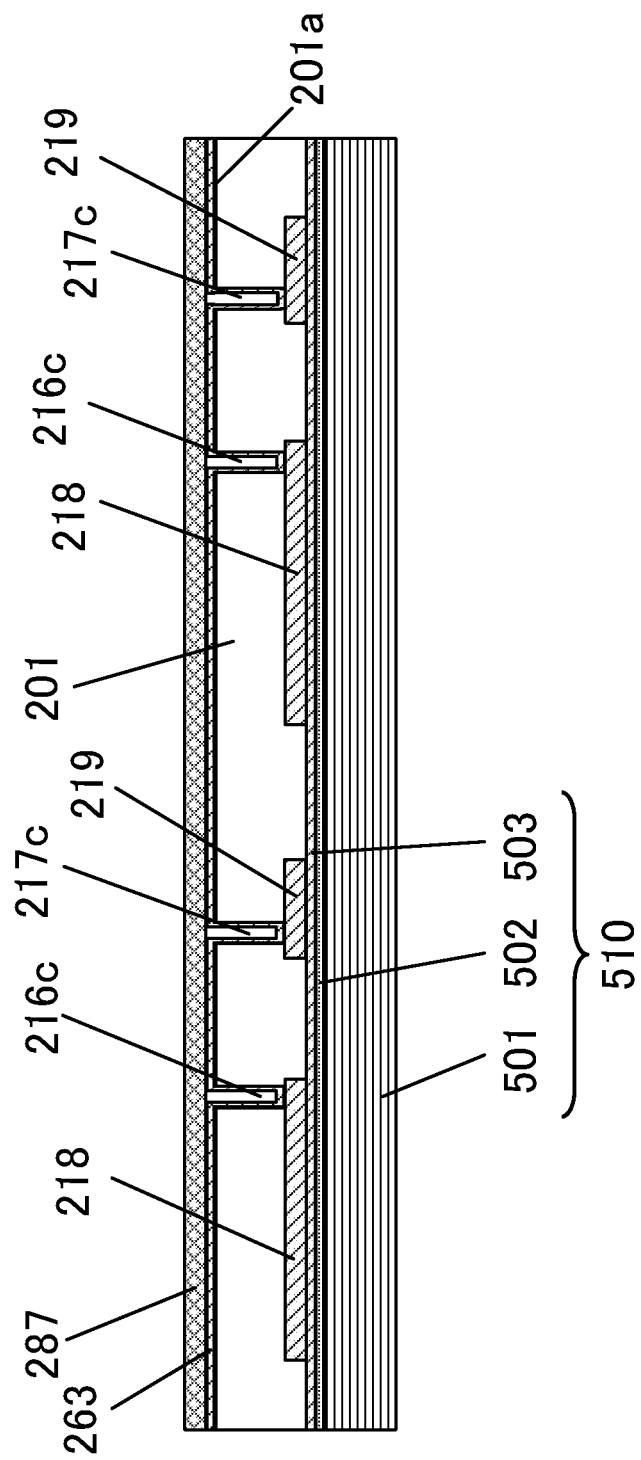
FIG. 48 is a cross-sectional view showing a step that follows the step shown in FIG. 47.

Next, as shown in FIG. 48, a photoresist 287 is formed on the entire surface of the base metal 263. The photoresist 287 is formed by laminating a dry film type photosensitive resist film with a laminator. The photoresist 287 may be a positive type or a negative type. In the present embodiment, the photoresist of a positive type will be exemplified.

Figure 49:
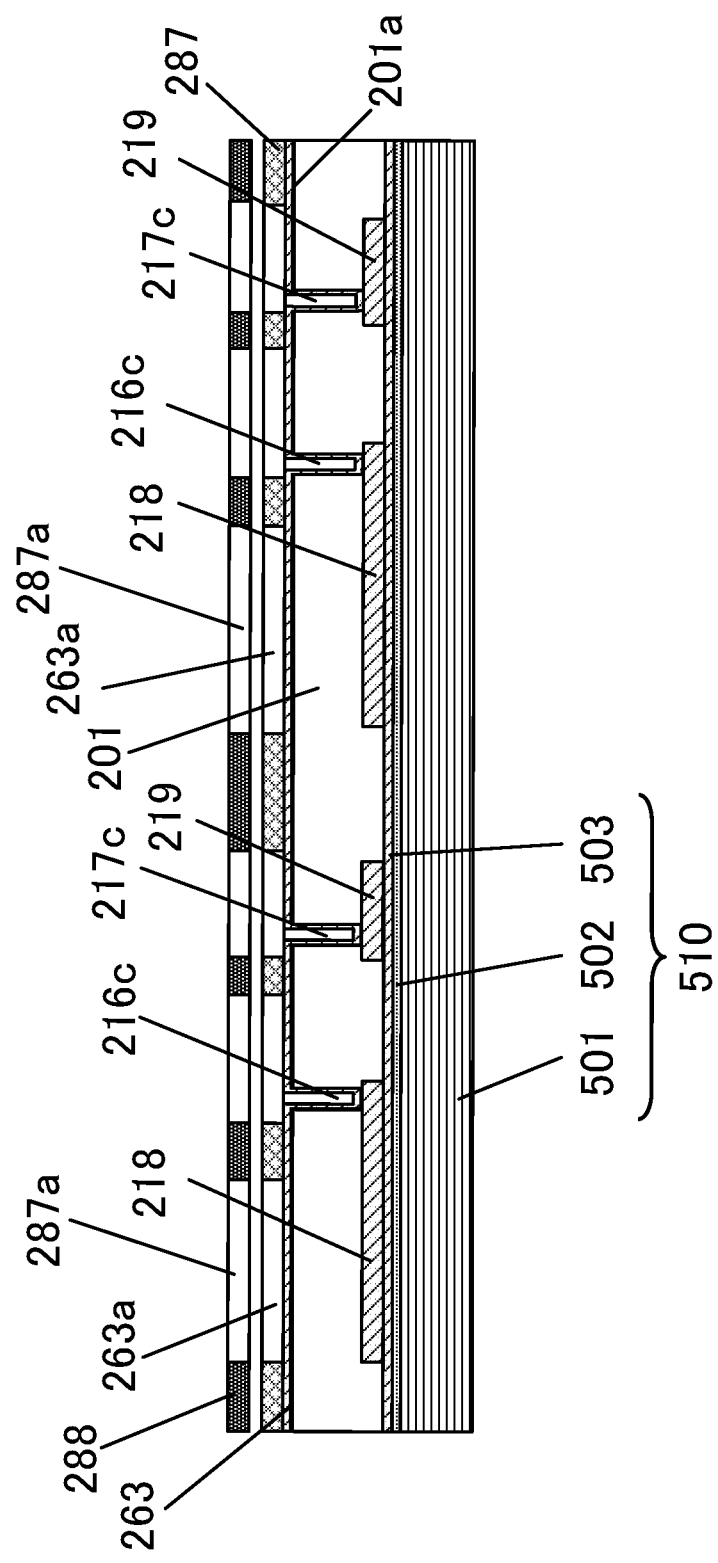
FIG. 49 is a cross-sectional view showing a step that follows the step shown in FIG. 48.

Then, as shown in FIG. 49, a photomask 288 is arranged on the photoresist 287 and exposure is performed by an exposure device. The photomask 288 has transparent portions 288a corresponding to the connection conductors 212, 216, and 217 so that portions 287a of the positive photoresist 287 corresponding to the transparent portions 288a of the photomask 288 are exposed. Then, the photomask 288 is removed. Then, the photoresist 287 is developed to open the exposed portions 287a of the photoresist 287.

Figure 50:
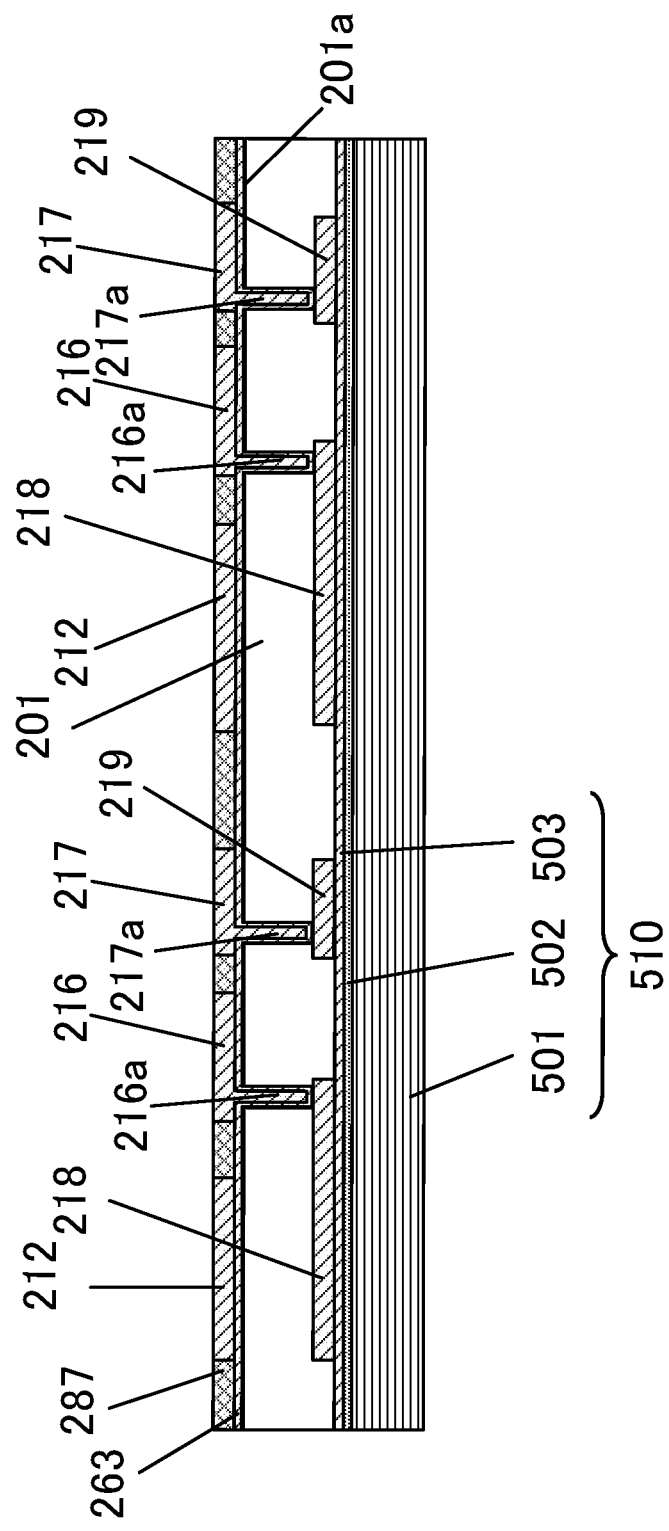
FIG. 50 is a cross-sectional view showing a step that follows the step shown in FIG. 49.
Figure 51:
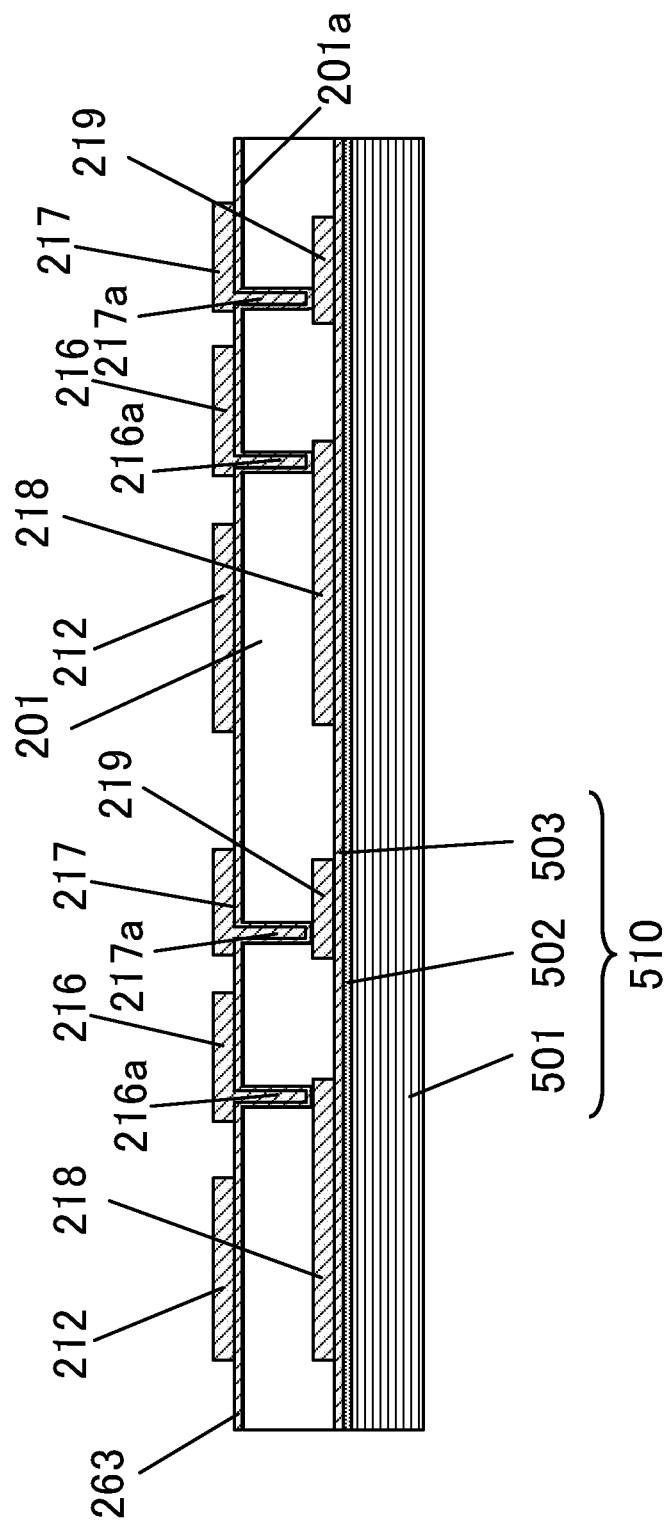
FIG. 51 is a cross-sectional view showing a step that follows the step shown in FIG. 50.

Next, as shown in FIG. 50, electrolytic plating using the base metal 263 as a current path is performed to fill the via holes 216c and 217c with conductive metal to form the vias 216a and 217a, and the openings of the photoresist 287 are filled with conductive metal to form the connection conductors 212, 216, 217. The electrolytic plating is performed using, for example, copper-based metal plating solution.

Figure 52:
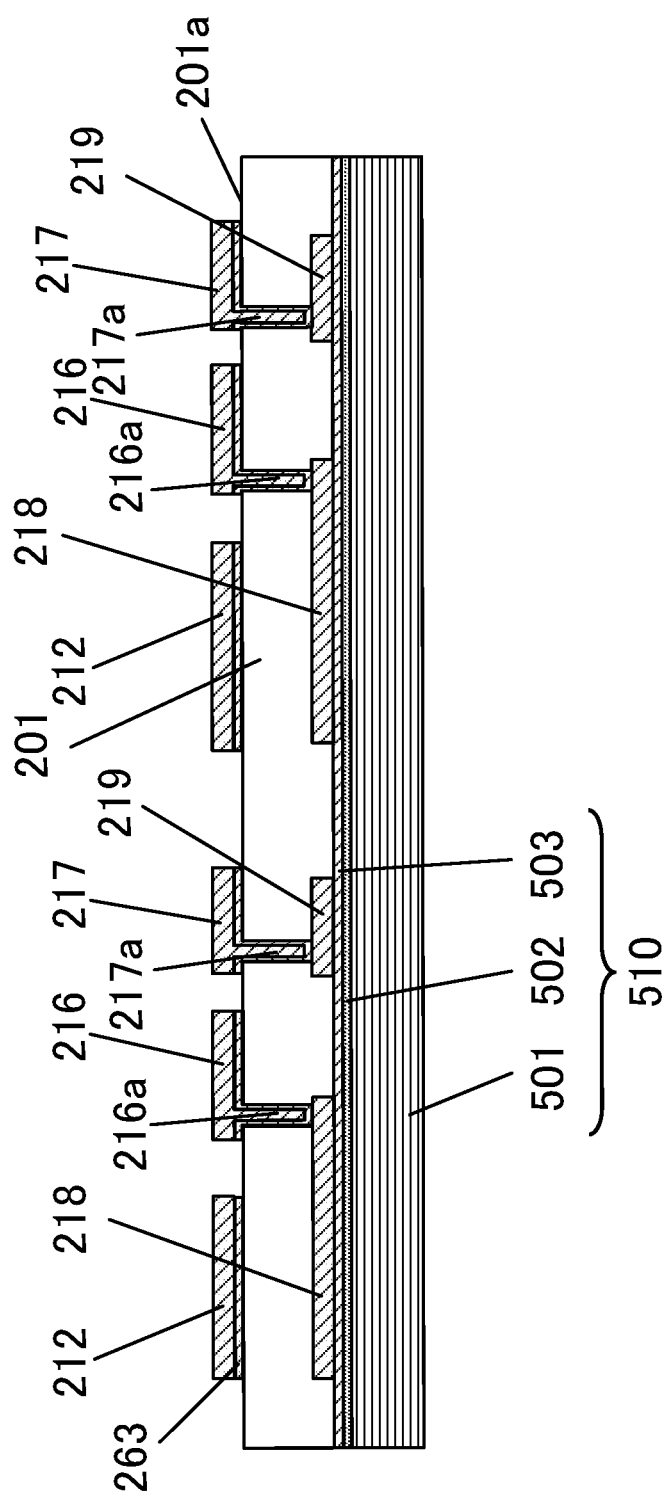
FIG. 52 is a cross-sectional view showing a step that follows the step shown in FIG. 51.

Then, the photoresist 287 is removed (see FIG. 51), and subsequently, the base metal 263 exposed from the connection conductors 212, 216 and 217 is removed by etching. Thereby, an intermediate body shown in FIG. 52 is obtained.

Figure 53:
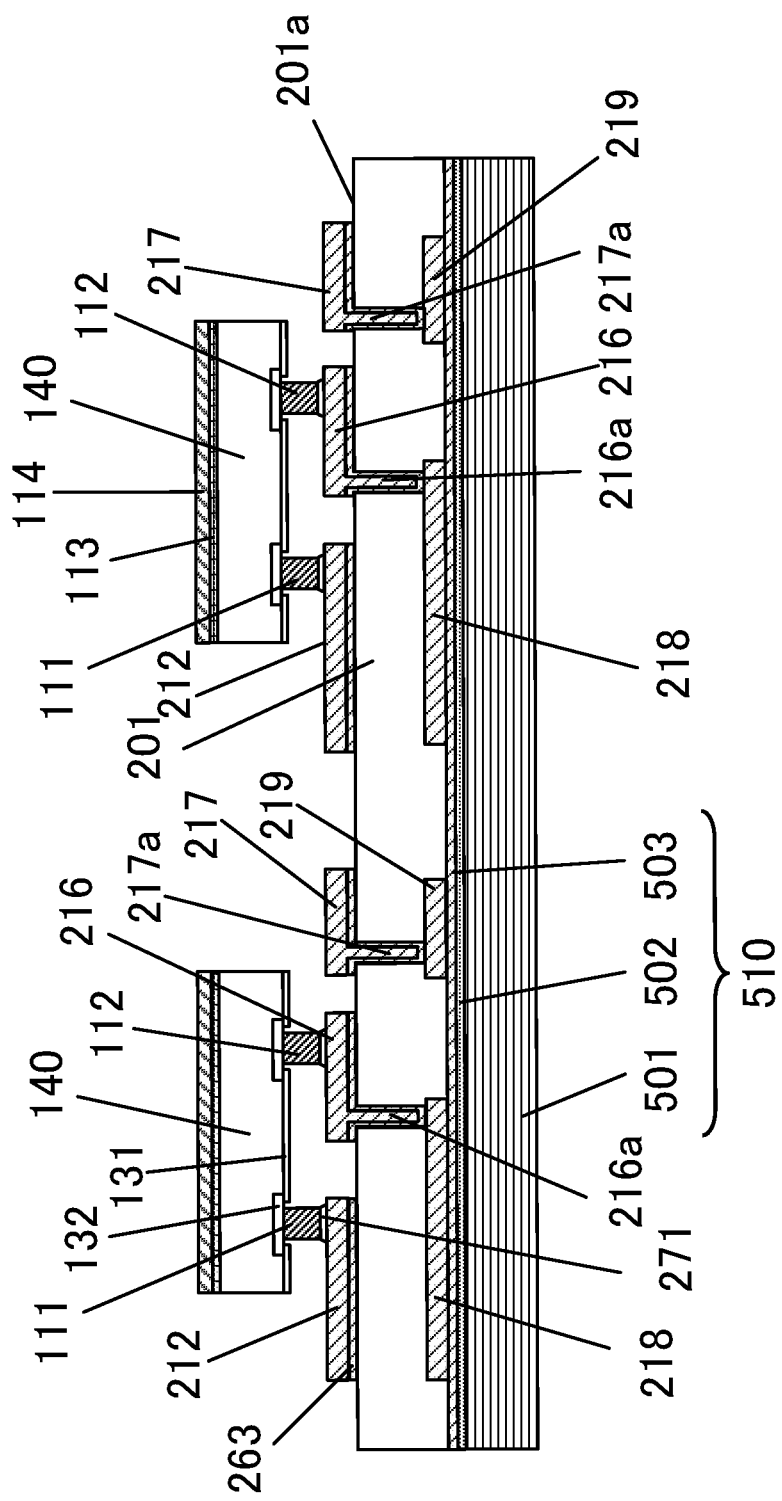
FIG. 53 is a cross-sectional view showing a step that follows the step shown in FIG. 52.

Next, as shown in FIG. 53, the electrodes 111 and 112 of the semiconductor element 140 are bonded to the connection conductors 212 and 216, respectively. It is to be noted that, the back surface conductor 114 is formed in advance on the electrode 113 on the back surface side of the semiconductor element 140.

Before bonding, the joining material 271 such as solder is applied to the lower end surfaces of the electrodes 111 and 112, and flux is applied to the joining portions of the connection conductors 212 and 216 to which the electrodes 111 and 112 are to be joined. Then, the semiconductor elements 140 are picked up one by one with the flip chip bonder, and the electrodes 111 and 112 of each semiconductor element 140 are mounted at predetermined positions of the connection conductors 212 and 216. In this state, the intermediate body of the semiconductor device 200 shown in FIG. 53 is carried into the reflow apparatus. By being heated in the reflow apparatus, the joining material 271 is melted and the electrodes 111 and 112 of the semiconductor element 140 are joined to the predetermined joining portions of the corresponding connection conductors 212 and 216, respectively.

Figure 54:
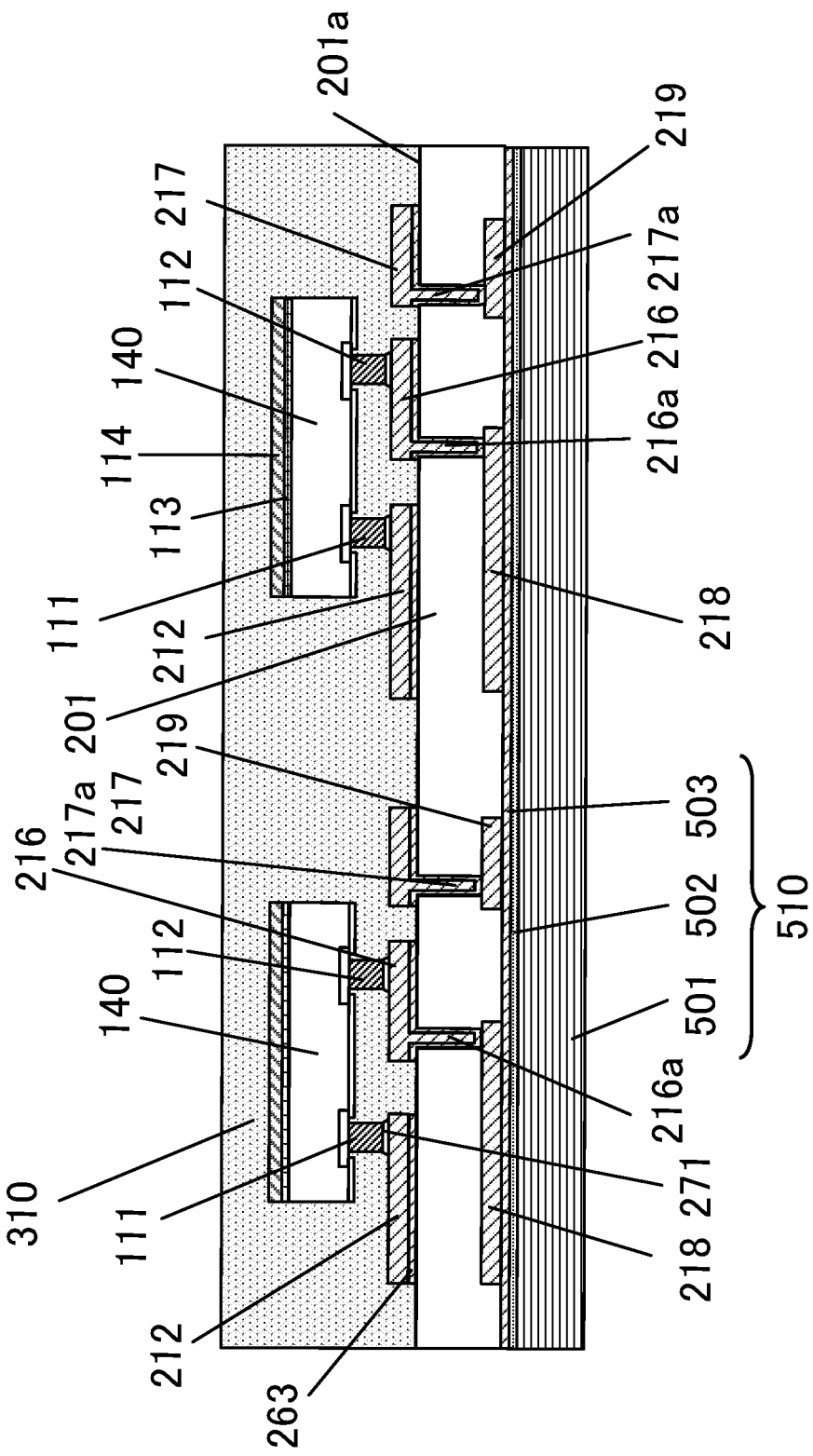
FIG. 54 is a cross-sectional view showing a step that follows the step shown in FIG. 53.

Next, as shown in FIG. 54, the entire upper surface 201a of the base material 201 of the intermediate body shown in FIG. 53 is sealed with the sealing resin 310. The sealing with the sealing resin 310 is performed by a compression molding method using, for example, an epoxy resin. The sealing is performed so as to cover the entire upper surface 201a of the base material 201 and the entire surface of the semiconductor element 140.

Next, the vias 252, 257, and 259 are formed in the sealing resin 310. A method of forming the vias 252, 257, 259 will be described with reference to FIGS. 55 to 60.

Figure 55:
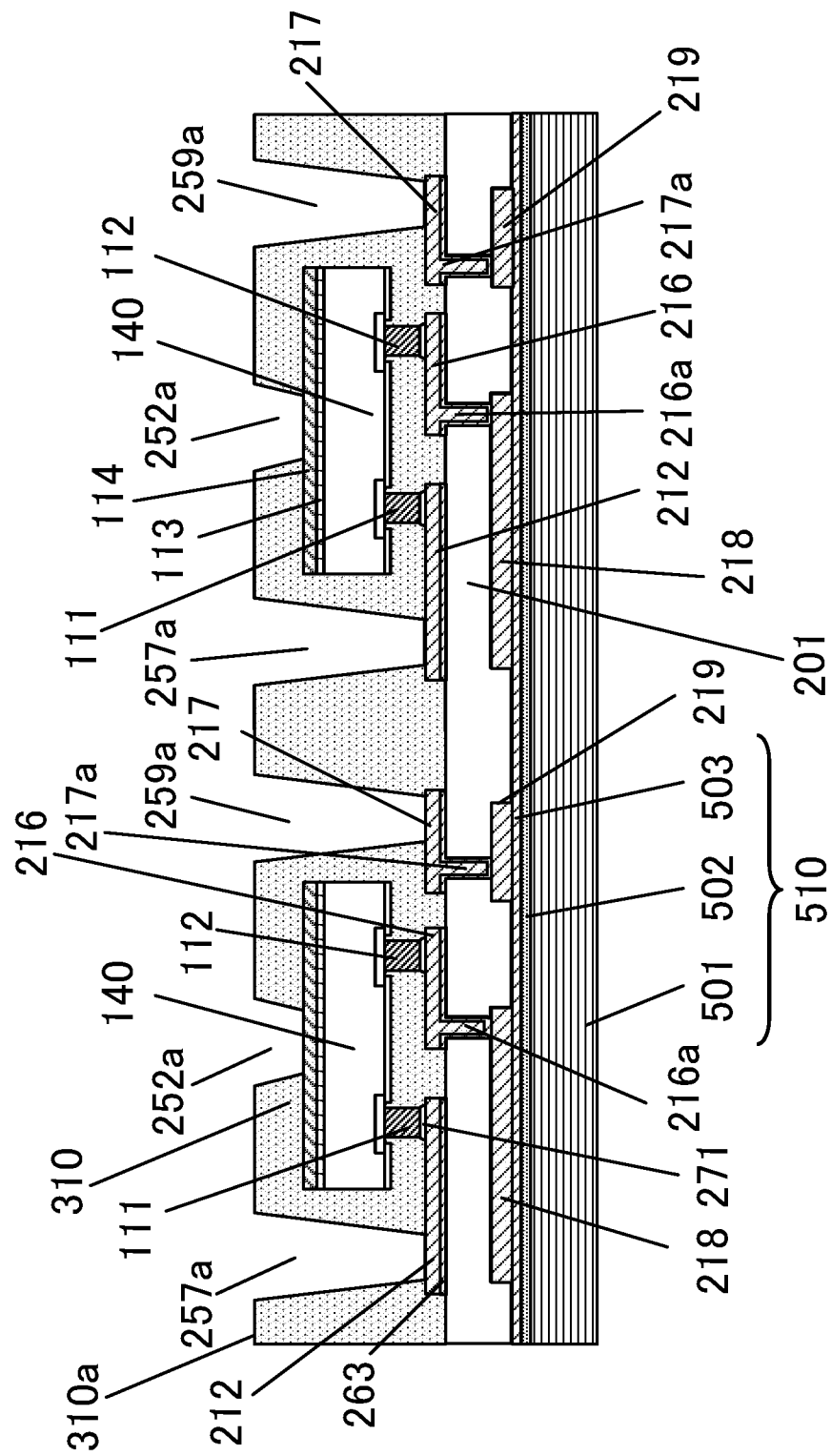
FIG. 55 is a cross-sectional view showing a step that follows the step shown in FIG. 54.

First, as shown in FIG. 55, via holes 252a, 257a, 259a for forming the vias 252, 257, 259 are formed. The via holes 252a, 257a, 259a are preferably formed by using a laser drill apparatus. The via holes 257a and 259a reach the connection conductors 212 and 217 from the upper surface 310a of the sealing resin 310. The via hole 252a reaches from the upper surface 310a of the sealing resin 310 to the back surface conductor 114 laminated on the electrode 113 of the semiconductor element 140.

Both the via holes 257a and 259a are deeper than the via hole 252a. However, the via holes 252a, 257a, and 259a can be formed in the same single step using the same laser drill apparatus. The via holes 252a, 257a and 259a may be formed in the order of arrangement positions of the via holes 252a, 257a and 259a regardless of the depth of the via holes. Alternatively, the deep via holes 257a and 259a and the shallow via holes 252a may be formed separately. After forming the via holes 252a, 257a and 259a, the desmear treatment is performed to remove the residual film of the sealing resin 310. As the desmear treatment, plasma desmear treatment is preferred.

Figure 56:
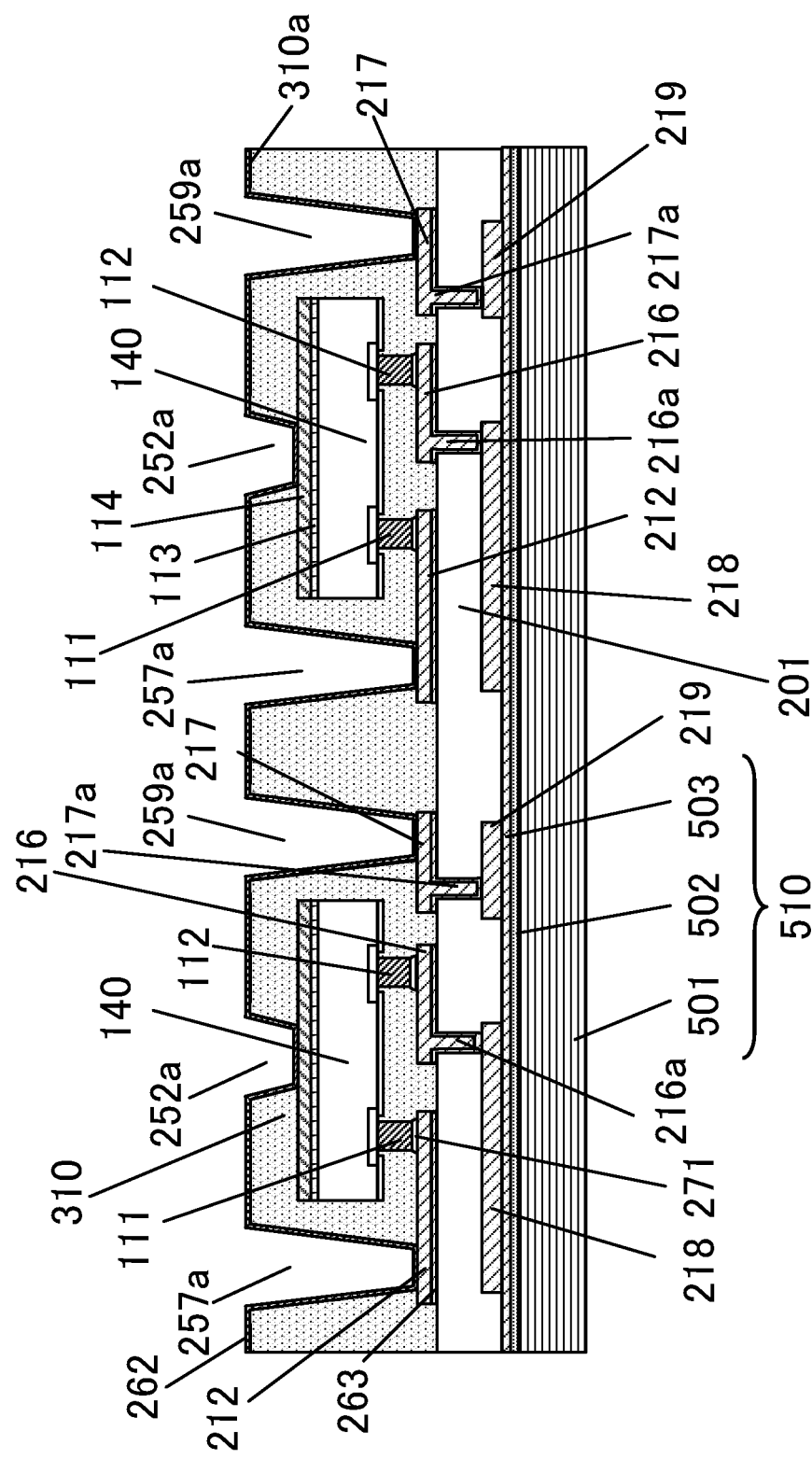
FIG. 56 is a cross-sectional view showing a step that follows the step shown in FIG. 55.

Next, as shown in FIG. 56, the base metal 262 is formed on the entire upper surface 310a of the sealing resin 310 and the entire inner surfaces of the via holes 252a, 257a, 259a. The base metal 262 is obtained by performing electroless plating with copper-based metal so as to have a thickness of 0.1 to 1.0 μm, for example.

Figure 57:
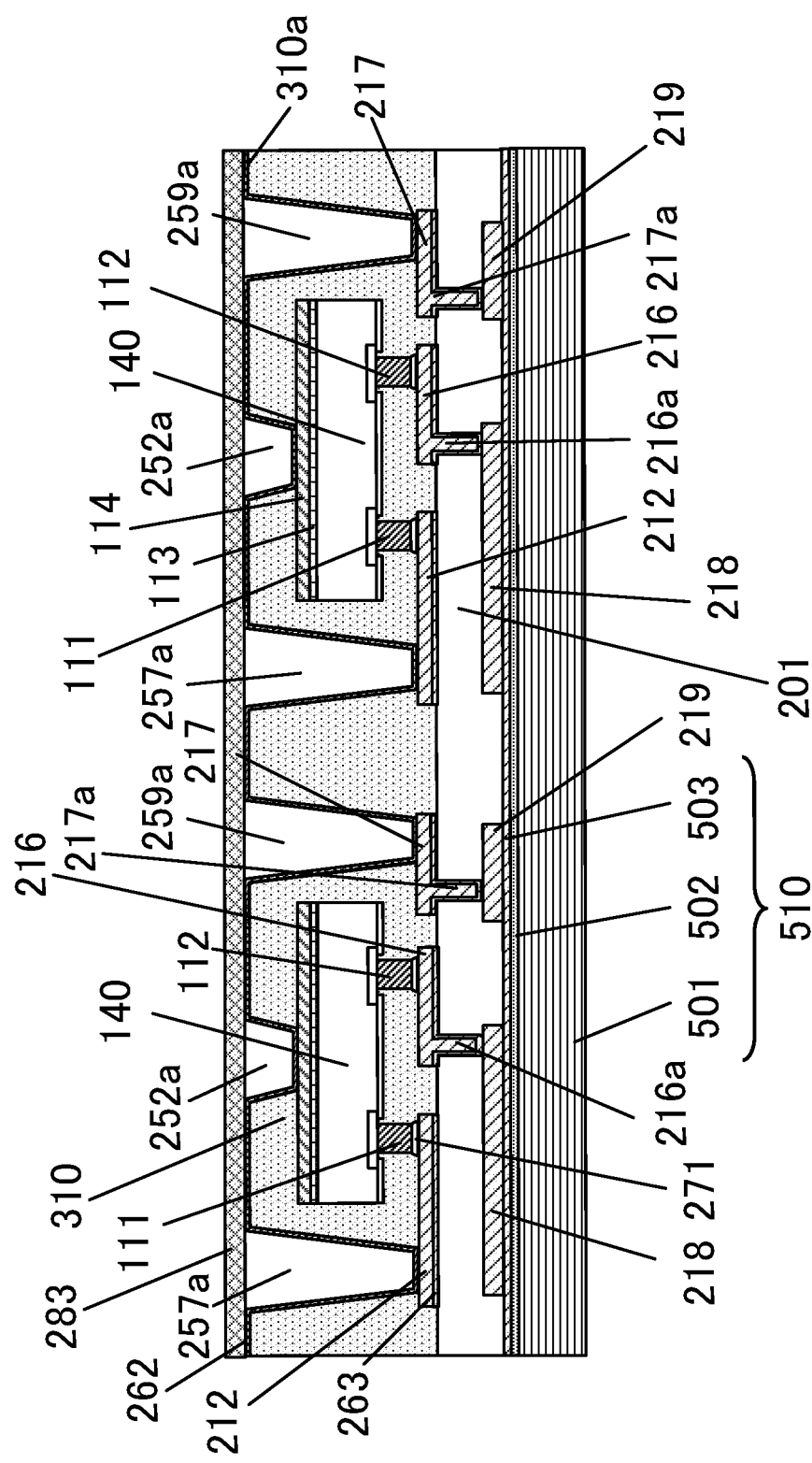
FIG. 57 is a cross-sectional view showing a step that follows the step shown in FIG. 56.

Next, as shown in FIG. 57, a photoresist 283 is formed on the entire surface of the base metal 262 on the upper surface 310a. The photoresist 283 is formed by laminating a dry film type photosensitive resist film with a laminator. The photoresist 283 may be a positive type or a negative type. In the present embodiment, the photoresist of a positive type will be exemplified.

Figure 58:
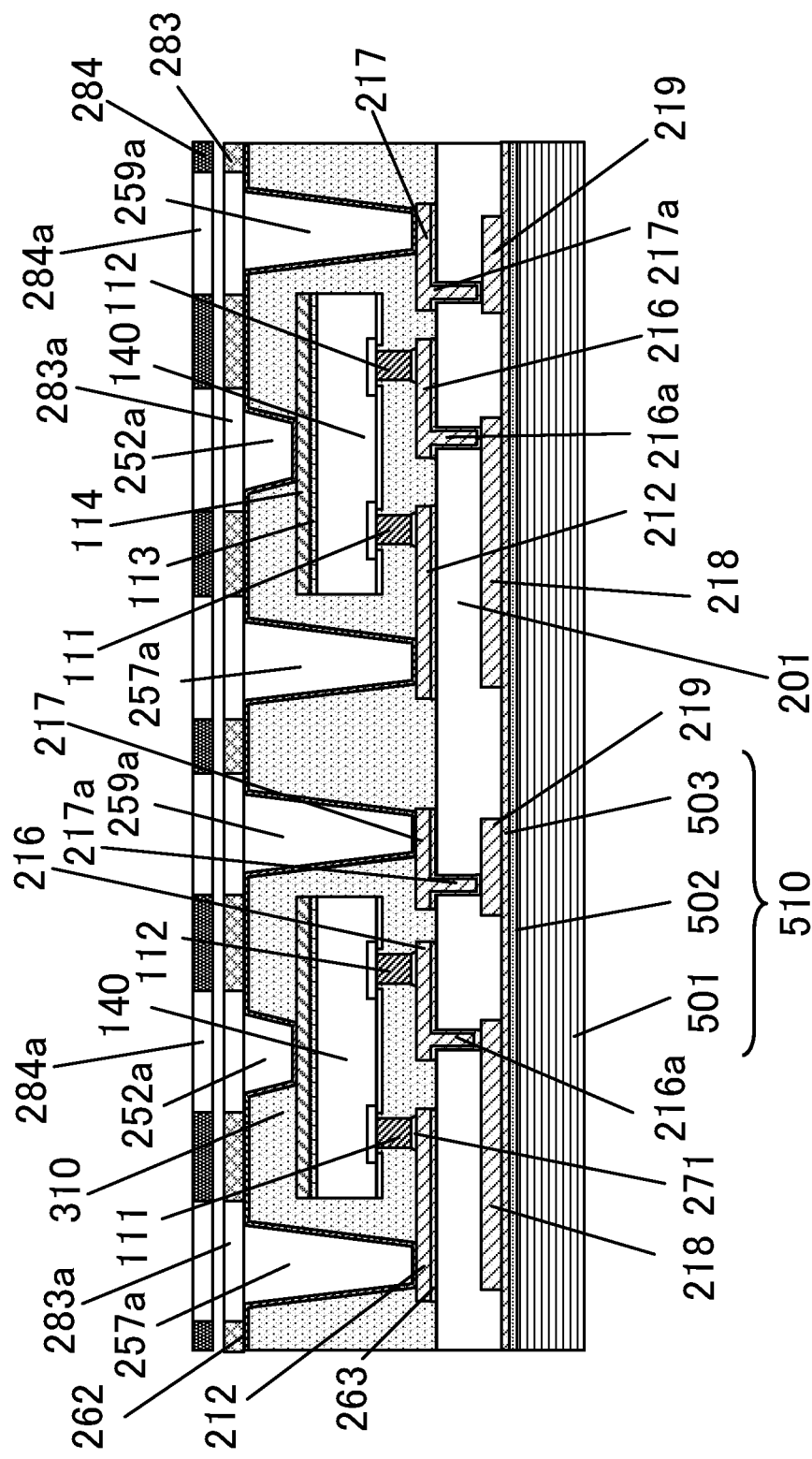
FIG. 58 is a cross-sectional view showing a step that follows the step shown in FIG. 57.

Then, as shown in FIG. 58, a photomask 284 is arranged on the photoresist 283, and exposure is performed by an exposure device. The photomask 284 has transparent portions 284a corresponding to the via holes 252a, 257a, 259a and the peripheral portions thereof so that by exposure, the positive photoresist 283 is exposed at portions 283a corresponding to the transparent portions 284a of the photomask 284. Then, the photomask 284 is removed. Then, the photoresist 283 is developed to open the exposed portions 283a of the photoresist 283.

Figure 59:
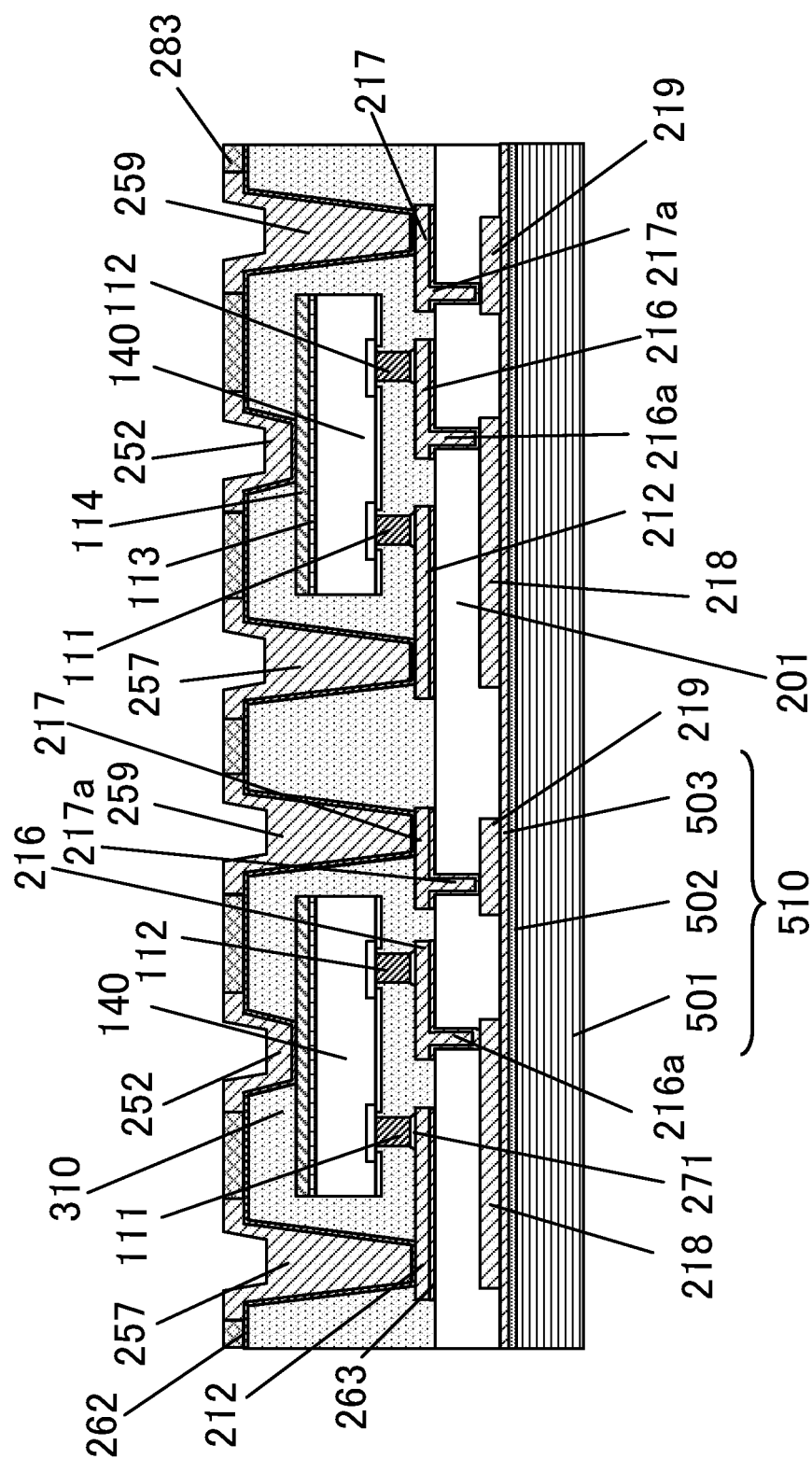
FIG. 59 is a cross-sectional view showing a step that follows the step shown in FIG. 58.
Figure 60:
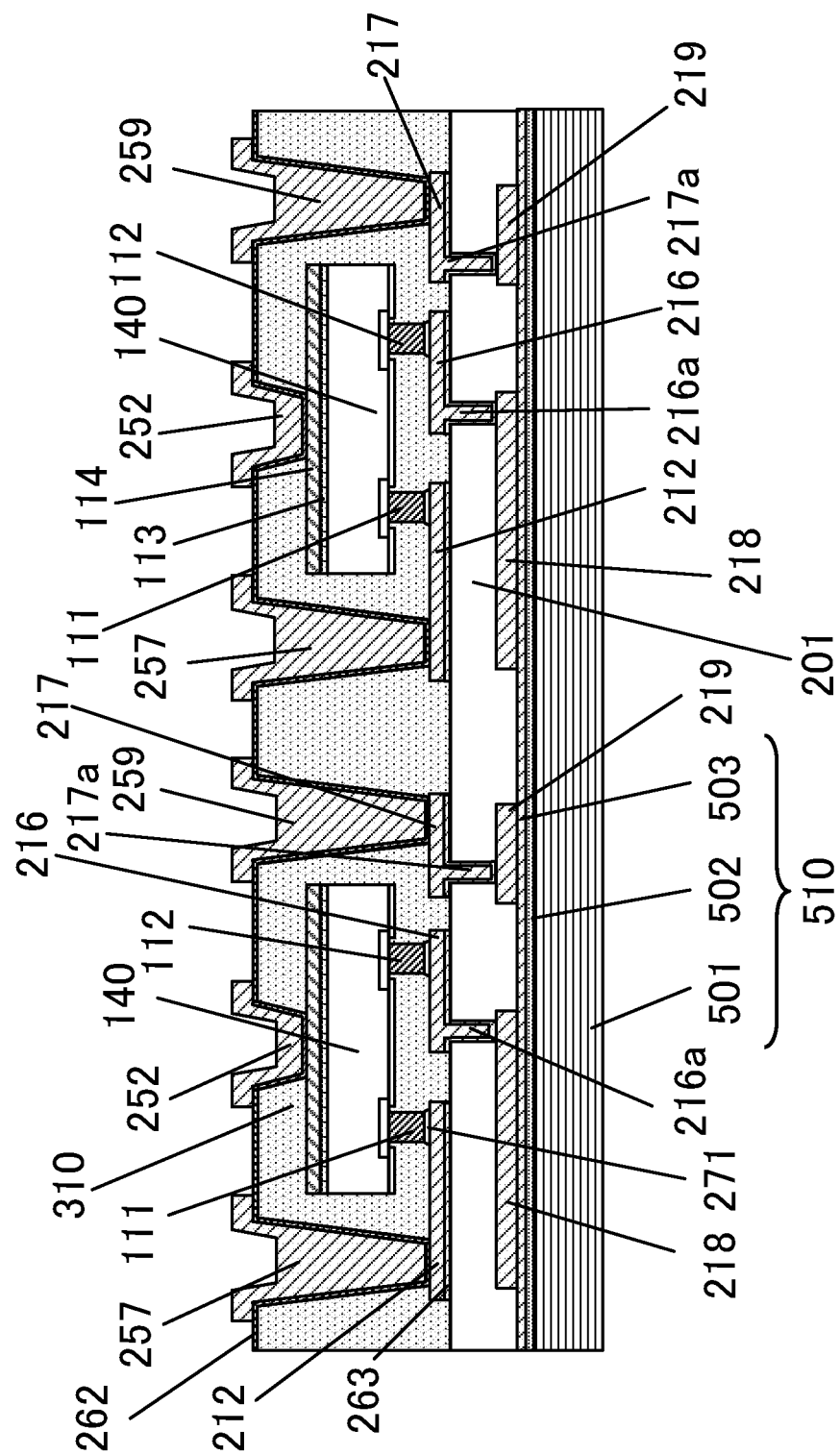
FIG. 60 is a cross-sectional view showing a step that follows the step shown in FIG. 59.

Next, as shown in FIG. 59, electrolytic plating is performed using the base metal 262 as a current path to fill the via holes 252a, 257a, 259a with conductive metal to form the vias 252, 257, 259. The electrolytic plating is performed using, for example, copper-based metal plating solution.

Figure 61:
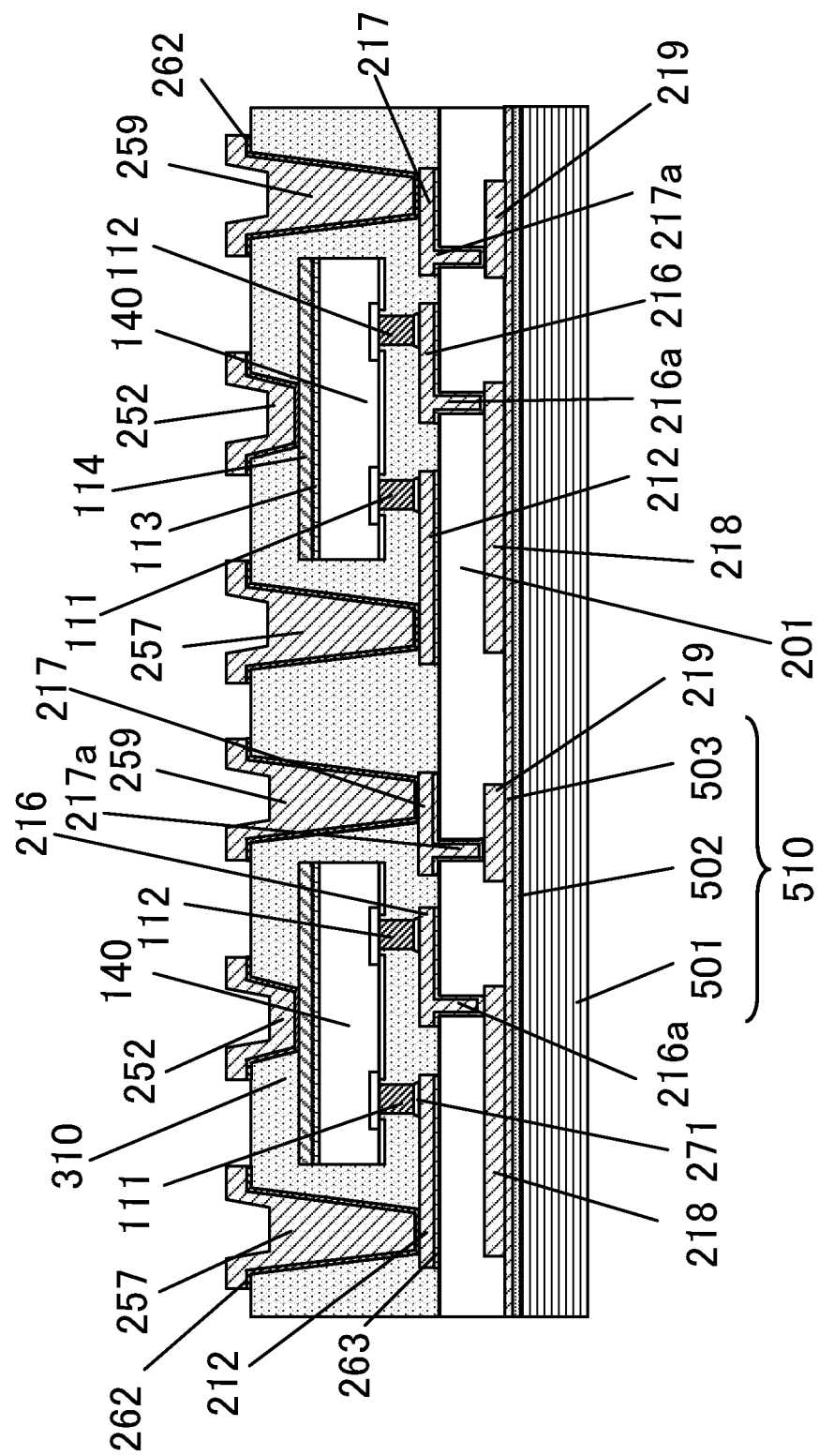
FIG. 61 is a cross-sectional view showing a step that follows the step shown in FIG. 60.

Then, the photoresist 283 is removed (see FIG. 60), and subsequently, the base metal 262 exposed from the vias 252, 257, 259 is removed by etching. Thereby, an intermediate body shown in FIG. 61 is obtained.

Figure 62:
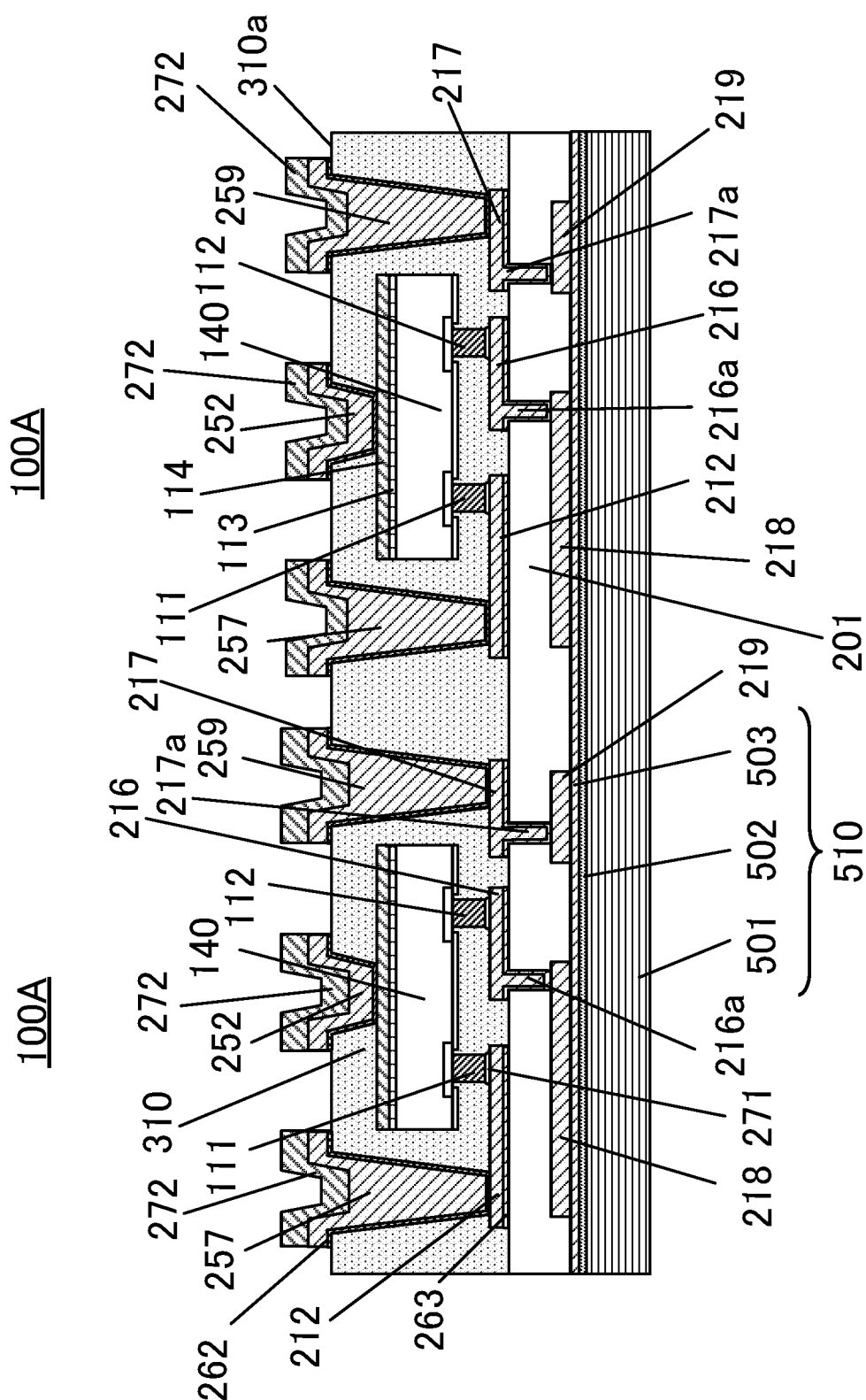
FIG. 62 is a cross-sectional view showing a step that follows the step shown in FIG. 61.

Next, as illustrated in FIG. 62, a joining material 272 is formed on the upper surfaces of the vias 252, 257, 259 exposed from the upper surface 310a of the sealing resin 310. To form the joining material 272, for example, solder cream, metal paste for sintering, or the like is formed on each of the vias 252, 257, and 259 by printing, and in this state, a reflow process is performed to melt the joining material 272, and then cool the joining material 272 to solidify. Thereby, the two semiconductor devices 100A are formed adjacent to each other on the base material 201.

Figure 63:
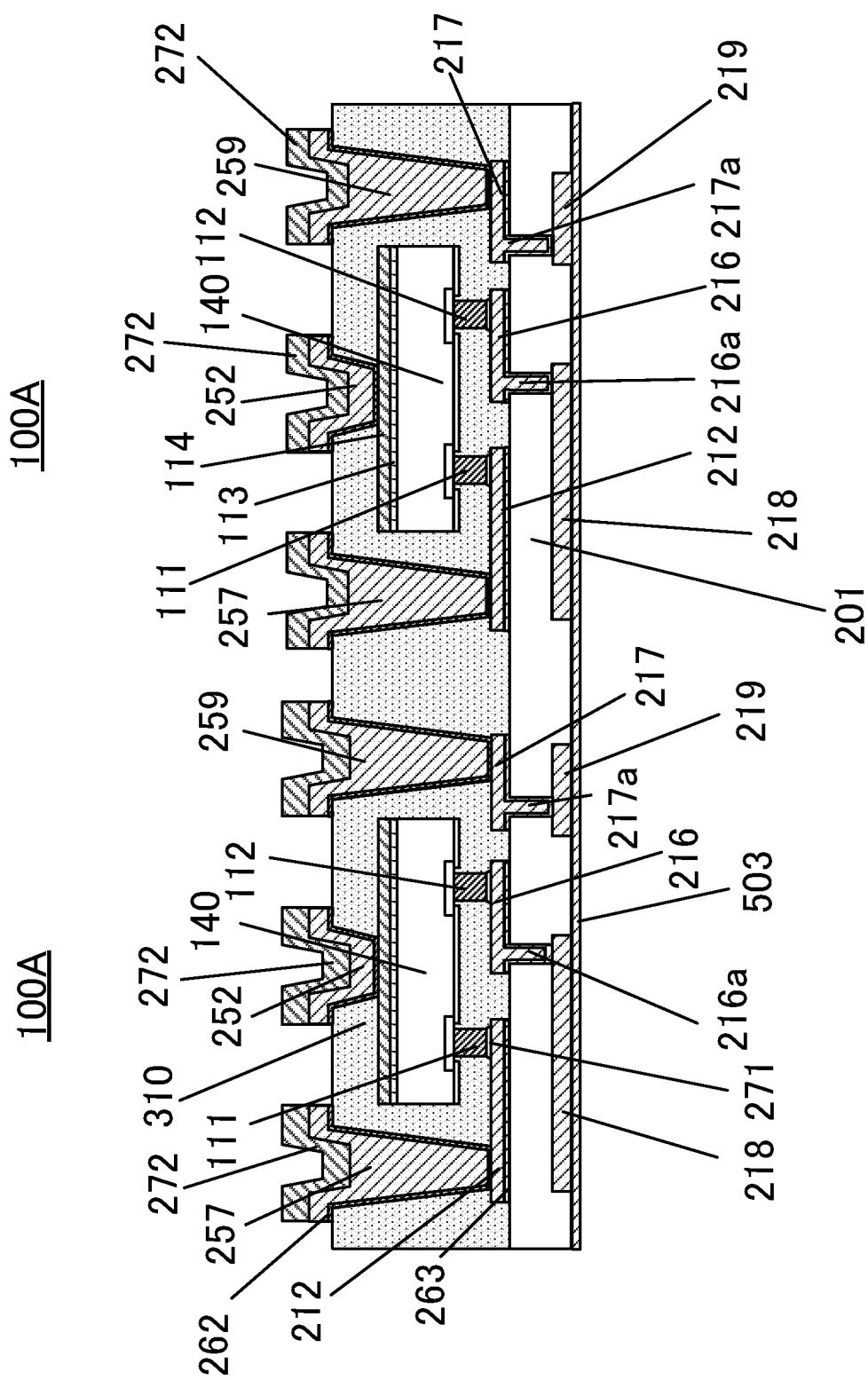
FIG. 63 is a cross-sectional view showing a step that follows the step shown in FIG. 62.

Next, as shown in FIG. 63, the base layer 501 of the supporting base material 510 is released off from the conductive thin film 503. A physical external force is applied to the release layer 502 to form a crack in the release layer 502, the release layer 502 breaks while the crack is propagated, and the base layer 501 is peeled off.

Figure 64:
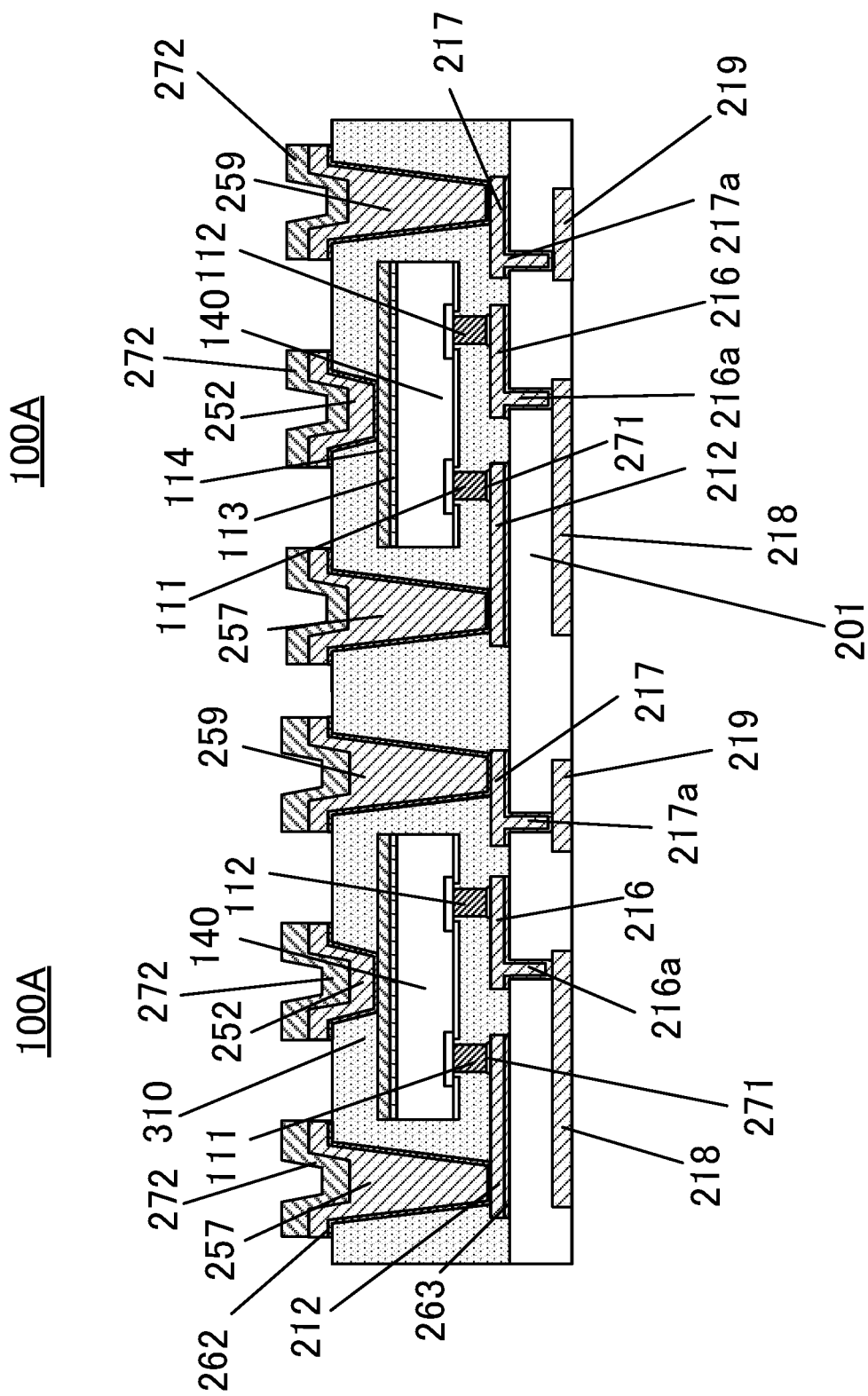
FIG. 64 is a cross-sectional view showing a step that follows the step shown in FIG. 63.

Next, as shown in FIG. 64, the conductive thin film 503 is removed by an etching process.

Figure 65:
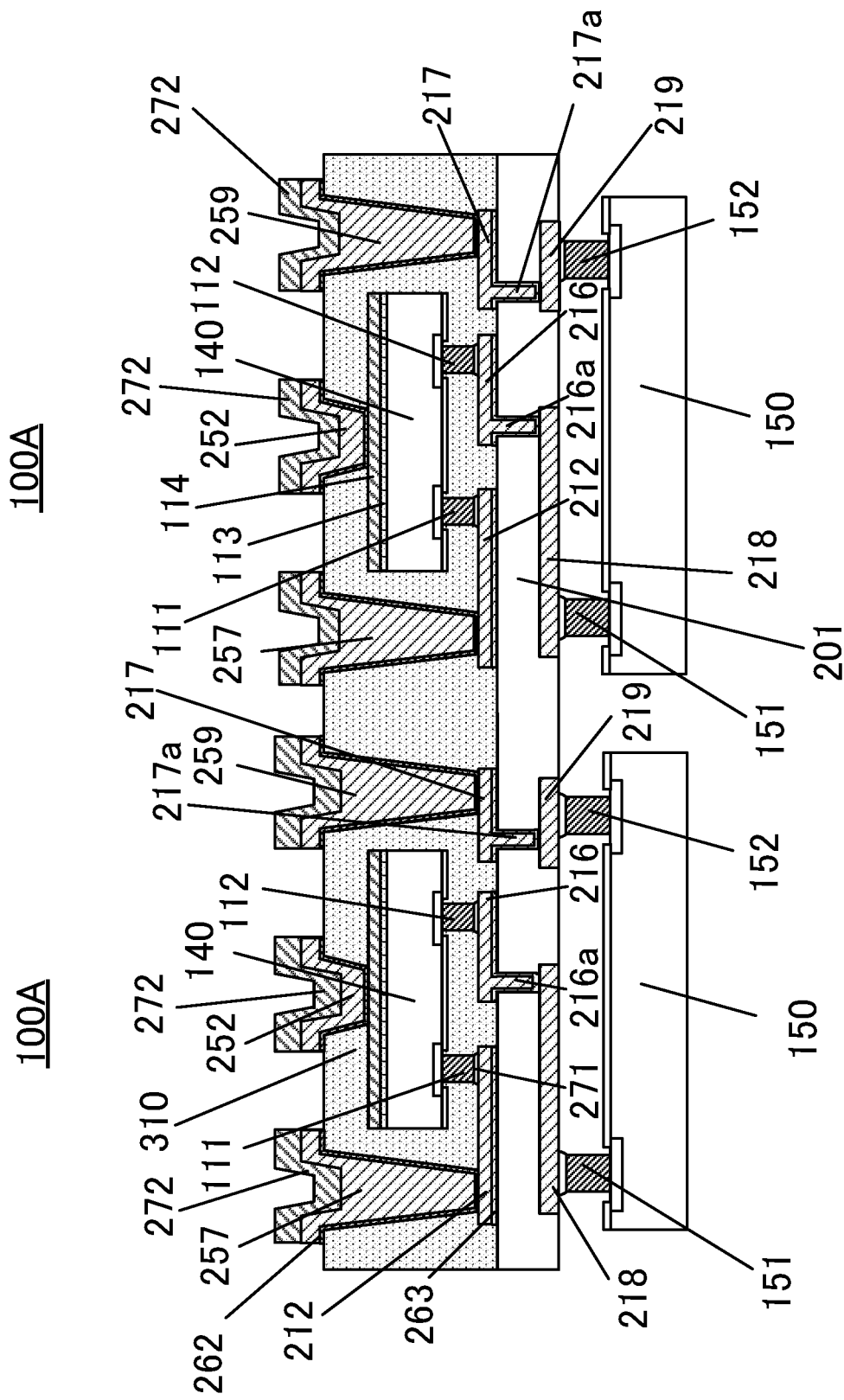
FIG. 65 is a cross-sectional view showing a step that follows the step shown in FIG. 64.

Next, the electrodes 151 and 152 of the semiconductor element 150 are bonded by a face-down method to the connection conductors 218 and 219, respectively. In FIG. 65, the semiconductor element 150 is shown arranged below the base material 201, but actual bonding is performed in the state that the intermediate body of the semiconductor device 200 shown in FIG. 65 is flipped upside down so that the semiconductor element 150 is arranged above the base material 201.

Before bonding, the joining material 271 such as solder is applied to the lower end surfaces of the electrodes 151 and 152, and flux is applied to the joining portions of the connection conductors 218 and 219 to which the electrodes 151 and 152 are to be joined. Then, the semiconductor elements 150 are picked up one by one with the flip chip bonder, and the electrodes 151 and 152 of each semiconductor element 150 are mounted at predetermined positions of the connection conductors 218 and 219. In this state, the intermediate body of the semiconductor device 200 shown in FIG. 65 is carried into the reflow apparatus. By being heated in the reflow apparatus, the joining material 271 is melted and the electrodes 151 and 152 of the semiconductor element 150 are joined to the predetermined joining portions of the corresponding connection conductors 218 and 219, respectively.

Figure 66:
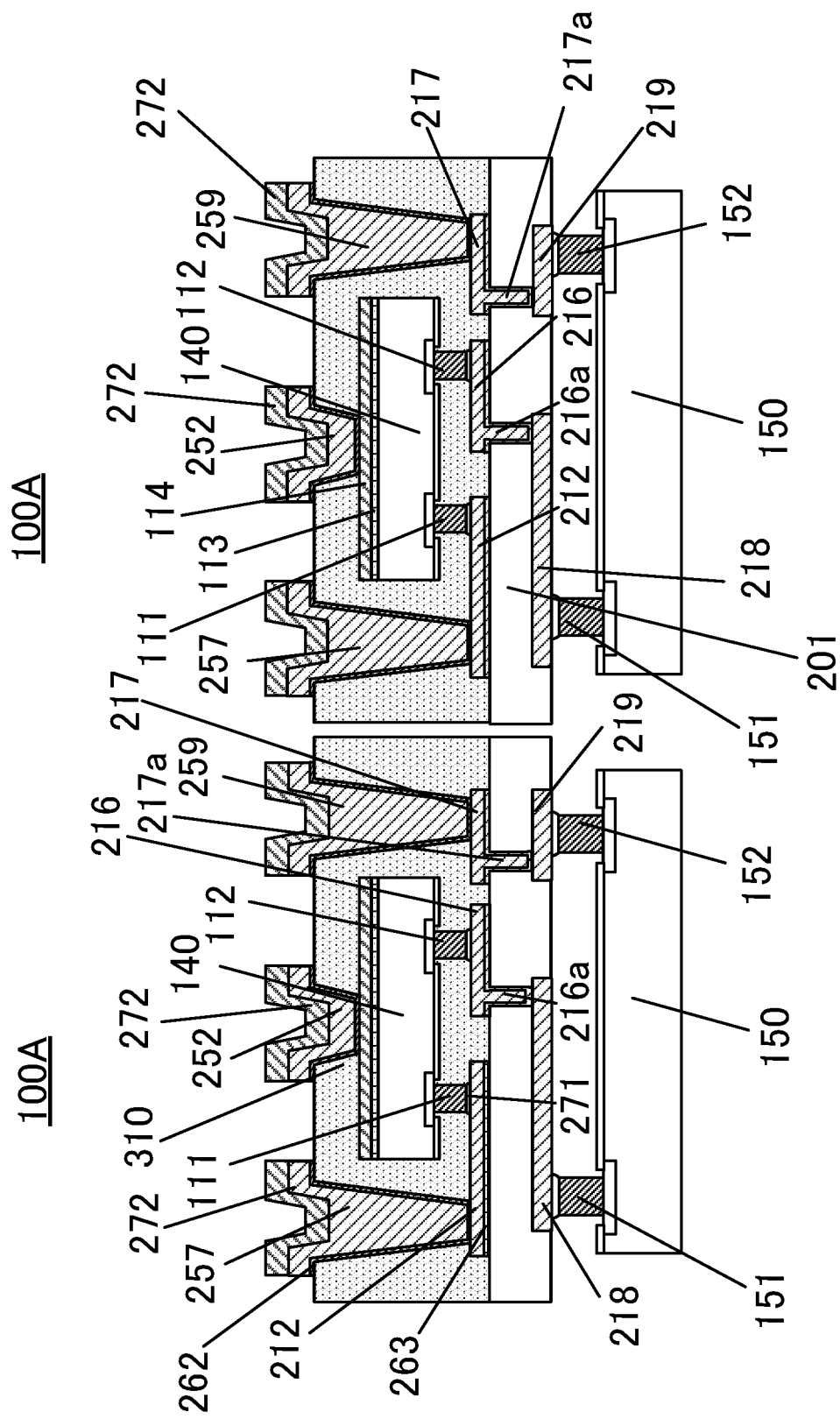
FIG. 66 is a cross-sectional view showing a step that follows the step shown in FIG. 65.

Then, as shown in FIG. 66, the sealing resin 310 and the base material 201 of the two semiconductor devices 100A arranged adjacent to each other are diced at the boundary portion. Thereby, the semiconductor device 200 shown in FIG. 39 is obtained.

Also in the third embodiment, the semiconductor device 100A includes: the semiconductor element 140 having the electrode (a first electrode) 111 on the main surface side and having the electrode (a second electrode) 113 on the back surface side; the base material 201 provided with the connection conductor 212 connected to the electrode 111; the sealing resin 310 provided on the base material 201 to seal the semiconductor element 140; and the via 252 (a second via) provided in the sealing resin 310 and electrically connected to the electrode 113 of the semiconductor element 140. Therefore, even in the third embodiment, the same advantageous effect as the advantageous effect (1) of the first embodiment is obtained.

Also in the third embodiment, the semiconductor device 100A has the back surface conductor 114 laminated on the electrode 113 of the semiconductor element 140. Therefore, even in the third embodiment, the same advantageous effect as the advantageous effect (2) of the first embodiment is obtained.

In the third embodiment, the sealing resin 310 is further provided with the via (a fifth via) 257 connected to the connection conductor 210. Since the connection conductor 210 provided on the base material 201 is routed to the upper surface 310a side of the sealing resin 310 via the via 257 provided in the sealing resin 310, the routing of the connection conductor 210 formed on the substrate 201 is simplified. Therefore, even in the third embodiment, the same advantageous effects as the advantageous effects (3) and (4) of the first embodiment are obtained.

It is to be noted that, in each of the above embodiments, the via holes 251a to 259a are formed in the sealing resin 310 for example, through a method of irradiating laser light by using the laser drill apparatus. However, the via holes 251a to 259a formed in the sealing resin 310 can also be formed by etching. When the via holes 251a to 259a are formed by the laser drill apparatus or the like, it is necessary to provide the back surface conductor 114 on the back surface side electrodes 113 of the first and third semiconductor elements 110A and 110B and the semiconductor element 140. On the other hand, if the via holes 251a to 259a are formed by etching, the back surface conductor 114 need not be provided on the electrode 113.

In the first embodiment, the first and third semiconductor elements 110A and 110B are exemplified as MOSFETs, but other transistors such as IGBT (Insulated Gate Bipolar Transistor) or other active device may be used instead of the MOSFETs. In the case of the IGBT, the drain, gate and source of the MOSFET may be replaced with the collector, gate and emitter, respectively.

In each of the above-described embodiments, the vias 252 and 254 may also function as a heat dissipation member, or the vias 252 and 254 may be connected to a heat dissipation member.

Although various embodiments and variation have been described above, the present invention is not limited to these contents. Other aspects that are conceivable within the scope of the technical concept of the present invention are also included within the scope of the present invention.

REFERENCE SIGNS LIST 100, 100A, 200 . . . Semiconductor Device,
110A . . . First Semiconductor Element,
110B . . . Third Semiconductor Element, -continued 111 ... Electrode (First Electrode),
112 ... Electrode (Third Electrode),
113 ... Electrode (Second Electrode),
114 ... Back Surface Conductor,
120 ... Second Semiconductor Element,
121 ... Electrode (First Electrode),
122 ... Electrode (Second Electrode),
140, 150 ... Semiconductor Element,
151, 152 ... Electrode,
201 ... Base Material,
210 ... Connection Conductor,
211 ... Connection Conductor (First Connection Conductor),
212 ... Connection Conductor (Second Connection Conductor),
213 ... Connection Conductor,
214 ... (Third) Connection Conductor,
215 ... (Fourth) Connection Conductor,
216, 217 ... Connection Conductor,
218, 219 ... Back Surface Side Connection Conductor,
251 ... Via (Second Via),
252 ... Via (First Via),
253 ... Via (Third Via),
254 ... Via (Forth Via),
251a to 259a ... Via Hole,
256 ... Intermediate Connecting Portion,
257 to 259 ... Via (Fifth Via)

The invention claimed is:

1. A semiconductor device, comprising:
a first semiconductor element having a first electrode on a main surface side thereof and a second electrode on a back surface side thereof;
a second semiconductor element having a first electrode and a second electrode on a main surface side thereof;
a base material provided with a connection conductor connected to the first electrode;
a sealing resin provided on the base material to seal the first semiconductor element and the second semiconductor element; and
a first via provided in the sealing resin and electrically connected to the second electrode of the first semiconductor element, wherein:
the connection conductor includes a first connection conductor that electrically connects together the first electrode of the second semiconductor element and the first electrode of the first semiconductor element.

2. The semiconductor device according to claim 1, further comprising:
a back surface conductor laminated on the second electrode of the first semiconductor element.

3. The semiconductor device according to claim 1, wherein:
the connection conductor includes a second connection conductor connected to the second electrode of the second semiconductor element; and
a second via connected to the second connection conductor is further provided in the sealing resin.

4. The semiconductor device according to claim 1, further comprising:
a third semiconductor element having a first electrode and a third electrode on a main surface side thereof and a second electrode on a back surface side thereof, wherein:
the first semiconductor element further includes a third electrode on the main surface side thereof;
the connection conductor includes a third connection conductor connected to the third electrode of the first semiconductor element;
a third via connected to the third connection conductor and a fourth via connected to the second electrode of the third semiconductor element are provided in the sealing resin; and
an intermediate connecting portion that connects together the third via and the fourth via is provided on the sealing resin.

5. The semiconductor device according to claim 1, further comprising:
a third semiconductor element having a first electrode and a third electrode on a main surface side thereof and a second electrode on a back surface side thereof, wherein:
the first semiconductor element further includes a third electrode on the main surface side thereof; and
the connection conductor includes a fourth connection conductor that connects together the third electrode of the first semiconductor element and the third electrode of the third semiconductor element.

6. The semiconductor device according to claim 1, wherein:
a fifth via connected to the connection conductor is further provided in the sealing resin.

7. A semiconductor device, comprising:
a base material;
a first semiconductor element provided on the base material, and having a first electrode and a third electrode on a main surface side thereof facing the base material, and having a second electrode on a back surface side thereof;
a second semiconductor element provided on the base material and having a first electrode and a second electrode on a main surface side thereof facing the base material;
a first connection conductor provided on the base material and connecting together the first electrode of the first semiconductor element and the first electrode of the second semiconductor element;
a second connection conductor provided on the base material and connected to the second electrode of the second semiconductor element;
a sealing resin provided on the base material to seal the first semiconductor element and the second semiconductor element;
a first via provided in the sealing resin and electrically connected to the second electrode of the first semiconductor element; and
a second via provided in the sealing resin and connected to the second connection conductor.

8. The semiconductor device according to claim 7, further comprising:
the first semiconductor element further includes a back surface conductor laminated on the second electrode of the first semiconductor element.

9. A manufacturing method of a semiconductor device, comprising:
preparing a first semiconductor element having a first electrode on a main surface side thereof and a second electrode on a back surface side thereof;
preparing a second semiconductor element having a first electrode and a second electrode on a main surface side thereof;
connecting the first electrode of the first semiconductor element to a first connection conductor provided on a base material;
connecting the first electrode of the second semiconductor element to the first connection conductor;

sealing the first semiconductor element and the second semiconductor element provided on the base material with a sealing resin; and providing a first via electrically connected to the second electrode of the first semiconductor element in the sealing resin.

10. The manufacturing method of a semiconductor device according to claim 9, wherein:

in the preparing of the first semiconductor element, a backside conductor is provided on the second electrode of the first semiconductor element.

11. The manufacturing method of a semiconductor device according to claim 9, further comprising:

connecting the second electrode of the second semiconductor element to a second connection conductor provided on the base material, and providing a second via connected to the second connection conductor in the sealing resin.

12. The manufacturing method of a semiconductor device according to claim 11, wherein:

in the providing of the first via and the second via in the sealing resin, the sealing resin is irradiated with laser light to form (i) a first via hole that reaches from a surface of the sealing resin to the back surface conductor provided on the second electrode of the first semiconductor element, and (ii) a second via hole that reaches from the surface of the sealing resin to the second connection conductor.

13. The manufacturing method of a semiconductor device according to claim 12, wherein:

the first via hole and the second via hole are formed in a same single process using a same laser apparatus.

* * * * *